US009245889B2

(12) United States Patent
Masuoka et al.

(10) Patent No.: US 9,245,889 B2
(45) Date of Patent: *Jan. 26, 2016

(54) METHOD FOR MANUFACTURING SEMICONDUCTOR DEVICE AND SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Peninsula Plaza (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/537,322

(22) Filed: Nov. 10, 2014

(65) Prior Publication Data
US 2015/0061033 A1 Mar. 5, 2015

Related U.S. Application Data

(63) Continuation of application No. 14/066,095, filed on Oct. 29, 2013, now Pat. No. 8,916,478, which is a continuation-in-part of application No. 13/693,524, filed on Dec. 4, 2012, now Pat. No. 8,772,175.

(60) Provisional application No. 61/577,189, filed on Dec. 19, 2011.

(51) Int. Cl.
*H01L 27/01* (2006.01)
*H01L 27/12* (2006.01)
(Continued)

(52) U.S. Cl.
CPC ...... *H01L 27/0924* (2013.01); *H01L 29/42392* (2013.01); *H01L 29/66545* (2013.01); *H01L 29/66666* (2013.01); *H01L 29/7827* (2013.01)

(58) Field of Classification Search
CPC .............. H01L 21/8238; H01L 21/823487; H01L 21/845; H01L 21/76889; H01L 21/823835; H01L 21/11104; H01L 27/092; H01L 27/12; H01L 27/11087; H01L 27/0251; H01L 27/10879; H01L 27/0886; H01L 27/0924; H01L 29/781; H01L 29/0852; H01L 29/66666; H01L 29/7827
USPC ......... 257/350, 358, 359, 288, 384, 328, 367, 257/E21.014, E21.042, E21.043, E21.048, 257/E21.051, E21.151, E21.165, E21.173, 257/E21.278
See application file for complete search history.

(56) References Cited

U.S. PATENT DOCUMENTS 5,017,977 A 5/1991 Richardson
5,258,635 A 11/1993 Nitayama et al.
(Continued)

FOREIGN PATENT DOCUMENTS

CN 1507035 6/2004
CN 1610126 A 4/2005
(Continued)

OTHER PUBLICATIONS

Agranov, G. et al., "Pixel Size Reduction of CMOS Image Sensors and Comparison of Characteristics", *The Institute of Image Formation and Television Engineers (ITE) Technical Report*, vol. 33, No. 38, pp. 9-12, Sep. 2009.
(Continued)

*Primary Examiner* — David Nhu
(74) *Attorney, Agent, or Firm* — Brinks Gilson & Lione

(57) ABSTRACT

A semiconductor device includes a first and second fin-shaped semiconductor layers on a substrate, which correspond to the dimensions of a sidewall pattern around a dummy pattern. A first insulating film is around the first and second fin-shaped layers. A first and second pillar-shaped semiconductor layers reside on the first and second fin-shaped layers, respectively. N-type and P-type diffusion layers are in upper portions of the first and second fin-shaped layers, respectively, and in upper and lower portions of the first and second pillar-shaped layers, respectively. First and second gate insulating films and first and second metal gate electrodes reside around the first and second pillar-shaped layers, respectively. A metal gate line is connected to the first and second metal gate electrodes and extends in a direction perpendicular to the first and second fin-shaped layers.

1 Claim, 52 Drawing Sheets

(51) Int. Cl.
*H01L 31/0392* (2006.01)
*H01L 27/092* (2006.01)
*H01L 29/78* (2006.01)
*H01L 29/66* (2006.01)
*H01L 29/423* (2006.01)

(56) References Cited

U.S. PATENT DOCUMENTS

| | | |
|---|---|---|
| 5,308,782 A | 5/1994 | Mazure et al. |
| 5,312,767 A | 5/1994 | Shimizu et al. |
| 5,382,816 A | 1/1995 | Mitsui |
| 5,416,350 A | 5/1995 | Watanabe |
| 5,480,838 A | 1/1996 | Mitsui |
| 5,627,390 A | 5/1997 | Maeda et al. |
| 5,656,842 A | 8/1997 | Iwamatsu et al. |
| 5,703,386 A | 12/1997 | Yasuda et al. |
| 5,707,885 A | 1/1998 | Lim |
| 5,710,447 A | 1/1998 | Tohyama |
| 5,767,549 A | 6/1998 | Chen et al. |
| 5,780,888 A | 7/1998 | Maeda et al. |
| 5,811,336 A | 9/1998 | Kasai |
| 5,872,037 A | 2/1999 | Iwamatsu et al. |
| 5,905,283 A | 5/1999 | Kasai |
| 5,994,735 A | 11/1999 | Maeda et al. |
| 6,121,086 A | 9/2000 | Kuroda et al. |
| 6,127,209 A | 10/2000 | Maeda et al. |
| 6,175,138 B1 | 1/2001 | Noda |
| 6,294,418 B1 | 9/2001 | Noble |
| 6,373,099 B1 | 4/2002 | Kikuchi et al. |
| 6,392,271 B1 | 5/2002 | Alavi et al. |
| 6,406,962 B1 | 6/2002 | Agnello et al. |
| 6,420,751 B1 | 7/2002 | Maeda et al. |
| 6,461,900 B1 | 10/2002 | Sundaresan et al. |
| 6,483,171 B1 | 11/2002 | Forbes et al. |
| 6,624,459 B1 | 9/2003 | Dachtera et al. |
| 6,658,259 B2 | 12/2003 | McIntosh |
| 6,740,937 B1 | 5/2004 | Sushihara |
| 6,747,314 B2 | 6/2004 | Sundaresan et al. |
| 6,815,277 B2 | 11/2004 | Fried et al. |
| 6,849,903 B2 | 2/2005 | Sushihara |
| 6,861,684 B2 | 3/2005 | Skotnicki et al. |
| 6,878,991 B1 | 4/2005 | Forbes |
| 6,891,225 B2 | 5/2005 | Horiguchi et al. |
| 6,943,407 B2 | 9/2005 | Ouyang et al. |
| 7,052,941 B2 | 5/2006 | Lee |
| 7,193,278 B2 | 3/2007 | Song |
| 7,198,976 B2 | 4/2007 | Hirata |
| 7,233,033 B2 | 6/2007 | Koyama et al. |
| 7,241,655 B2 | 7/2007 | Tang et al. |
| 7,271,052 B1 | 9/2007 | Forbes |
| 7,368,334 B2 | 5/2008 | Yeo et al. |
| 7,374,990 B2 | 5/2008 | Tang et al. |
| 7,413,480 B2 | 8/2008 | Thomas |
| 7,579,214 B2 | 8/2009 | Yamazaki et al. |
| 7,619,675 B2 | 11/2009 | Horii |
| 7,829,952 B2 | 11/2010 | Moniwa et al. |
| 7,872,287 B2 | 1/2011 | Masuoka et al. |
| 7,977,736 B2 | 7/2011 | Kim et al. |
| 7,977,738 B2 | 7/2011 | Minami et al. |
| 7,981,738 B2 | 7/2011 | Moniwa et al. |
| 8,039,893 B2 | 10/2011 | Masuoka et al. |
| 8,058,683 B2 | 11/2011 | Yoon et al. |
| 8,067,800 B2 | 11/2011 | Hsieh |
| 8,110,869 B2 | 2/2012 | Bhalla |
| 8,154,076 B2 | 4/2012 | Takaishi |
| 8,188,537 B2 | 5/2012 | Masuoka et al. |
| 8,227,305 B2 | 7/2012 | Forbes |
| 8,378,400 B2 | 2/2013 | Masuoka et al. |
| 8,482,047 B2 | 7/2013 | Abbott et al. |
| 8,772,175 B2 * | 7/2014 | Masuoka .......... H01L 29/66666 438/753 |
| 8,916,478 B2 * | 12/2014 | Masuoka .......... H01L 29/7827 438/753 |
| 9,035,384 B2 * | 5/2015 | Masuoka .......... H01L 29/66666 257/350 |
| 2001/0052614 A1 | 12/2001 | Ishibashi |
| 2002/0000624 A1 | 1/2002 | Takemura et al. |
| 2002/0034853 A1 | 3/2002 | Alavi et al. |
| 2002/0110039 A1 | 8/2002 | Forbes et al. |
| 2002/0195652 A1 | 12/2002 | Maeda et al. |
| 2003/0002093 A1 | 1/2003 | Hynecek |
| 2003/0075758 A1 | 4/2003 | Sundaresan et al. |
| 2004/0005755 A1 | 1/2004 | Moniwa et al. |
| 2004/0113207 A1 | 6/2004 | Hsu et al. |
| 2004/0135215 A1 | 7/2004 | Song |
| 2004/0169293 A1 | 9/2004 | Sushihara |
| 2004/0256639 A1 | 12/2004 | Ouyang et al. |
| 2004/0262681 A1 | 12/2004 | Masuoka et al. |
| 2005/0127404 A1 | 6/2005 | Sushihara |
| 2005/0145911 A1 | 7/2005 | Forbes et al. |
| 2005/0263821 A1 | 12/2005 | Cho et al. |
| 2005/0281119 A1 | 12/2005 | Shibata et al. |
| 2006/0006444 A1 | 1/2006 | Leslie |
| 2006/0007333 A1 | 1/2006 | Horii |
| 2006/0033524 A1 | 2/2006 | Sushihara |
| 2006/0043520 A1 | 3/2006 | Jerdev et al. |
| 2006/0046391 A1 | 3/2006 | Tang et al. |
| 2006/0261406 A1 | 11/2006 | Chen |
| 2007/0007601 A1 | 1/2007 | Hsu et al. |
| 2007/0075359 A1 | 4/2007 | Yoon et al. |
| 2007/0117324 A1 | 5/2007 | Previtali |
| 2007/0138557 A1 | 6/2007 | Ipposhi |
| 2007/0173006 A1 | 7/2007 | Moniwa et al. |
| 2008/0048245 A1 | 2/2008 | Kito et al. |
| 2008/0173936 A1 | 7/2008 | Yoon et al. |
| 2008/0210985 A1 | 9/2008 | Ogawa et al. |
| 2008/0227241 A1 | 9/2008 | Nakabayashi et al. |
| 2009/0032955 A1 | 2/2009 | Tanaka et al. |
| 2009/0057722 A1 | 3/2009 | Masuoka et al. |
| 2009/0065832 A1 | 3/2009 | Masuoka et al. |
| 2009/0085088 A1 | 4/2009 | Takaishi |
| 2009/0114989 A1 | 5/2009 | Hamamoto |
| 2009/0159964 A1 | 6/2009 | Lee |
| 2009/0174024 A1 | 7/2009 | Kim |
| 2009/0197379 A1 | 8/2009 | Leslie |
| 2009/0290082 A1 | 11/2009 | Yamazaki et al. |
| 2009/0291551 A1 | 11/2009 | Cho |
| 2010/0052029 A1 | 3/2010 | Huang |
| 2010/0200731 A1 | 8/2010 | Masuoka et al. |
| 2010/0200913 A1 | 8/2010 | Masuoka et al. |
| 2010/0207172 A1 | 8/2010 | Masuoka et al. |
| 2010/0207201 A1 | 8/2010 | Masuoka et al. |
| 2010/0207213 A1 | 8/2010 | Tan et al. |
| 2010/0213525 A1 | 8/2010 | Masuoka et al. |
| 2010/0213539 A1 | 8/2010 | Masuoka et al. |
| 2010/0219457 A1 | 9/2010 | Masuoka et al. |
| 2010/0219483 A1 | 9/2010 | Masuoka et al. |
| 2010/0270611 A1 | 10/2010 | Masuoka et al. |
| 2010/0276750 A1 | 11/2010 | Tu |
| 2010/0295123 A1 | 11/2010 | Lung et al. |
| 2011/0073925 A1 | 3/2011 | Park et al. |
| 2011/0215381 A1 | 9/2011 | Masuoka et al. |
| 2011/0254067 A1 | 10/2011 | Abbott et al. |
| 2011/0275207 A1 | 11/2011 | Moniwa et al. |
| 2011/0303973 A1 | 12/2011 | Masuoka et al. |
| 2011/0303985 A1 | 12/2011 | Masuoka et al. |
| 2012/0086051 A1 | 4/2012 | Wang et al. |
| 2012/0196415 A1 | 8/2012 | Masuoka et al. |

FOREIGN PATENT DOCUMENTS

| | | |
|---|---|---|
| CN | 1983601 A | 6/2007 |
| CN | 101542733 A | 9/2009 |
| DE | 4443968 | 11/1995 |
| EP | 1770769 A1 | 4/2007 |
| EP | 2197032 A1 | 6/2010 |
| EP | 2239770 A1 | 10/2010 |
| EP | 2239771 A1 | 10/2010 |
| EP | 2244305 A1 | 10/2010 |
| EP | 2246895 A1 | 11/2010 |
| JP | 60-070757 A | 4/1985 |
| JP | 61-013661 | 1/1986 |
| JP | 62-045058 A | 2/1987 |
| JP | 62-190751 | 8/1987 |

(56) References Cited

FOREIGN PATENT DOCUMENTS

| | | |
|---|---|---|
| JP | 63-037633 A | 2/1988 |
| JP | 63-158866 A | 7/1988 |
| JP | 64-089560 A | 4/1989 |
| JP | 01-175775 A | 7/1989 |
| JP | 02-066969 A | 3/1990 |
| JP | 02-071556 | 3/1990 |
| JP | 02-089368 A | 3/1990 |
| JP | 02-188966 | 7/1990 |
| JP | 03-114233 | 5/1991 |
| JP | 03-145761 | 6/1991 |
| JP | 03-225873 A | 10/1991 |
| JP | 04-234166 A | 8/1992 |
| JP | 05-276442 A | 10/1993 |
| JP | 06-021467 A | 1/1994 |
| JP | 06-069441 | 3/1994 |
| JP | 06-237003 A | 8/1994 |
| JP | 07-099311 | 4/1995 |
| JP | 07-321228 | 12/1995 |
| JP | 08-078533 A | 3/1996 |
| JP | 09-008295 | 1/1997 |
| JP | 10-079482 A | 3/1998 |
| JP | 10-223777 A | 8/1998 |
| JP | 11-087649 | 3/1999 |
| JP | 2000-012705 A | 1/2000 |
| JP | 2000-068516 | 3/2000 |
| JP | 2000-208434 | 7/2000 |
| JP | 2000-243085 | 9/2000 |
| JP | 2000-244818 A | 9/2000 |
| JP | 2000-357736 | 12/2000 |
| JP | 2001-028399 | 1/2001 |
| JP | 2001-237421 A | 8/2001 |
| JP | 2001-339057 A | 12/2001 |
| JP | 2001-352047 A | 12/2001 |
| JP | 2002-009257 | 1/2002 |
| JP | 2002-033399 A | 1/2002 |
| JP | 2002-231951 A | 8/2002 |
| JP | 2002-246580 A | 8/2002 |
| JP | 2002-246581 A | 8/2002 |
| JP | 2003-068883 A | 3/2003 |
| JP | 2003-142684 | 5/2003 |
| JP | 2003-179160 A | 6/2003 |
| JP | 2003-224211 A | 8/2003 |
| JP | 2004-079694 | 3/2004 |
| JP | 2004-096065 A | 3/2004 |
| JP | 2004-153246 | 5/2004 |
| JP | 2004-193588 A | 7/2004 |
| JP | 2004-259733 A | 9/2004 |
| JP | 2004-319808 A | 11/2004 |
| JP | 2005-012213 A | 1/2005 |
| JP | 2005-135451 | 5/2005 |
| JP | 2006-024799 A | 1/2006 |
| JP | 2006-514392 | 4/2006 |
| JP | 2006-294995 A | 10/2006 |
| JP | 2007-0250652 A | 9/2007 |
| JP | 2008-177565 | 7/2008 |
| JP | 2008-205168 A | 9/2008 |
| JP | 2008-300558 A | 12/2008 |
| JP | 2009-110049 A | 5/2009 |
| JP | 2009-182316 A | 8/2009 |
| JP | 2009-182317 A | 8/2009 |
| JP | 2010-171055 | 8/2010 |
| JP | 2010-0213539 A | 9/2010 |
| JP | 2010-258345 | 11/2010 |
| JP | 2011-066105 | 3/2011 |
| JP | 2011-071235 | 4/2011 |
| JP | 2011-077437 | 4/2011 |
| JP | 2011-211161 A | 10/2011 |
| KR | 10-0132560 | 12/1997 |
| KR | 10-0200222 | 6/1999 |
| KR | 10-0327875 B1 | 9/2002 |
| KR | 2004-0063348 A | 7/2004 |
| WO | WO 94/14198 A1 | 6/1994 |
| WO | WO 01/22494 A1 | 3/2001 |
| WO | WO 2005/036651 | 4/2005 |
| WO | WO 2006/127586 | 11/2006 |
| WO | WO 2009/034623 A1 | 3/2009 |
| WO | WO 2009/034731 A1 | 3/2009 |
| WO | WO 2009/057194 A1 | 5/2009 |
| WO | WO 2009/095997 A1 | 8/2009 |
| WO | WO 2009/096001 A1 | 8/2009 |
| WO | WO 2009/096464 A1 | 8/2009 |
| WO | WO 2009/096465 A1 | 8/2009 |
| WO | WO 2009/096466 A1 | 8/2009 |
| WO | WO 2009/096470 A1 | 8/2009 |
| WO | WO 2009/102059 A1 | 8/2009 |
| WO | WO 2009/133957 A1 | 11/2009 |
| WO | WO 2011/111662 A1 | 9/2011 |

OTHER PUBLICATIONS

Chen, Yijian et al., "Vertical integrated-gate CMOS for ultra-dense IC", *Microelectronic Engineering,* vol. 83, 2006, pp. 1745-1748.
Choi, Yang-Kyu et al., "FinFET Process Refinements for Improved Mobility and Gate Work Function Engineering," IEEE, 2002, 4 pages.
Office Action for Chinese Patent Application Serial No. 200980103454.9, dated Oct. 31, 2012, 7 pages.
Office Action for Chinese Patent Application Serial No. 200980103505.8, dated Nov. 1, 2012, 5 pages.
Office Action for Chinese Patent Application Serial No. 201010171435.4, dated Dec. 21, 2012, 7 pages.
Office Action for Chinese Patent Application Serial No. 2011100647037, dated Nov. 14, 2012, 6 pages.
Office Action for Japanese Patent Application Serial No. 2009-538870, dated Nov. 8, 2012, 4 pages.
Restriction Requirement for U.S. Appl. No. 13/412,959, dated Nov. 8, 2012, 6 pages.
European Search Report for counterpart European Application No. 09705485.2, dated Feb. 14, 2011, 5 pages.
Examination Report for European Application No. 08722595.9, dated Jul. 11, 2012, 4 pages.
Examination Report in corresponding European Application No. 07 807 139.6, dated Jun. 11, 2012, 4 pages.
Extended European Search Report for European Application No. 07807139.6, dated Jun. 24, 2011, 10 pages.
Extended European Search Report for European Application No. 10004492.4, dated Jun. 21, 2012, 10 pages.
Extended European Search Report for European Application No. 10009574.4, dated May 15, 2012, 6 pages.
Extended European Search Report for European Application No. 12001395.8, dated Apr. 26, 2012, 7 pages.
Extened European Search Report for European Application No. 10009579.3, dated Jun. 11, 2012, 11 pages.
Guidash, R.M. et al. "A 0.6 μm CMOS Pinned Photodiode Color Imager Technology", *IEDM Digest Papers,* pp. 927-929, 1997.
Hieda, K. et al., "New Effects of Trench Isolated Transistor Using Side-Wall Gates", *VLSI Research Center,* Toshiba Corporation, 1987, 4 pages.
International Preliminary Report on Patentability for International Application No. PCT/JP2008/051300, dated Aug. 31, 2010, 9 pages.
International Preliminary Report on Patentability for International Application No. PCT/JP2009/051459, dated Aug. 31, 2010, 9 pages.
International Preliminary Report on Patentability for International Application No. PCT/JP2011/055264, dated Oct. 11, 2012, 7 pages.
International Search Report for International Application No. PCT/JP2007/067732, dated Dec. 11, 2007, 2 pages.
International Search Report for International Application No. PCT/JP2007/071052, dated Jan. 29, 2008, 6 pages.
International Search Report for International Application No. PCT/JP2008/051300, dated May 13, 2008, 4 pages.
International Search Report for International Application No. PCT/JP2008/051301, dated Apr. 1, 2008, 2 pages.
International Search Report for International Application No. PCT/JP2008/051302, dated Apr. 8, 2008, 2 pages.
International Search Report for International Application No. PCT/JP2008/051304, dated Apr. 15, 2008, 2 pages.
International Search Report for International Application No. PCT/JP2008/058412, dated Jun. 10, 2008, 2 pages.

(56) References Cited

OTHER PUBLICATIONS

International Search Report for International Application No. PCT/JP2009/051459, dated Apr. 14, 2009, 4 pages.
International Search Report for International Application No. PCT/JP2009/051460, dated Apr. 21, 2009, 2 pages.
International Search Report for International Application No. PCT/JP2009/051461, dated Apr. 21, 2009, 2 pages.
International Search Report for International Application No. PCT/JP2009/051463, dated Feb. 24, 2009, 2 pages.
International Search Report for International Application No. PCT/JP2009/058629, dated Jun. 2, 2009, 2 pages.
International Search Report for International Application No. PCT/JP2011/070534, dated Dec. 6, 2011, 10 pages.
International Search Report for International Application No. PCT/JP2011/071162, dated Dec. 13, 2011, 18 pages.
Iwai, Makoto et al., "High-Performance Buried Gate Surrounding Gate Transistor for Future Three-Dimensional Devices", *Japanese Journal of Applied Physics,* 2004, vol. 43, No. 10, pp. 6904-6906.
Kasano, Masahiro, "A 2.0.mu.m Pixel Pitch MOS Image Sensor with an Amorphous Si Film Color Filter," IEEE International Solid-State Circuits Conference, Feb. 8, 2005, 3 pages.
Maeda, Shigenobu et al., "Impact of a Vertical .PHI.-Shape Transistor (V.PHI.T) Cell for 1 Gbit DRAM and Beyond," IEEE Transactions on Electron Devices, vol. 42, No. 12, Dec. 1995, pp. 2117-2124.
Mendis, Sunetra K. et al. "A 128 x 128 CMOS Active Pixel Image Sensor for Highly Integrated Imaging System", *IEDM93, Digest Papers,* 22.6.1, pp. 583-586, 1993.
Mistry et al., "A 45nm Logic Technology with High-k+Metal Gate Transistors, Strained Silicon, 9 Cu Interconnect Layers, 193nm Dry Patterning, and 100% Pb-free Packaging", IEEE, pp. 247-250, 2007.
Nakamura, Jun-ichi et al., "Nondestructive Readout Mode Static Induction Transistor (SIT) Photo Sensors," IEEE Transactions on Electron Devices, 1993, vol. 40, pp. 334-341.
Nitayama, Akihiro et al., "Multi-Pillar Surrounding Gate Transistor (M-SGT) for Compact and High-Speed Circuits", *IEEE Transactions on Electron Devices,* vol. 3, No. 3, Mar. 1991, pp. 679-583.
Non-Certified Partial Translation of Office Action from counterpart Korean Application No. 10-2010-7018204, dated Mar. 29, 2012, 1 page.
Notice of Allowance for U.S. Appl. No. 12/704,955, dated Mar. 15, 2012, 8 pages.
Notice of Allowance for U.S. Appl. No. 13/447,721, dated Nov. 2, 2012, 9 pages.
Notice of Allowance for U.S. Appl. No. 12/700,294, dated Oct. 5, 2012, 7 pages.
Office Action from co-pending U.S. Appl. No. 12/704,935, dated Nov. 18, 2011, 9 pages.
Office Action from co-pending U.S. Appl. No. 12/894,923, dated Oct. 2, 2012, 21 pages.
Office Action from co-pending U.S. Appl. No. 13/043,081, dated Jul. 16, 2012, 6 pages.
Office Action from co-pending U.S. Appl. No. 13/046,113, dated Jan. 9, 2013, 6 pages.
Office Action from co-pending U.S. Appl. No. 13/113,482, dated Jan. 2, 2013, 9 pages.
Office Action from co-pending U.S. Appl. No. 13/412,959, dated Dec. 7, 2013, 9 pages.
Office Action from co-pending U.S. Appl. No. 12/704,955, dated Dec. 8, 2013, 12 pages.
Office Action from counterpart Korean Application No. 10-2010-7018204, dated Mar. 29, 2012, 7 pages.
Takahashi, Hidekazu, "A 3.9.mu.m Pixel Pitch VGA Format 10b Digital Image Sensor with 1.5-Transistor/Pixel," IEEE International Solid-State Circuits Conference, Feb. 16, 2004, 10 pages.
Takato, Hiroshi et al., "Impact of Surrounding Gate Transistor (SGT) for Ultra-High-Density LSI's," IEEE Transactions on Electron Devices, vol. 38, No. 3, Mar. 1991, pp. 573-578.

Watanabe, S. et al., "A Novel Circuit Technology with Surrounding Gate Transistors (SGT's) for Ultra High Density DRAM's", IEEE Journal of Solid-State Circuits, vol. 30, No. 9, Sep. 1995, pp. 960-971.
Written Opinion of the International Searching Authority for International Application No. PCT/JP2007/067732, dated Dec. 11, 2007, 4 pages.
Written Opinion of the International Searching Authority for International Application No. PCT/JP2007/071052, dated Jan. 29, 2008, 9 pages.
Written Opinion of the International Searching Authority for International Application No. PCT/JP2008/051300, dated Aug. 30, 2010, 8 pages.
Written Opinion of the International Searching Authority for International Application No. PCT/JP2008/051301, dated Apr. 1, 2008, 5 pages.
Written Opinion of the International Searching Authority for International Application No. PCT/JP2008/051302, dated Apr. 8, 2008, 5 pages.
Written Opinion of the International Searching Authority for International Application No. PCT/JP2008/058412, dated Jun. 10, 2008, 4 pages.
Written Opinion of the International Searching Authority for International Application No. PCT/JP2009/051459, dated Aug. 30, 2010, 8 pages.
Written Opinion of the International Searching Authority for International Application No. PCT/JP2009/051460, dated Apr. 21, 2009, 5 pages.
Written Opinion of the International Searching Authority for International Application No. PCT/JP2009/051461, dated Apr. 21, 2009, 6 pages.
Written Opinion of the International Searching Authority for International Application No. PCT/JP2009/058629, dated Jun. 2, 2009, 4 pages.
Wu et al., "High Performance 22/20nm FinFET CMOS Devices with Advanced High-K/Metal Gate Scheme", IEEE, pp. 27.1.1-27.1.4, 2010.
Wuu, S.G. et al., "A Leading-Edge 0.9 μm Pixel CMOS Image Sensor Technology with Backside Illumination: Future Challenges for Pixel Scaling", *IEDM2010 Digest Papers,* 14.1.1, pp. 332-335, 2010.
Yonemoto, Kazuya, "A CMOS Image Sensor with a Simple FPN-Reduction Technology and a Hole Accumulated Diode," 2000 IEEE International Solid-State Circuits Conference, 9 pages.
Notice of Allowance for U.S. Appl. No. 12/894,923, dated Feb. 21, 2013, 5 pages.
Notice of Allowance for U.S. Appl. No. 12/894,923, dated Mar. 14, 2013, 5 pages.
Restriction Requirement for U.S. Appl. No. 13/116,506, dated Feb. 28, 2013, 6 pages.
Office Action for U.S. Appl. No. 13/412,959, dated Mar. 13, 2013, 7 pages.
Office Action for Korean Patent Application Serial No. 9-5-2013-010869116, dated Feb. 18, 2013, 4 pages.
International Search Report for PCT/JP2011/079300, dated Mar. 13, 2012, 5 pages.
Lee, et al., "An Active Pixel Sensor Fabricated Using CMOS/CCD Process Technology" in Program IEEE Workshop on Charge-Coupled Devices and Advanced Image Sensors, 1995, 5 pages.
Murakami et al., "Technologies to Improve Photo-Sensitivity and Reduce VOD Shutter Voltage for CCD Image Sensors", IEEE Transactions on Electron Devices, vol. 47, No. 8, 2000, pp. 1566-1572.
Takahashi et al., "A 3.9-μm Pixel Pitch VGA Format 10-b Digital Output CMOS Image Sensor With 1.5 Transistor/Pixel", IEEE Journal of Solid-State Circuit, vol. 39, No. 12, 2004, pp. 2417-2425.
Yasutomi et al, "A High-Speed CMOS Image Sensor with Global Electronic Shutter Pixel Using Pinned Diodes", IEEJ Trans. SM, vol. 129, No. 10, 2009, pp. 321-327.
Notice of Allowance for U.S. Appl. No. 13/043,081, dated Mar. 18, 2013, 6 pages.
Notice of Allowance for U.S. Appl. No. 13/113,482, dated Apr. 4, 2013, 10 pages.
Notice of Allowance for U.S. Appl. No. 12/768,290, dated Apr. 18, 2013, 9 pages.

(56) References Cited

OTHER PUBLICATIONS

Notice of Allowance for U.S. Appl. No. 12/704,935, dated May 16, 2013, 10 pages.
Notice of Allowance for U.S. Appl. No. 13/046,113, dated May 13 2013, 10 pages.
Notice of Allowance for U.S. Appl. No. 13/412,959, dated May 8, 2013, 9 pages.
Office Action for U.S. Appl. No. 13/116,506, dated Jul. 18, 2013, 12 pages.
Notice of Allowance for U.S. Appl. No. 12/894,923, dated Jul. 2, 2013, 9 pages.
Notice of Allowance for U.S. Appl. No. 13/606,823, dated Jul. 8, 2013, 12 pages.
English translation of previously cited International Search Report for PCT/JP2011/070534, dated Dec. 6, 2011, 2 pages.
English translation of previously cited International Search Report for PCT/JP2011/071162, dated Dec. 13, 2011, 5 pages.
Office Action for U.S. Appl. No. 13/917,040 dated Aug. 6, 2013, 5 pages.
Office Action for U.S. Appl. No. 14/066,095 dated Sep. 15, 2014, 7 pages.
Notice of Allowance for U.S. Appl. No. 14/066,095 dated Oct. 23, 2014, 7 pages.
Office Action for U.S. Appl. No. 14/289,919 dated Feb. 5, 2015, 7 pages.
Notice of Allowance for U.S. Appl. No. 14/289,919 dated Mar. 18, 2015, 7 pages.

* cited by examiner

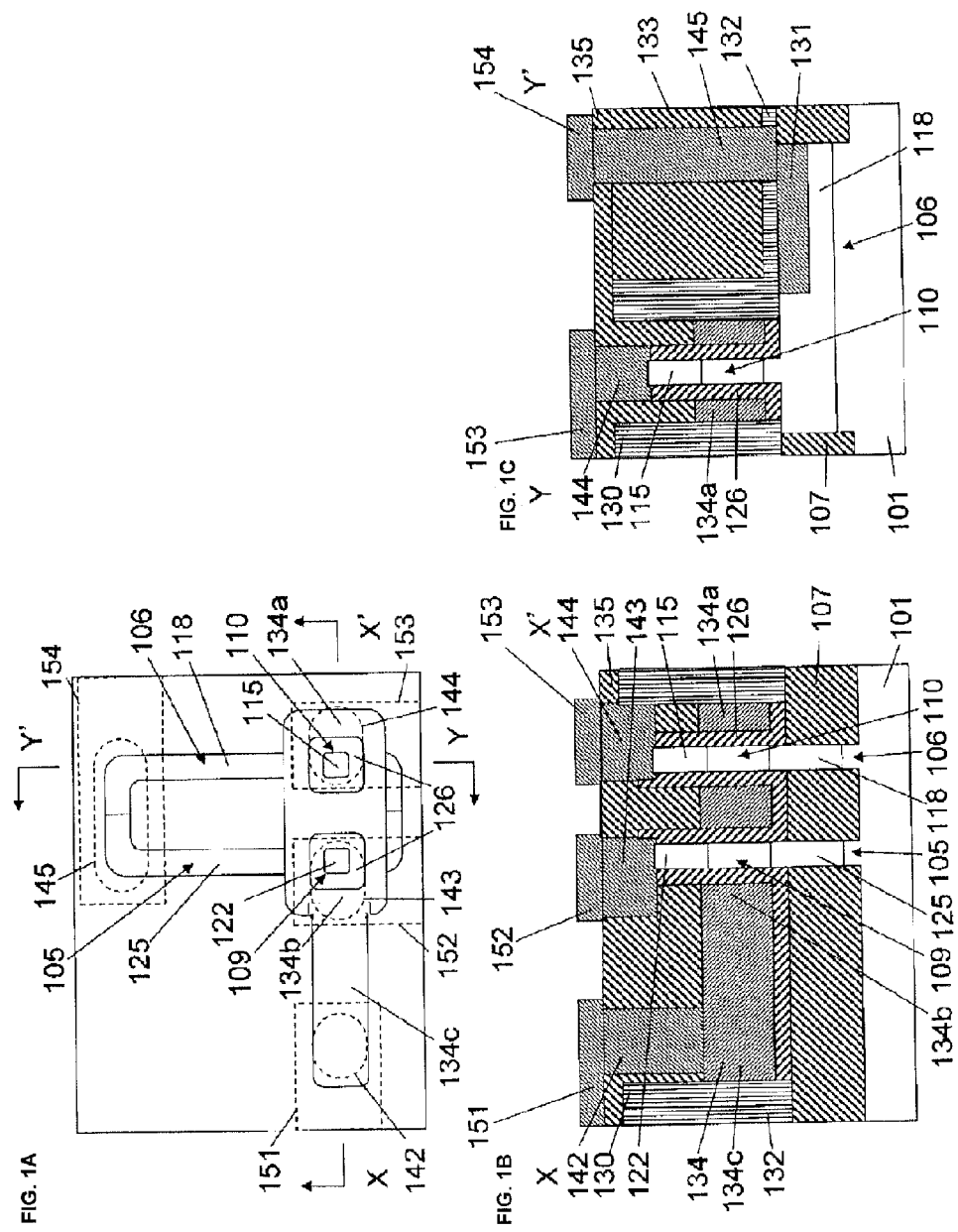

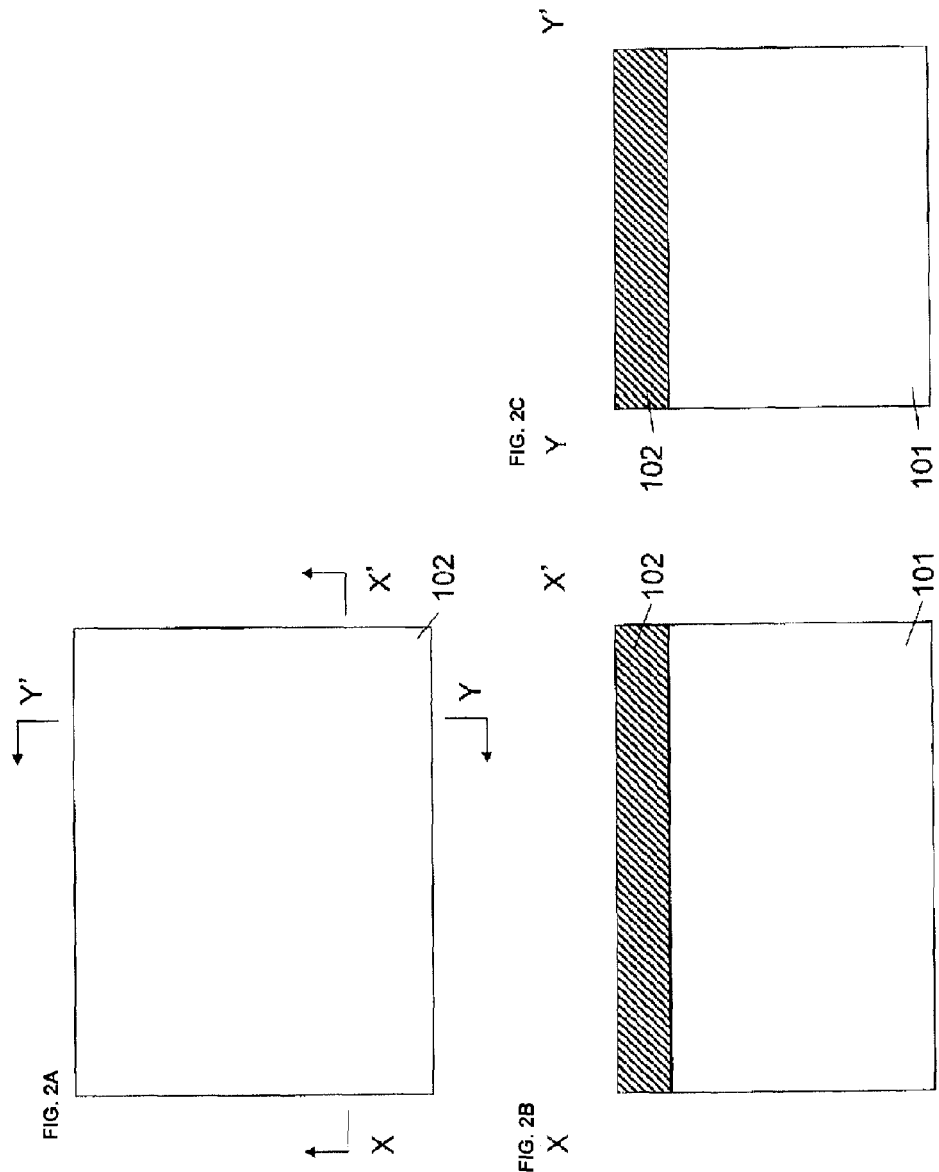

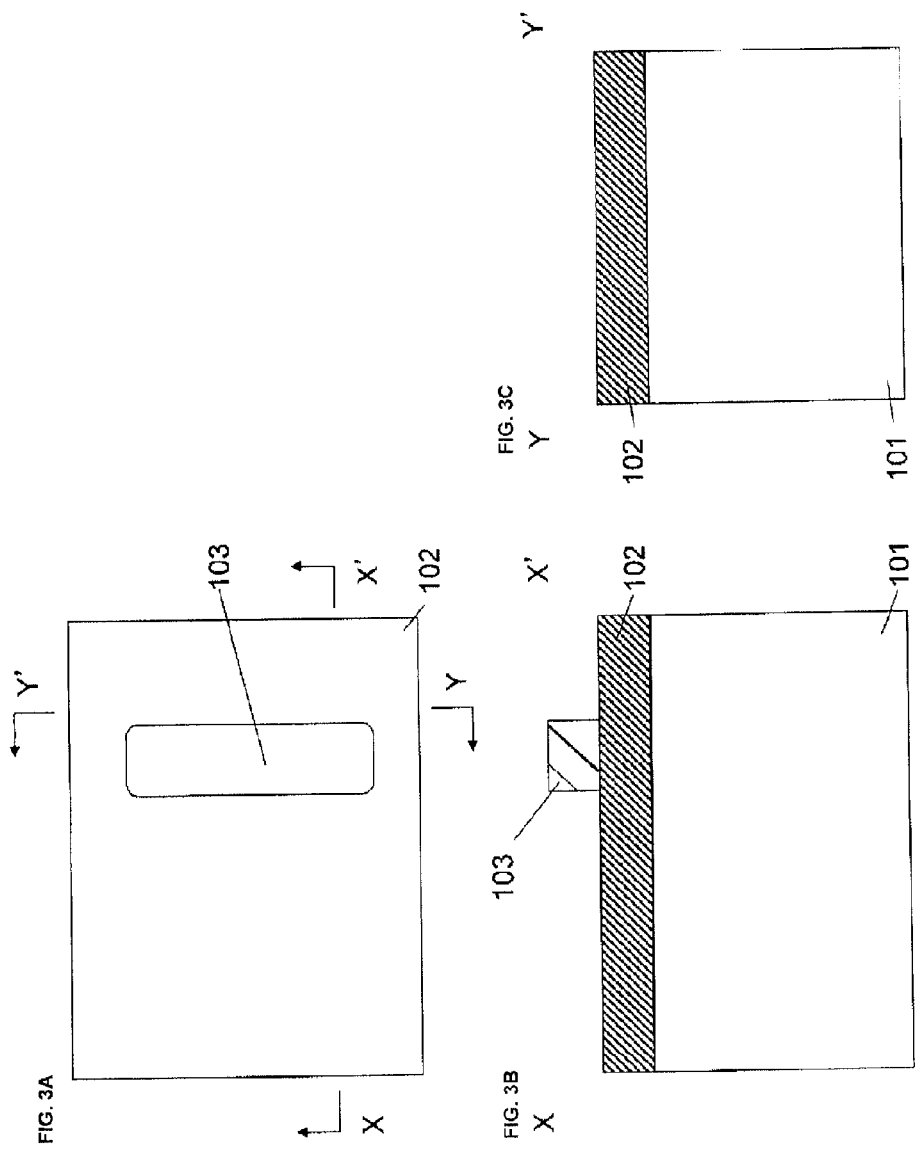

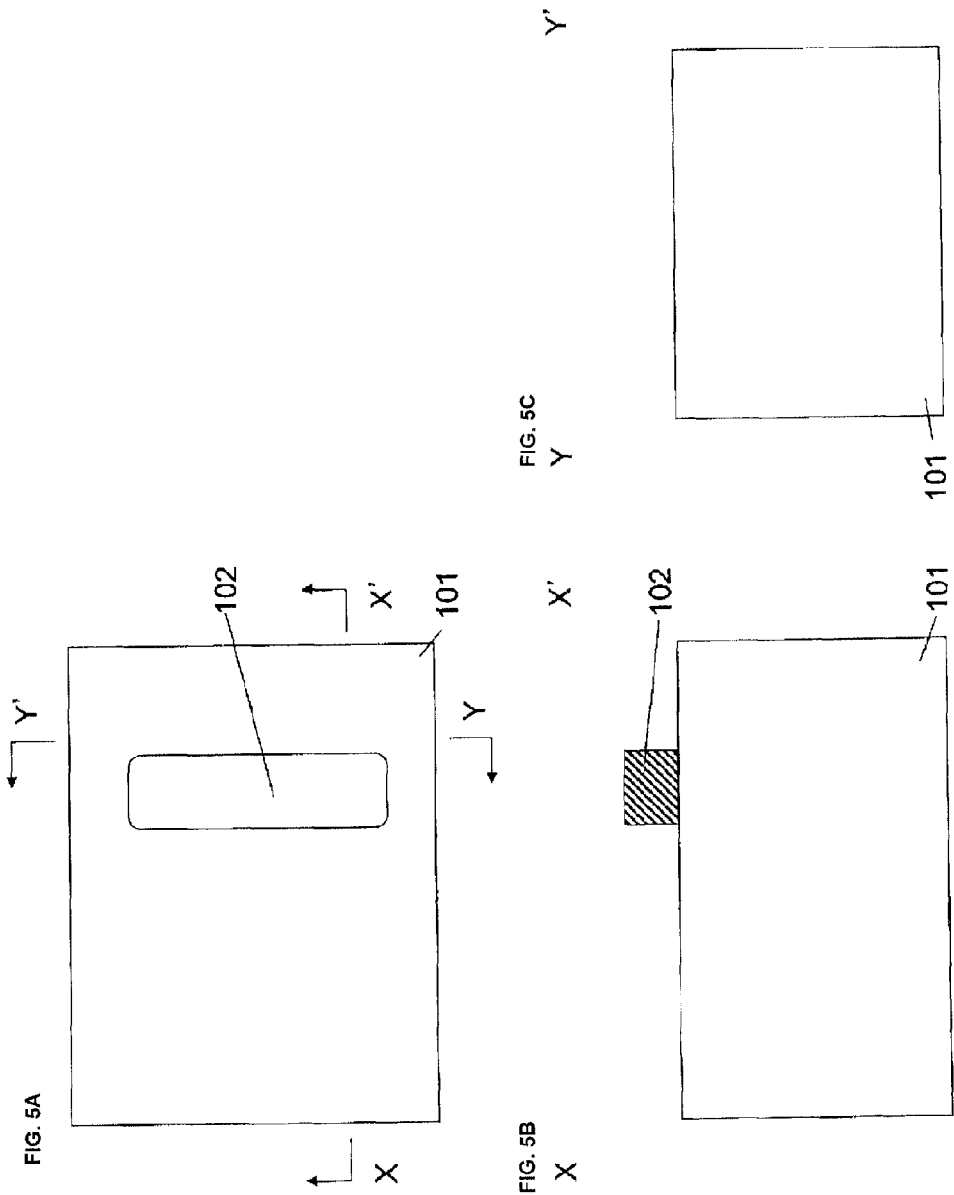

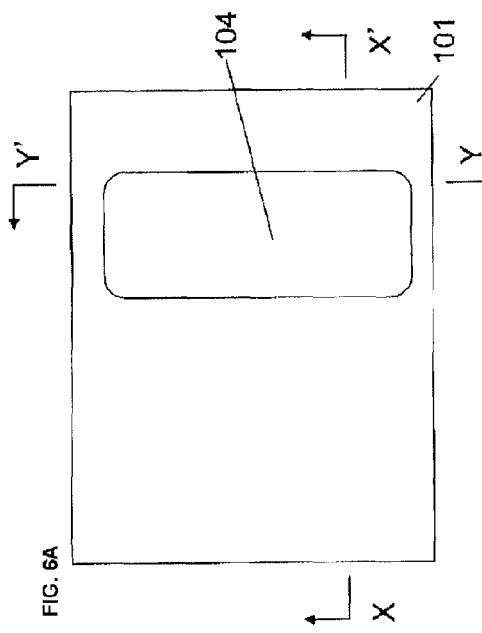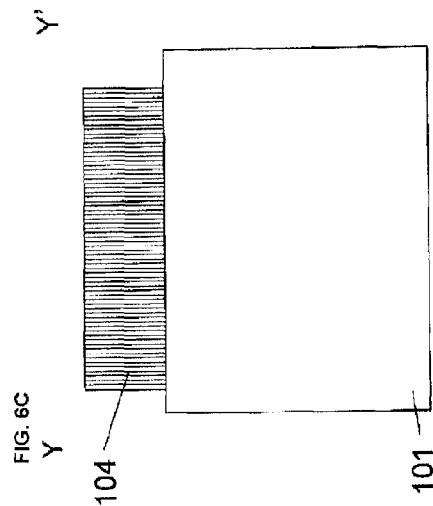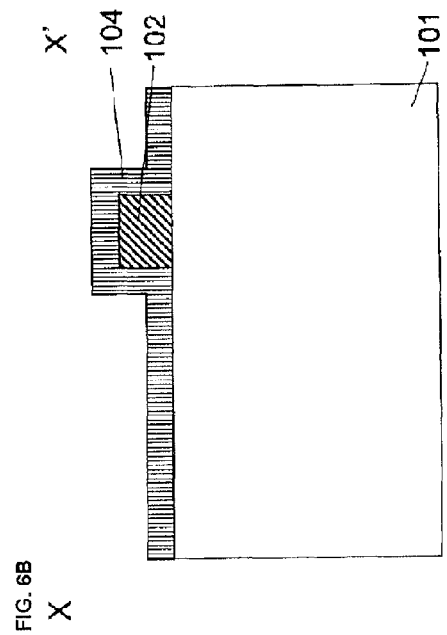
FIG. 6A
FIG. 6B
FIG. 6C

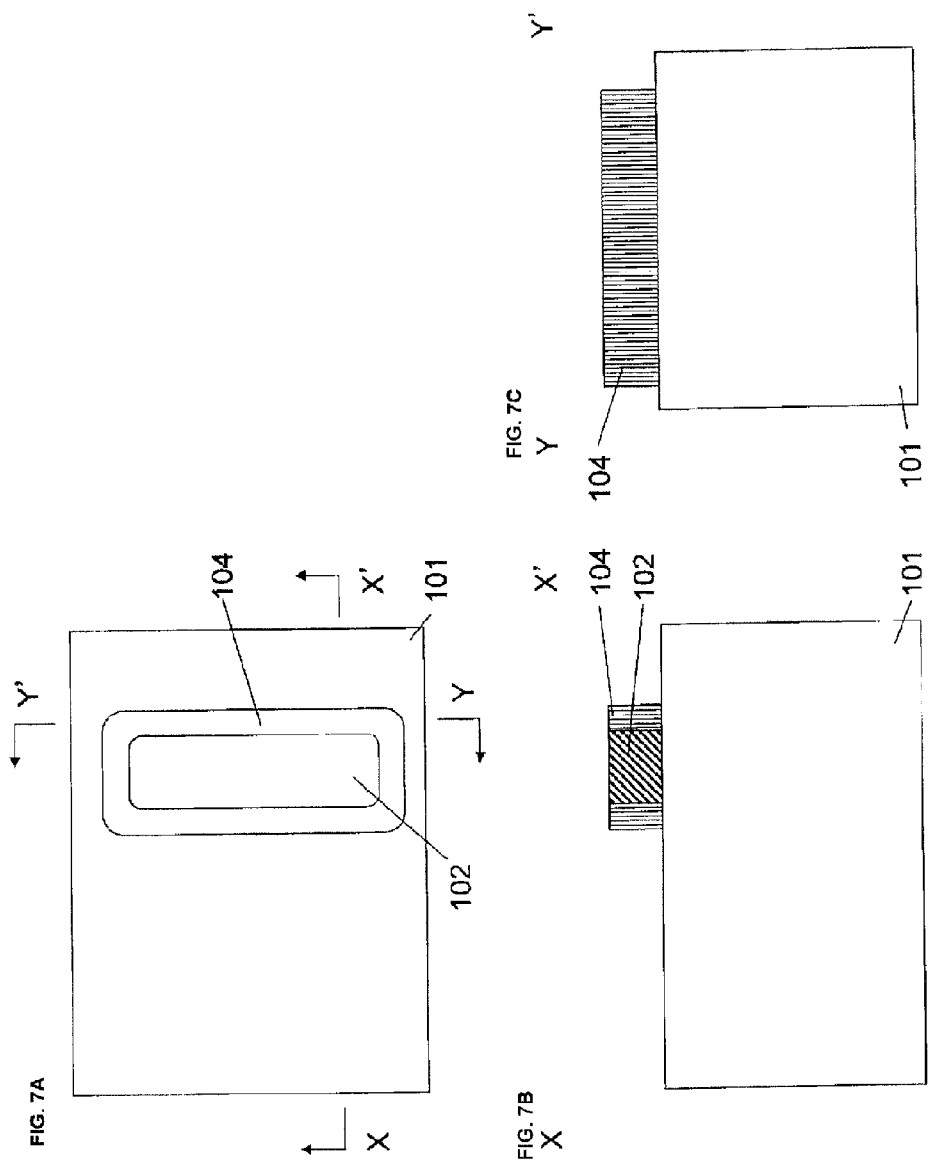

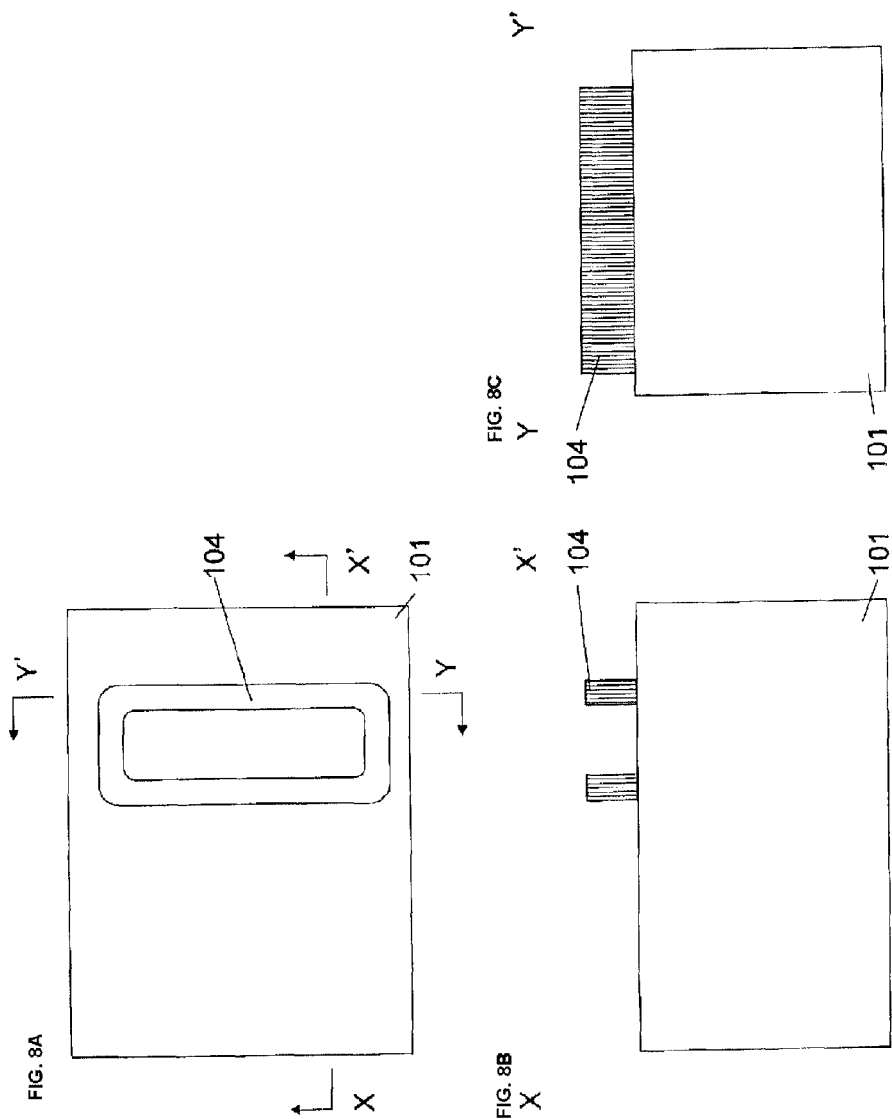

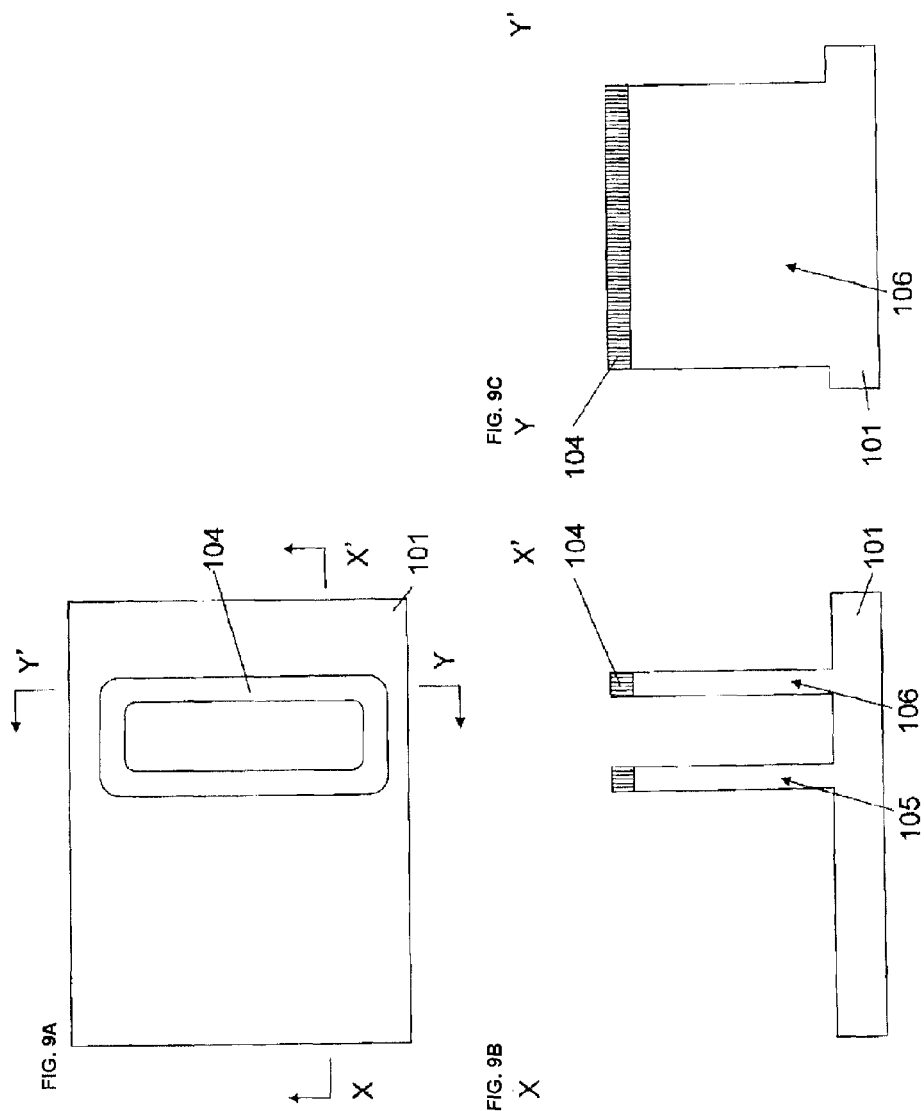

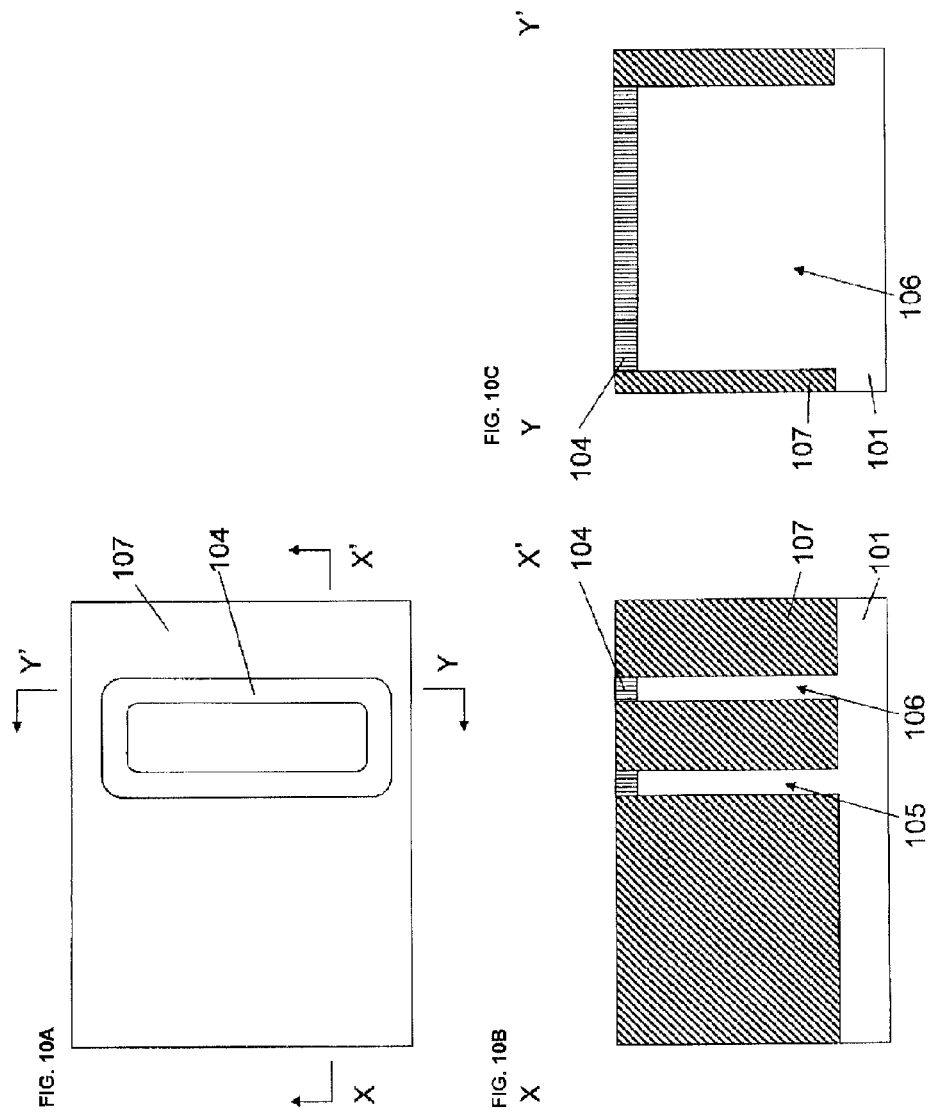

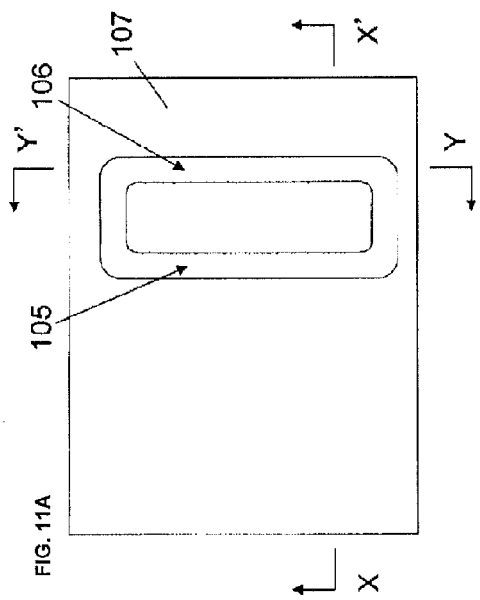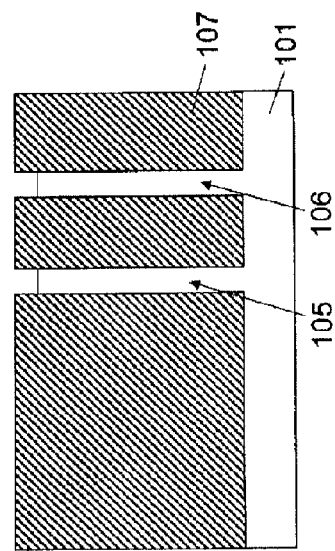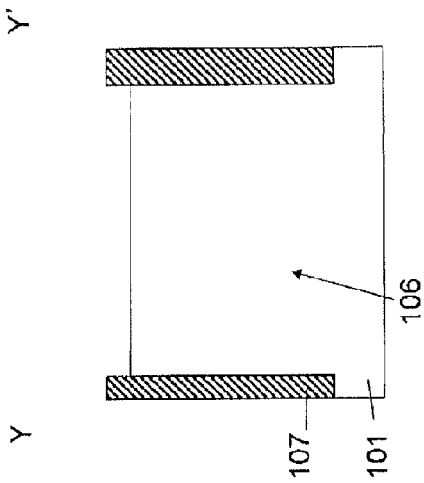

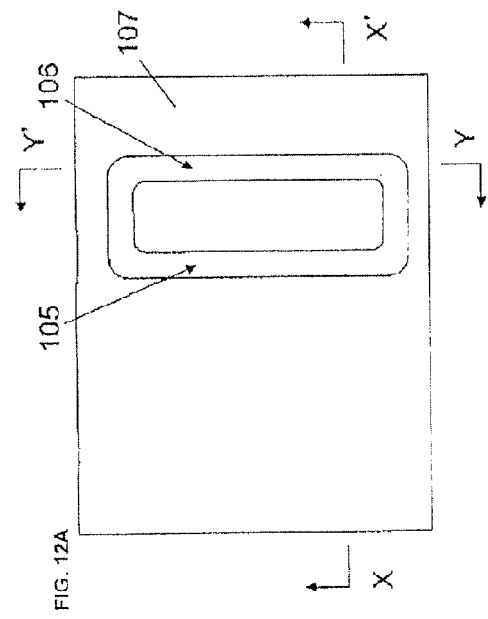
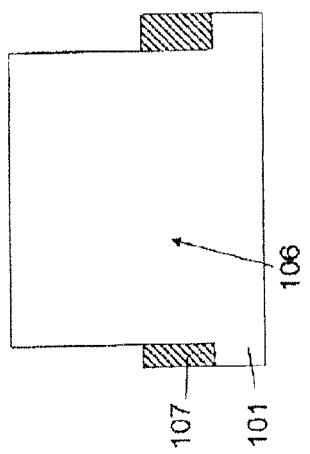
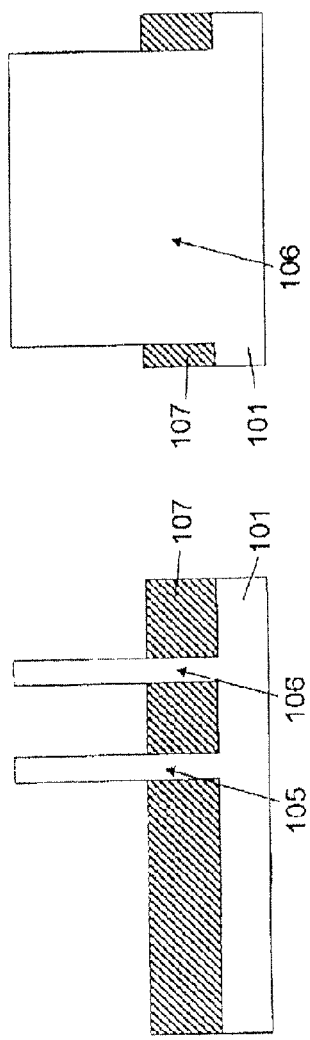

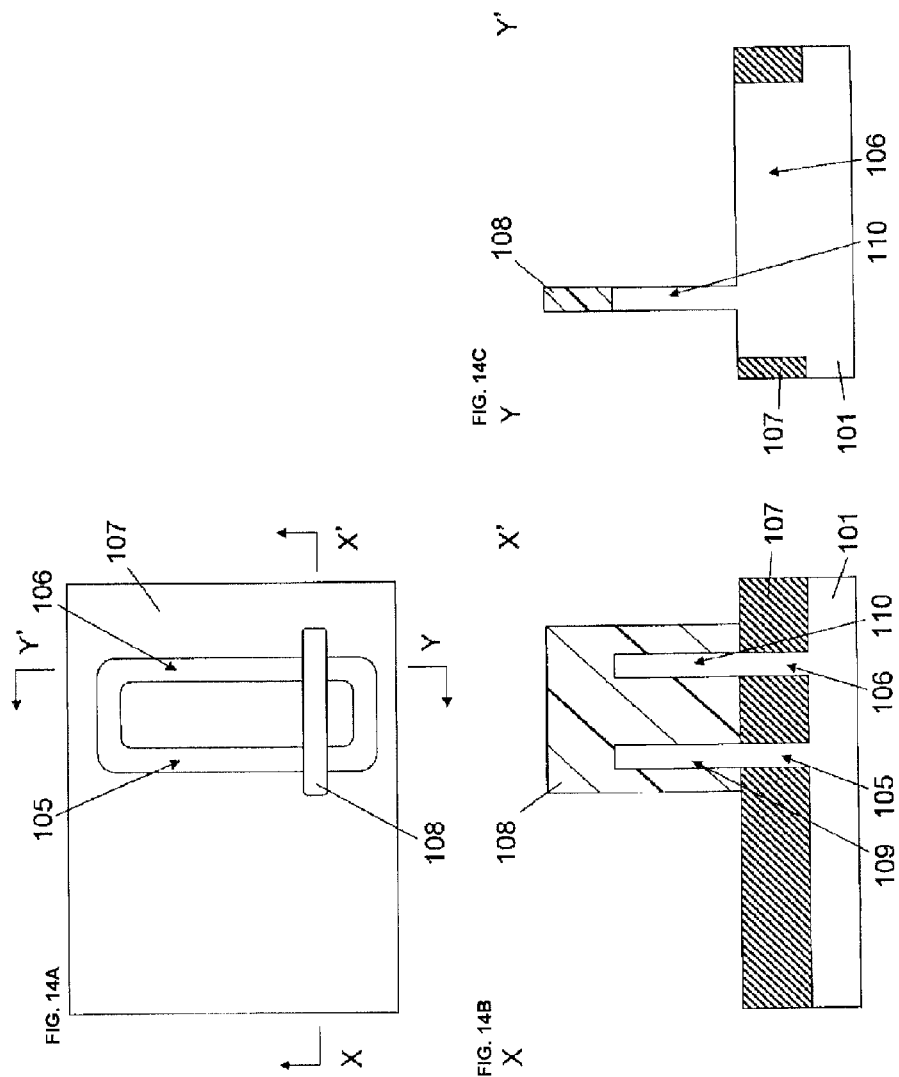

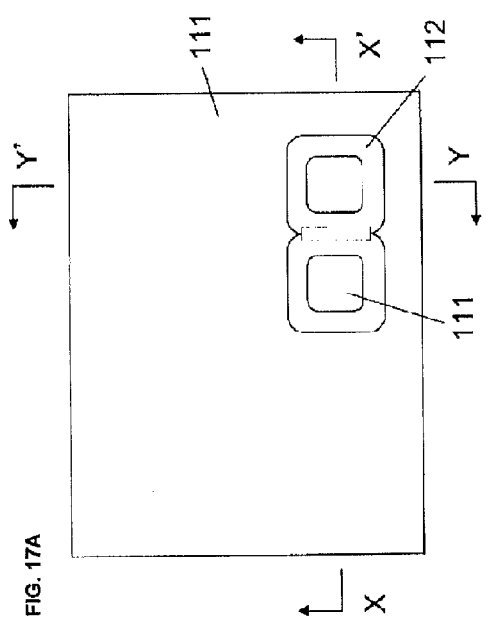
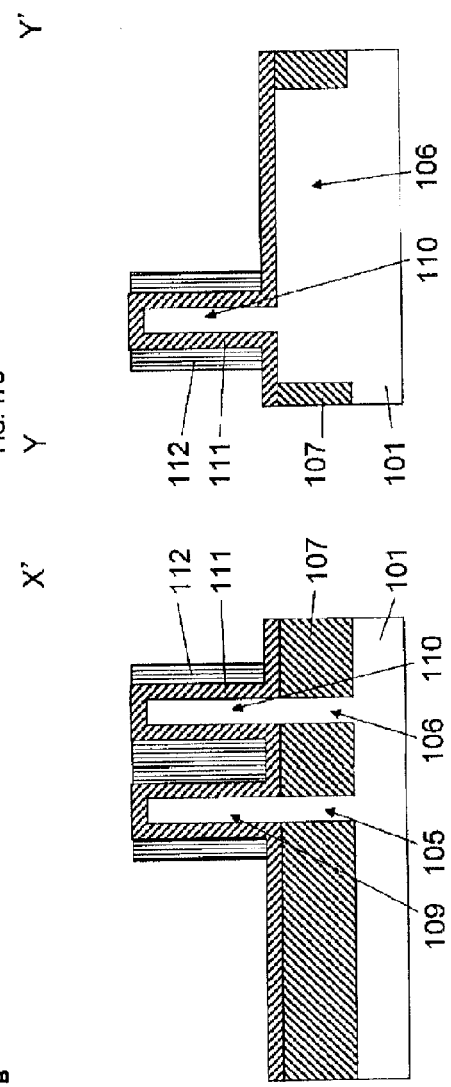
FIG. 17A
FIG. 17B
FIG. 17C

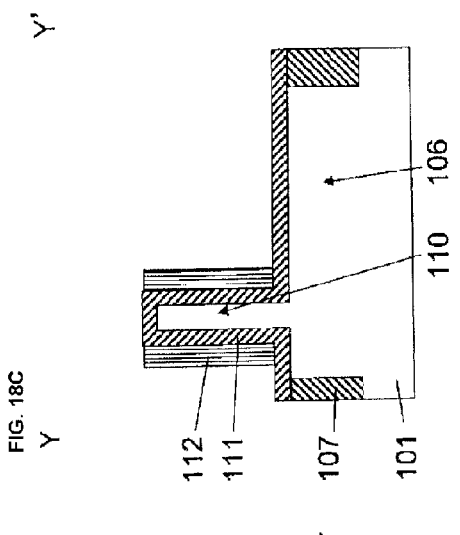
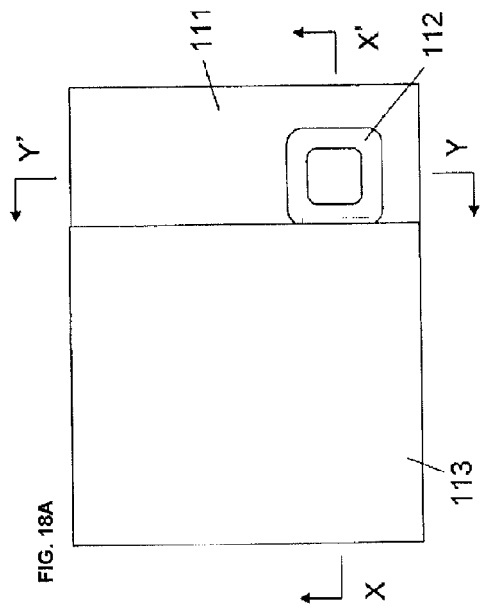
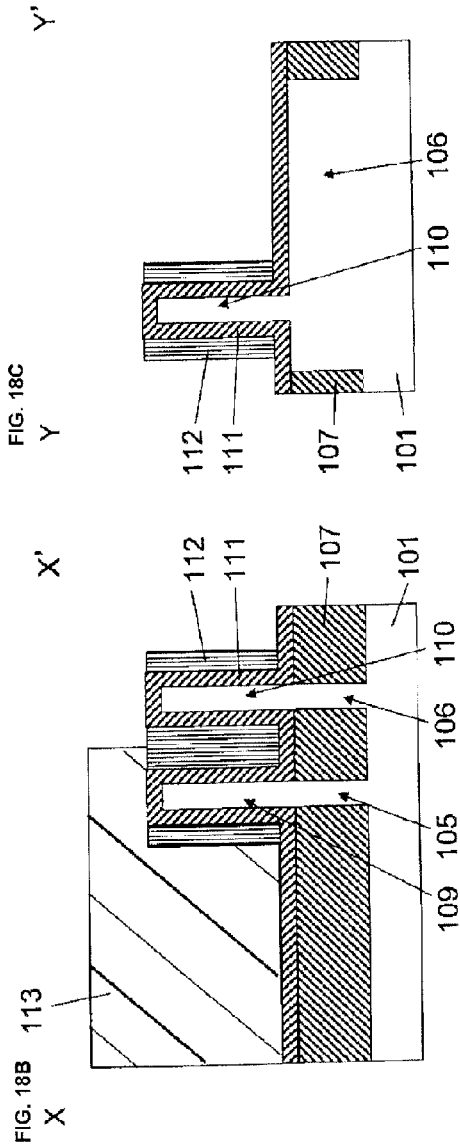

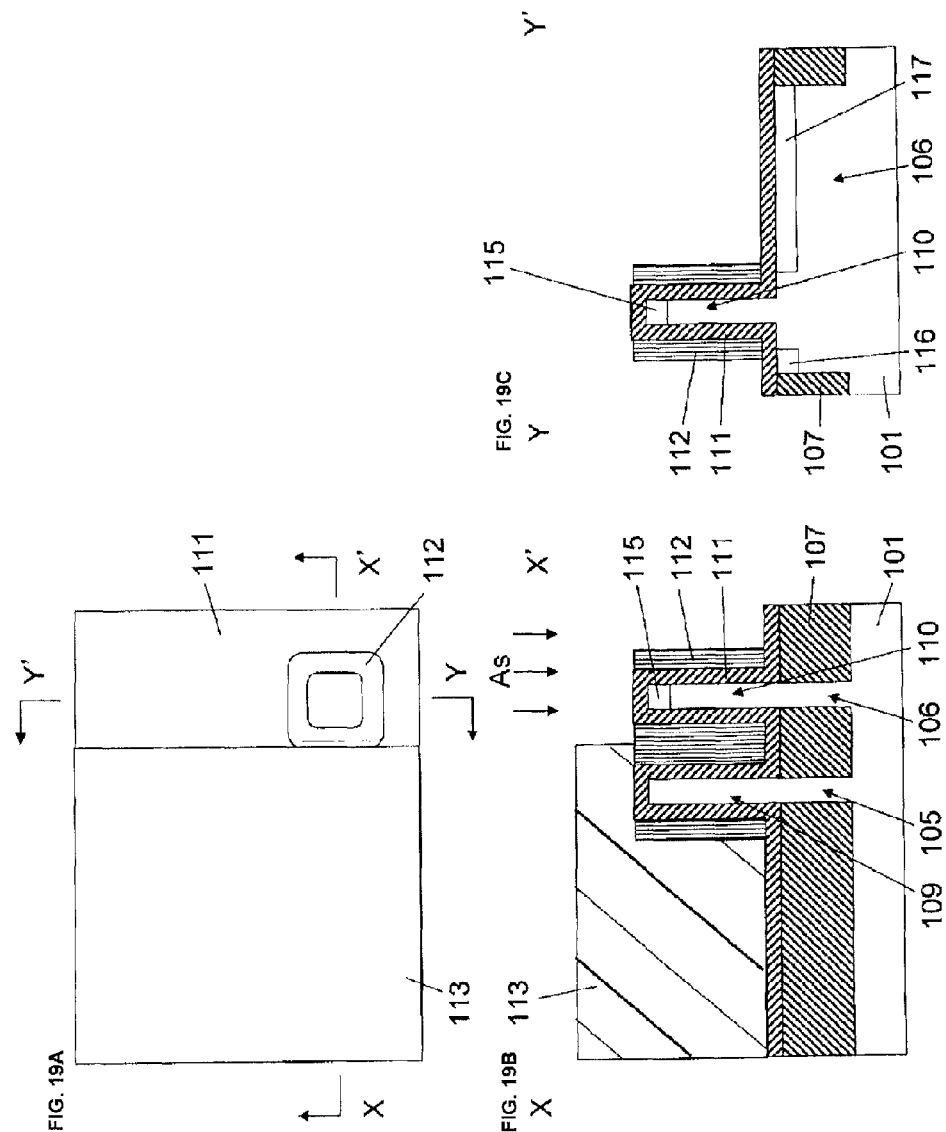

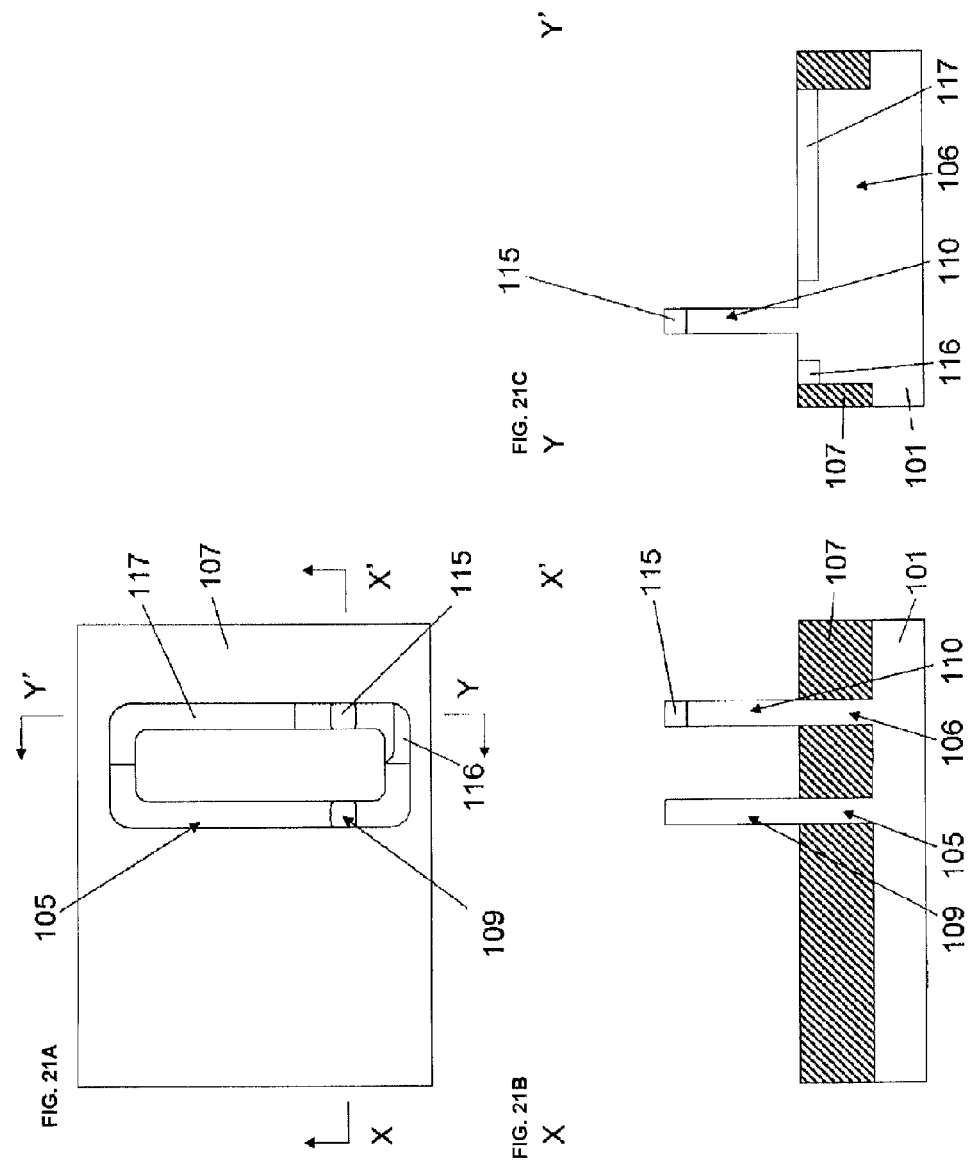

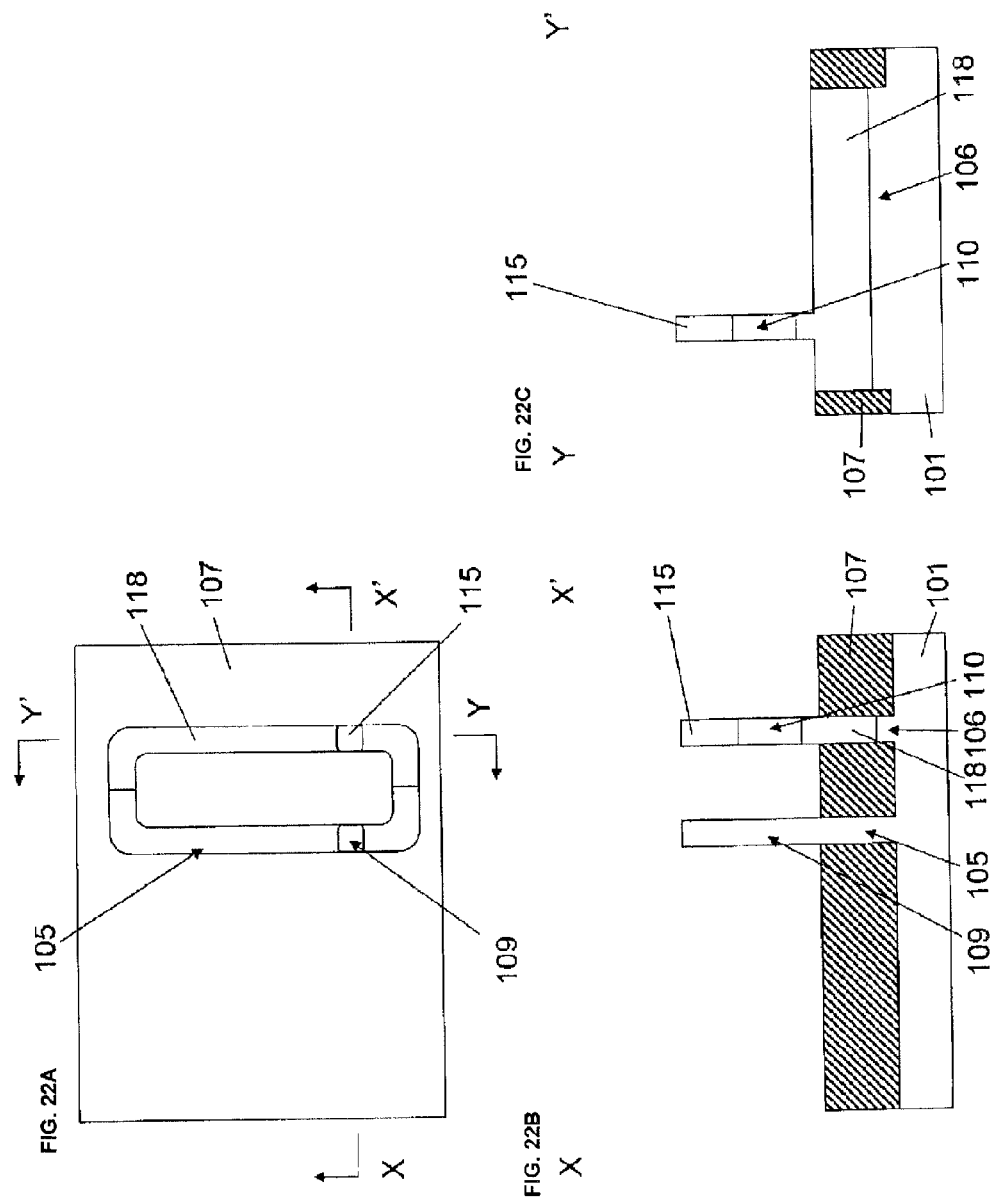

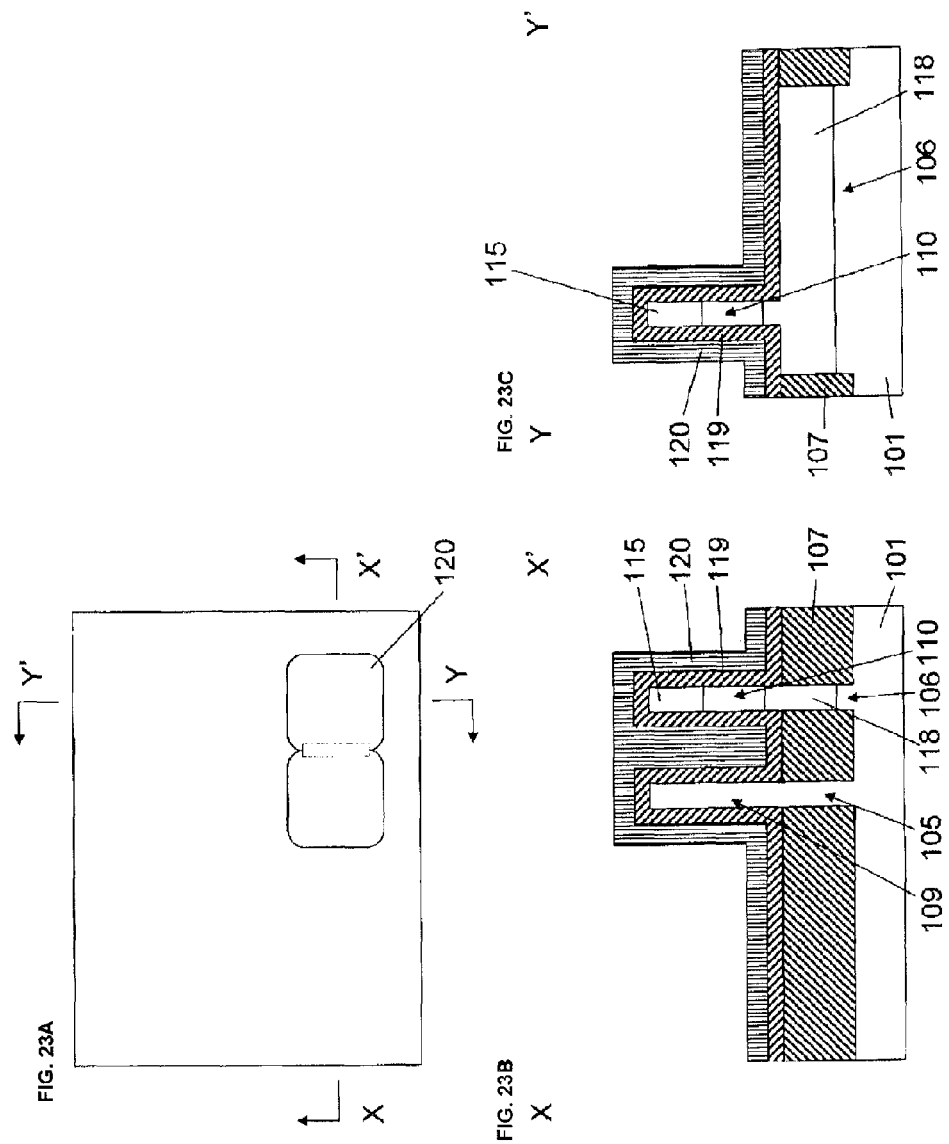

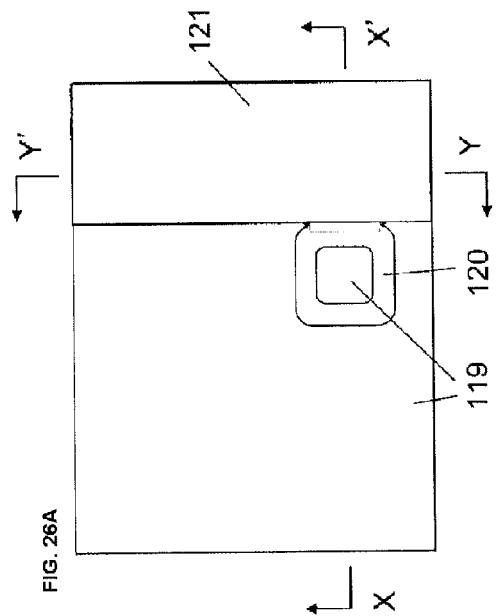
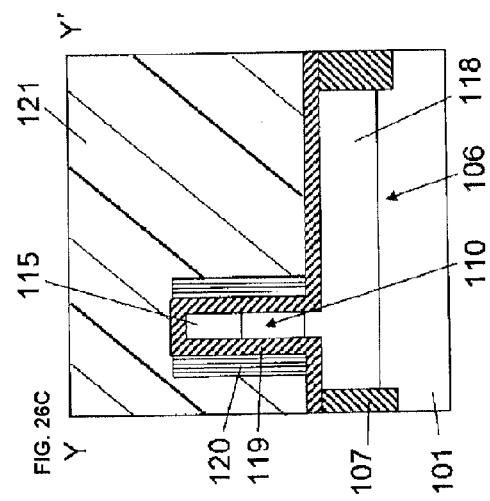
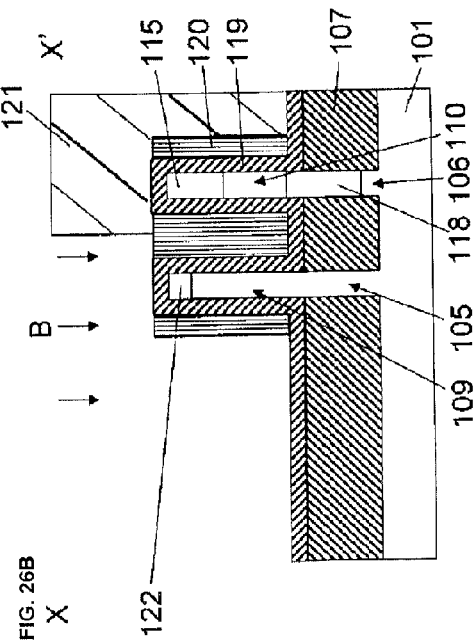

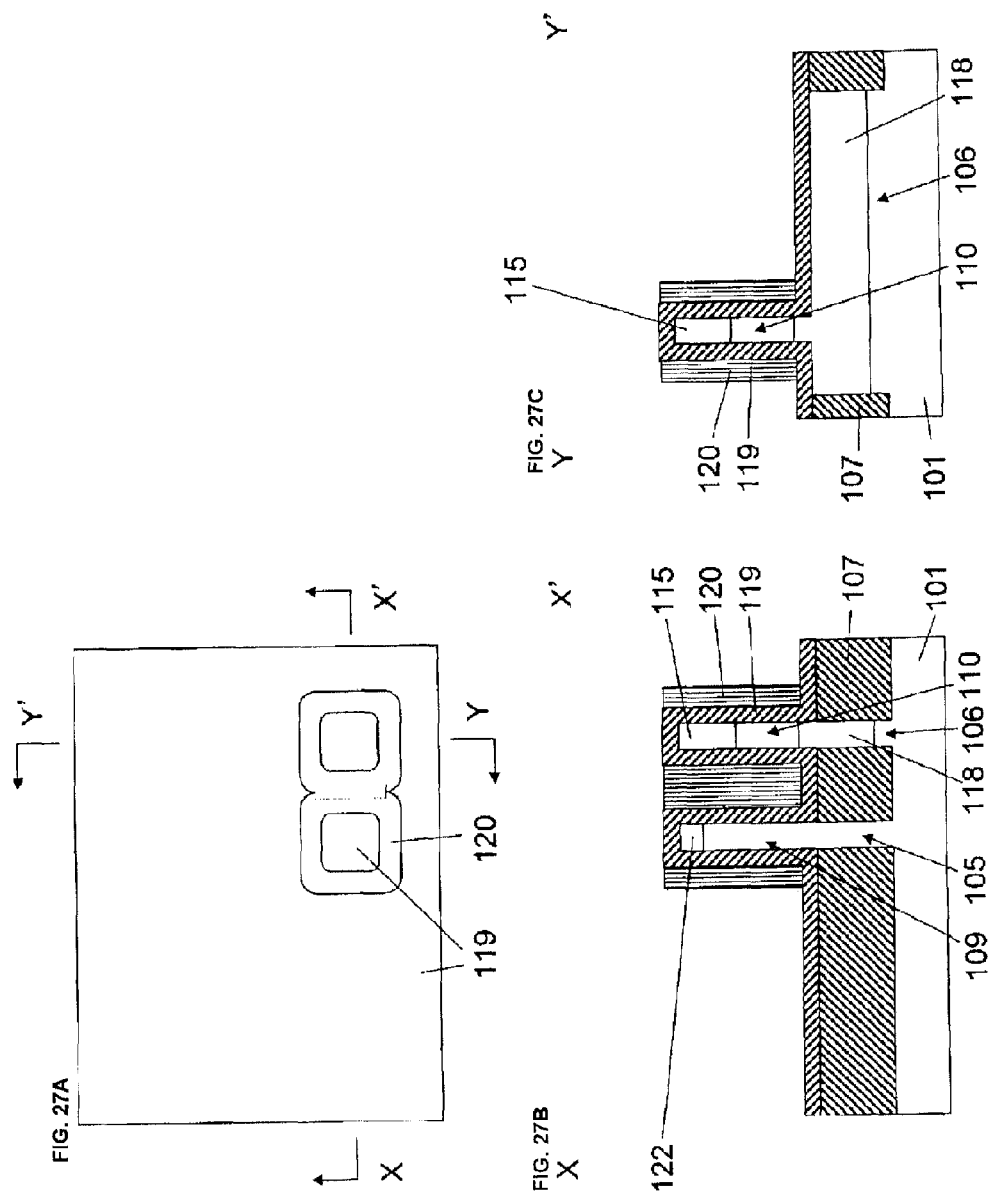

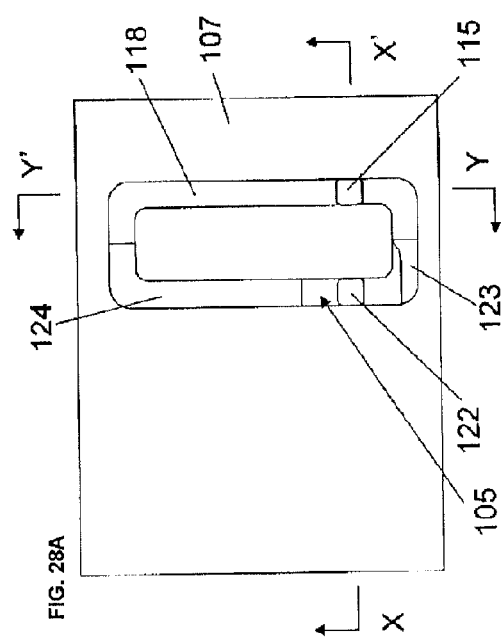
FIG. 28A
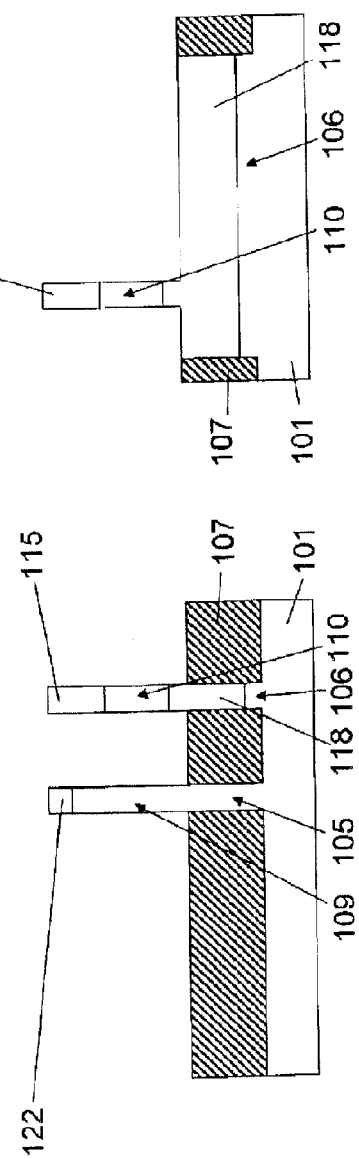
FIG. 28C
FIG. 28B

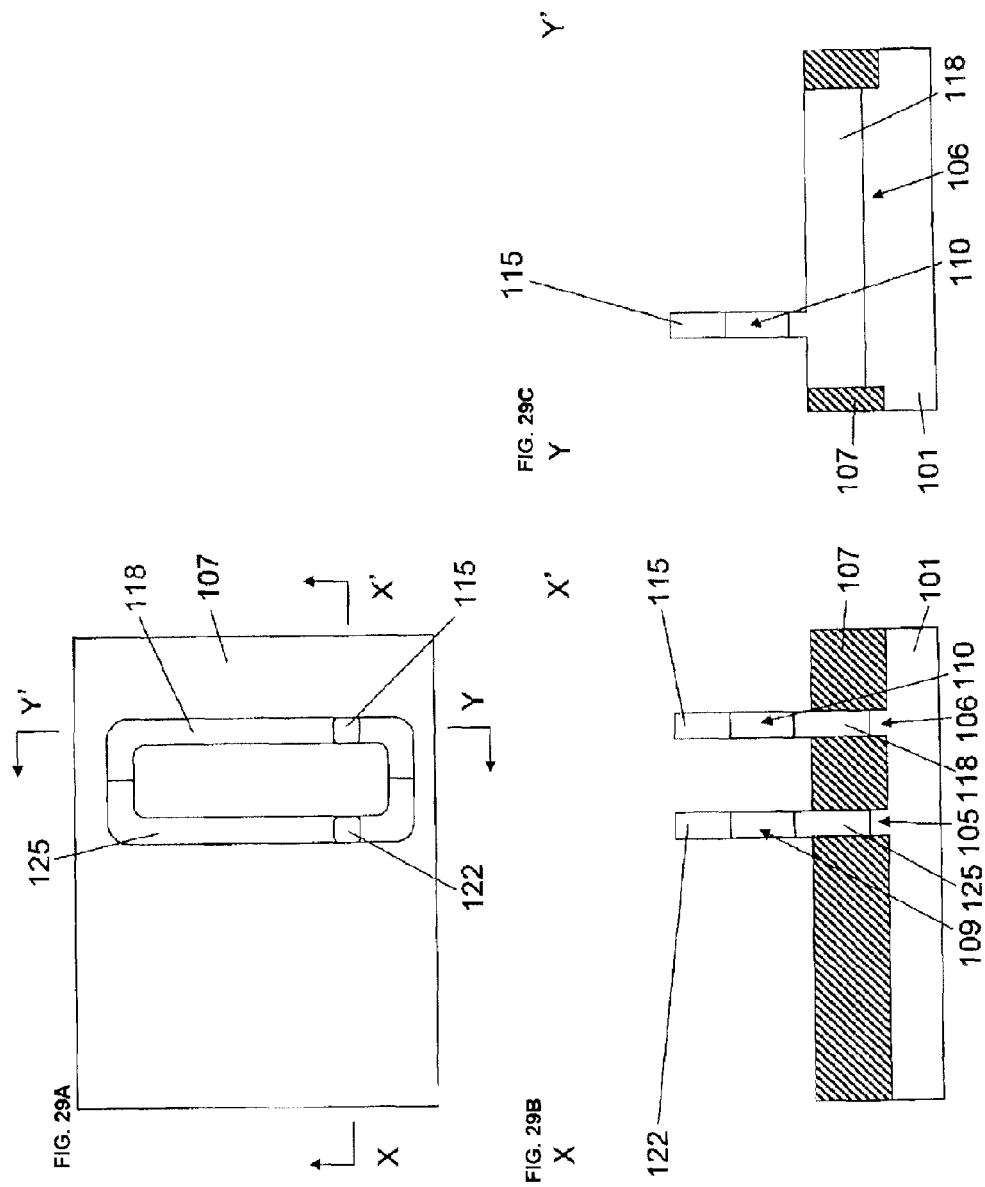

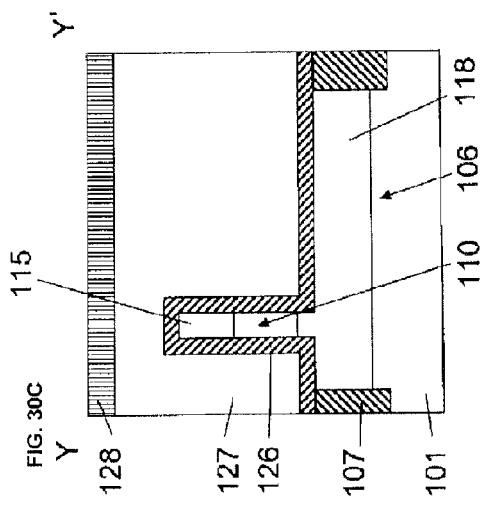
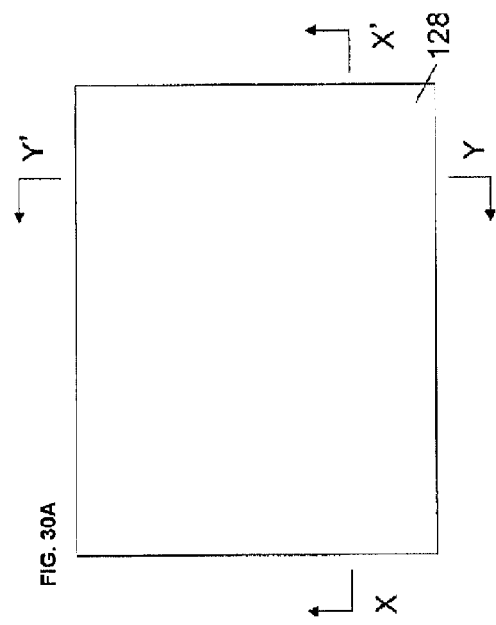
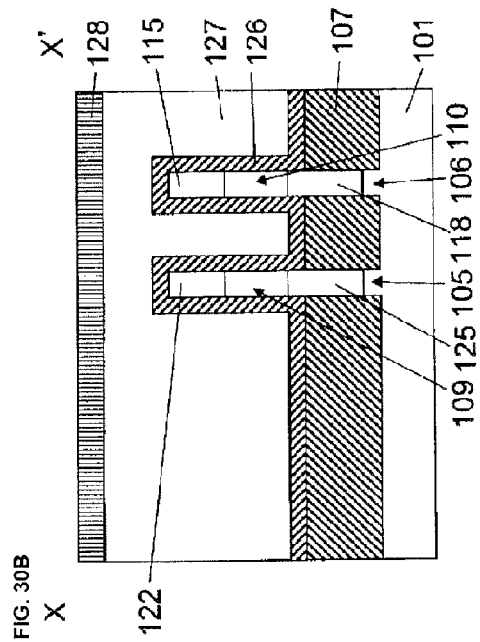

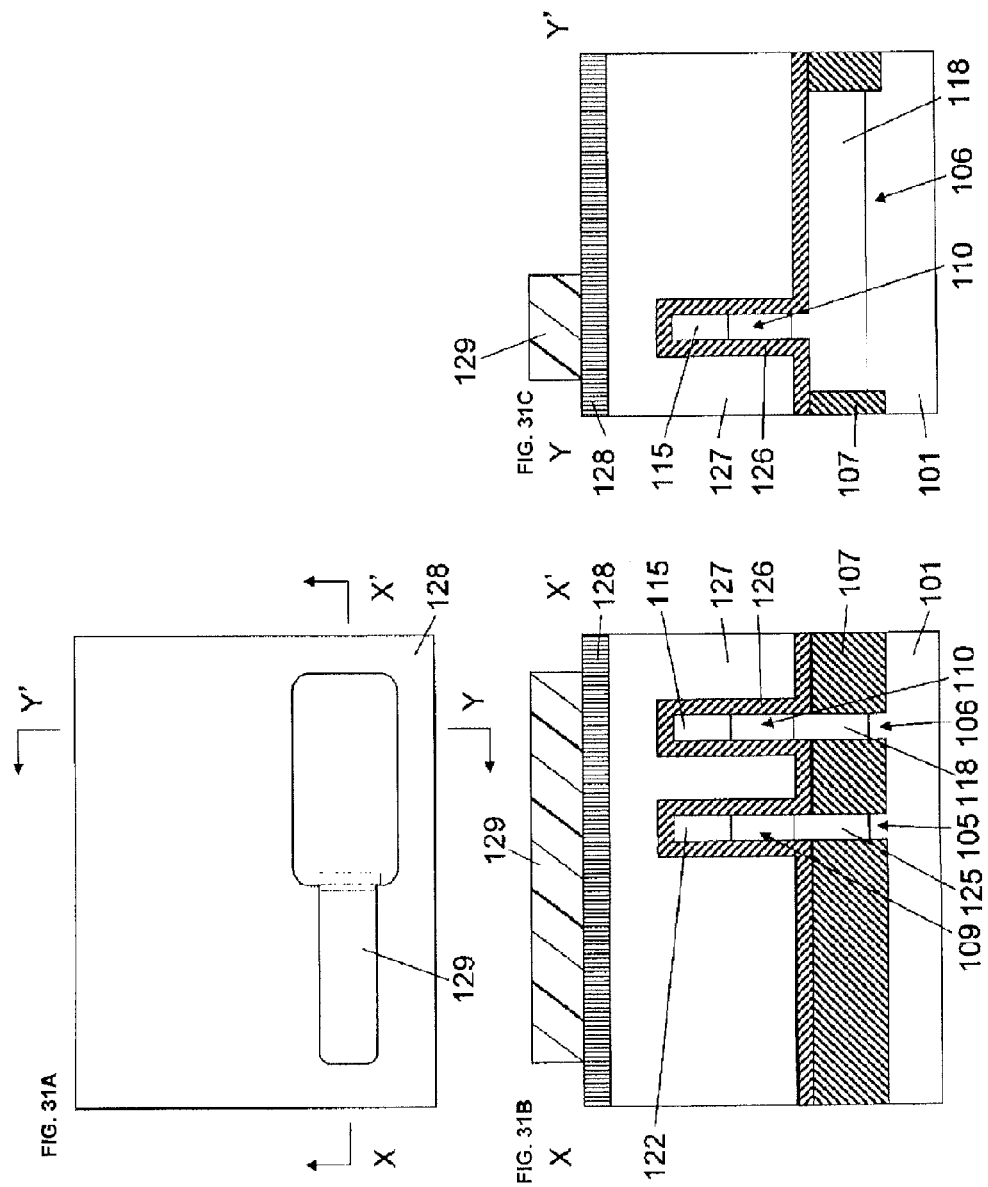

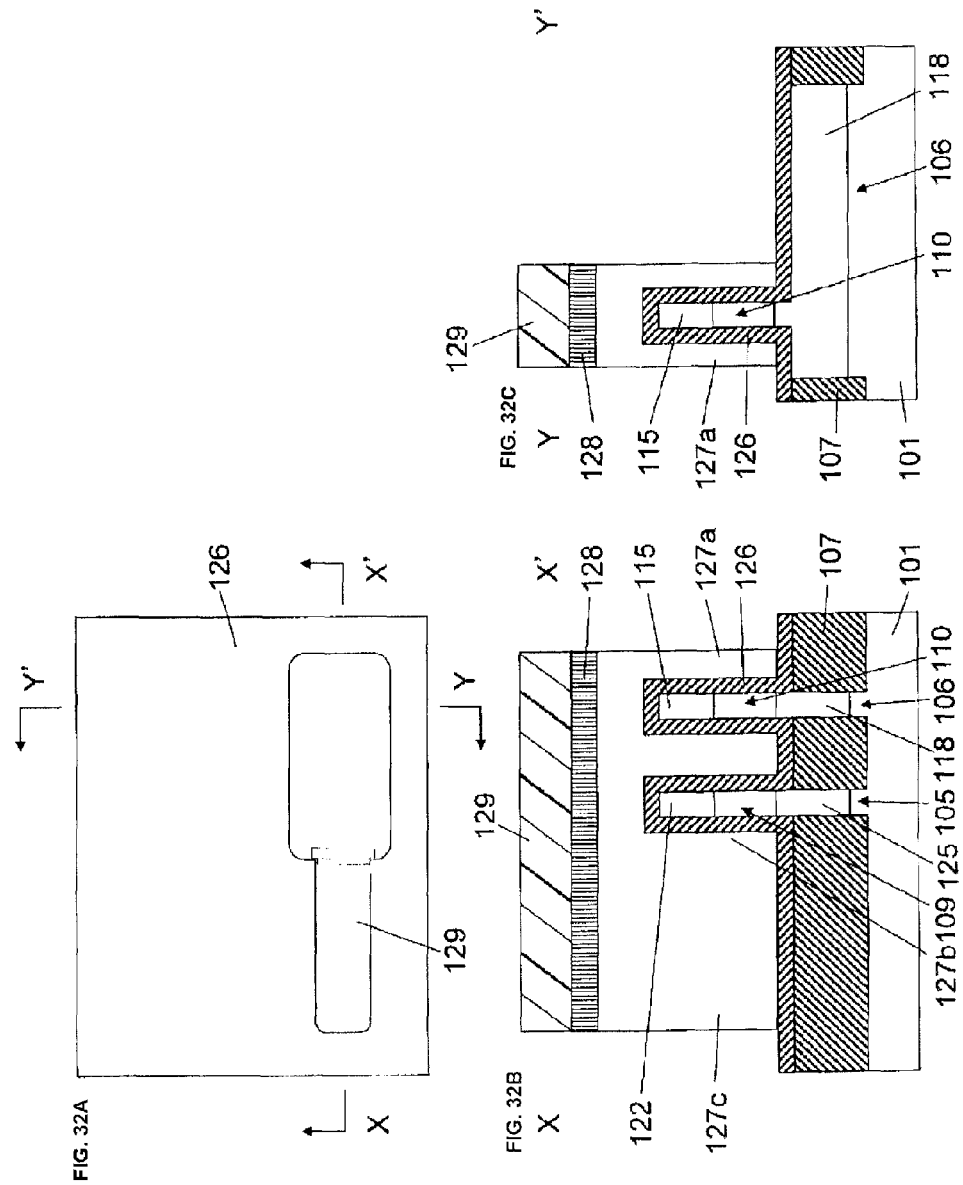

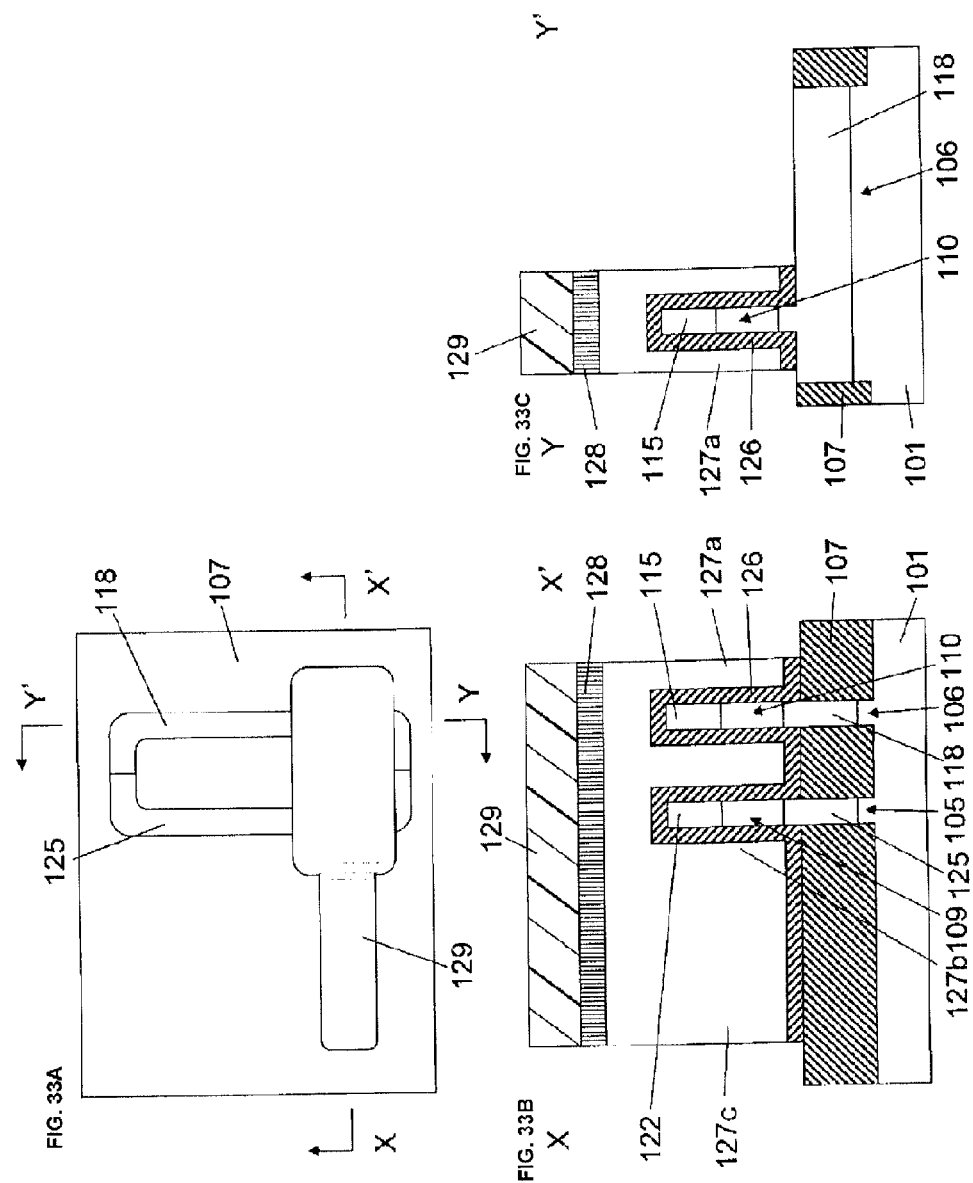

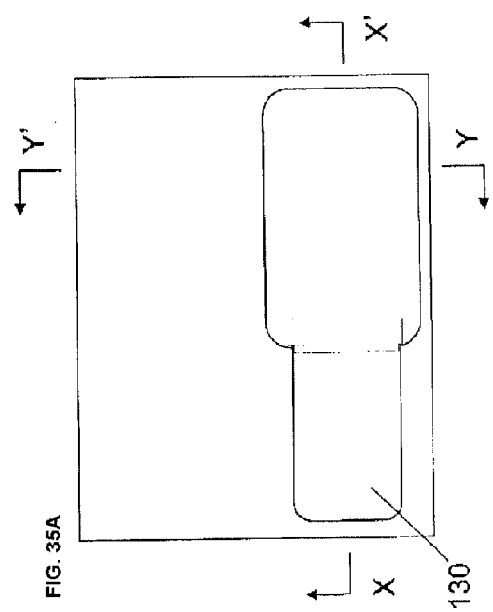
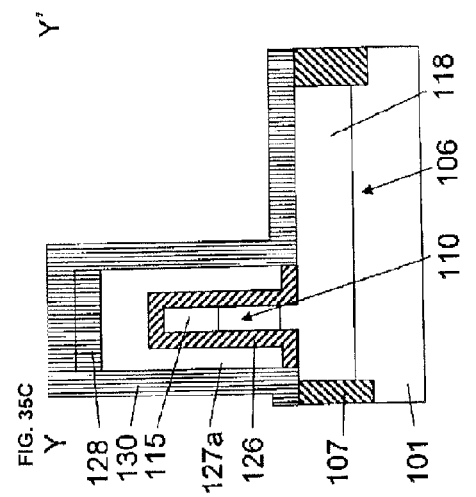
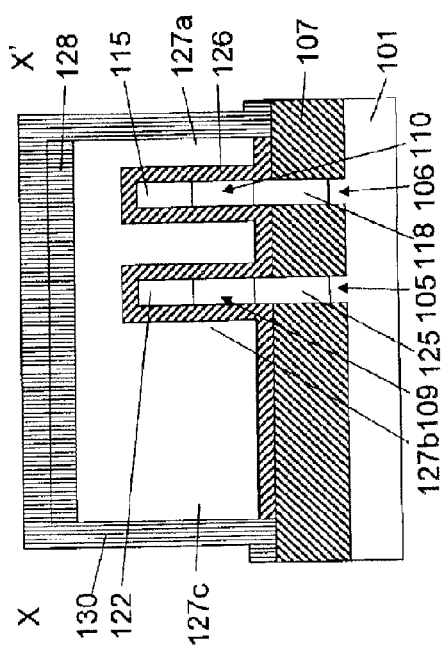

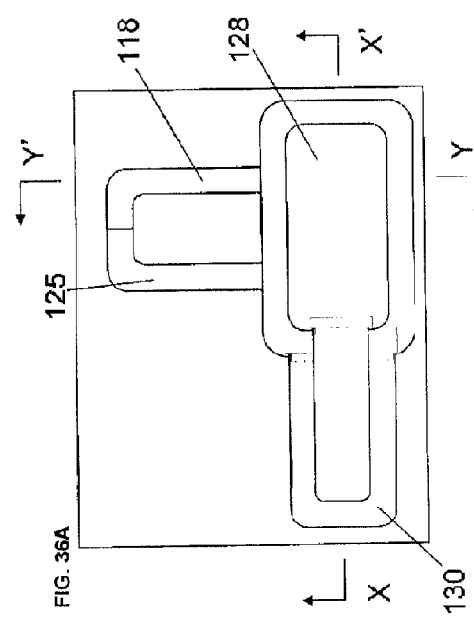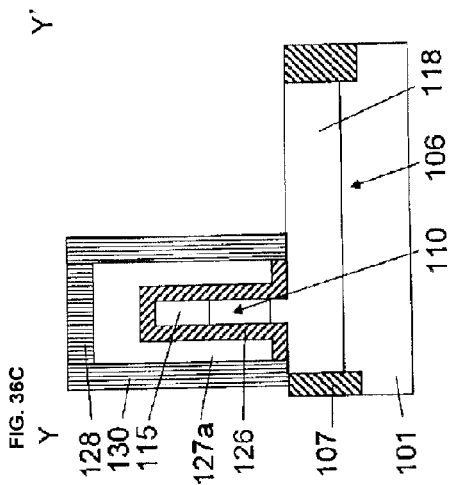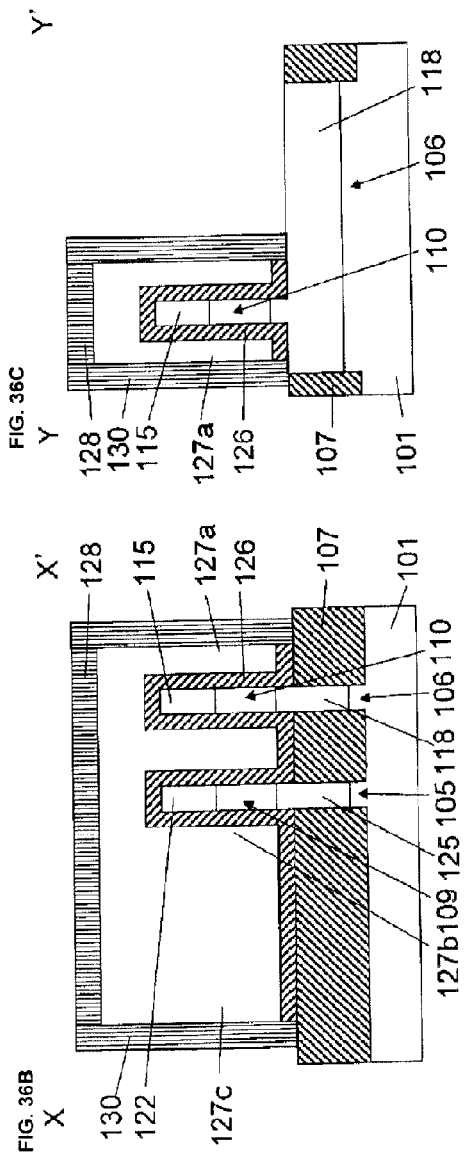

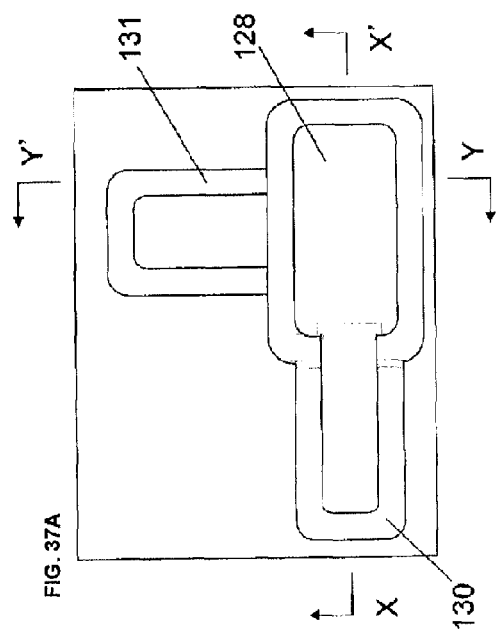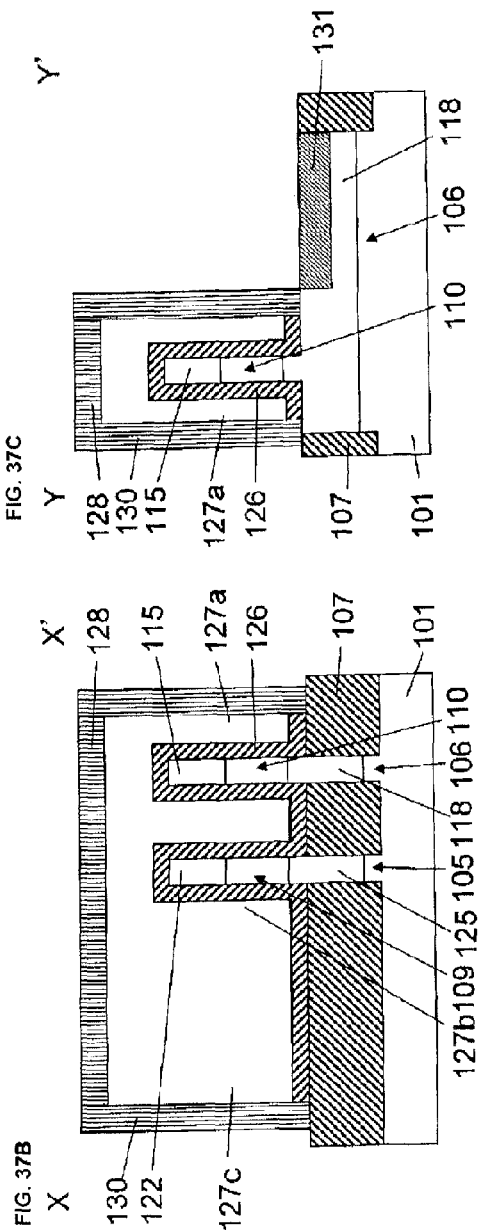

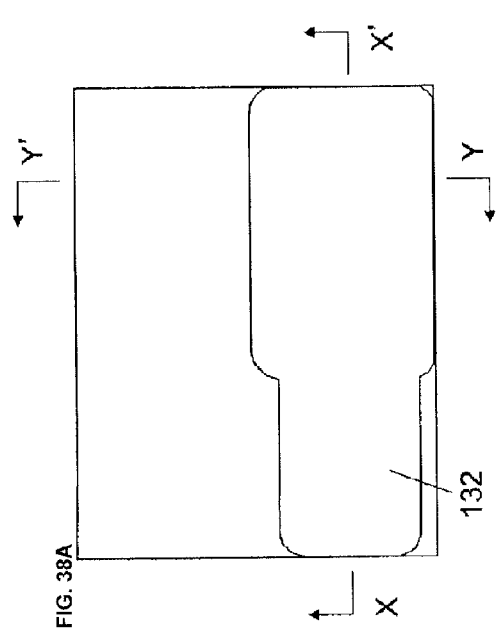
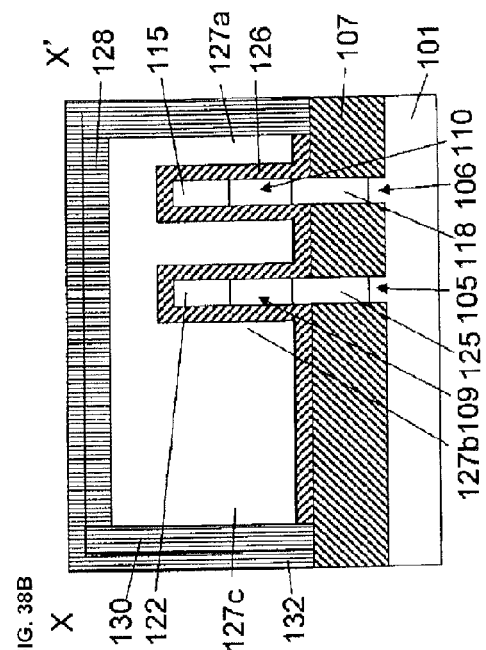
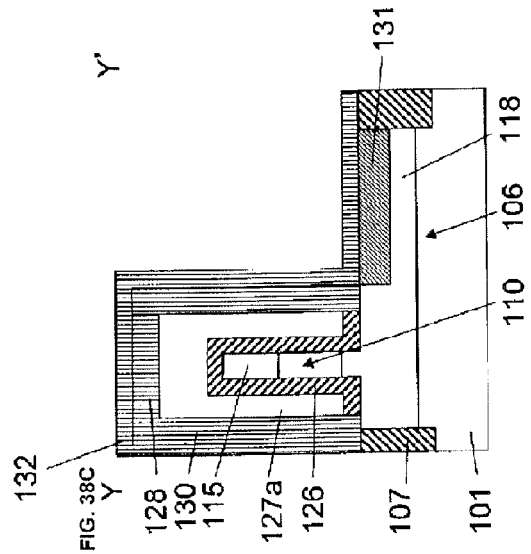
FIG. 38A
FIG. 38B
FIG. 38C

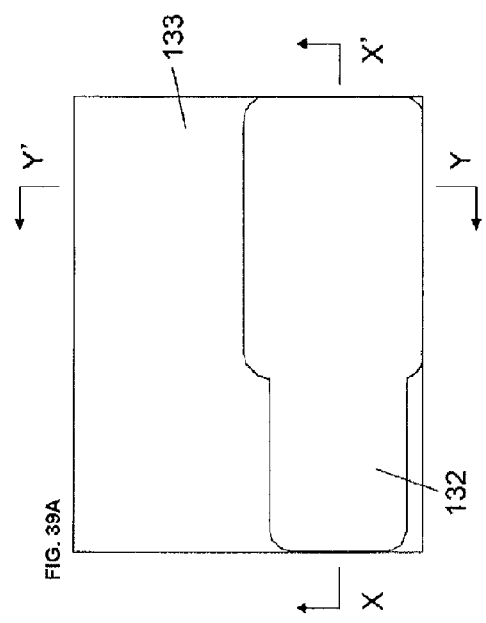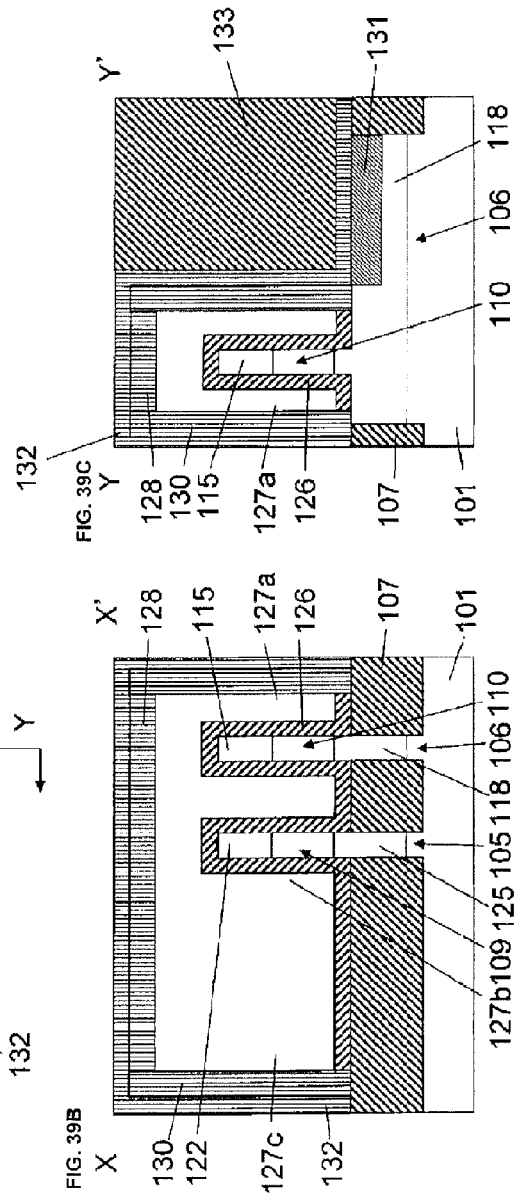

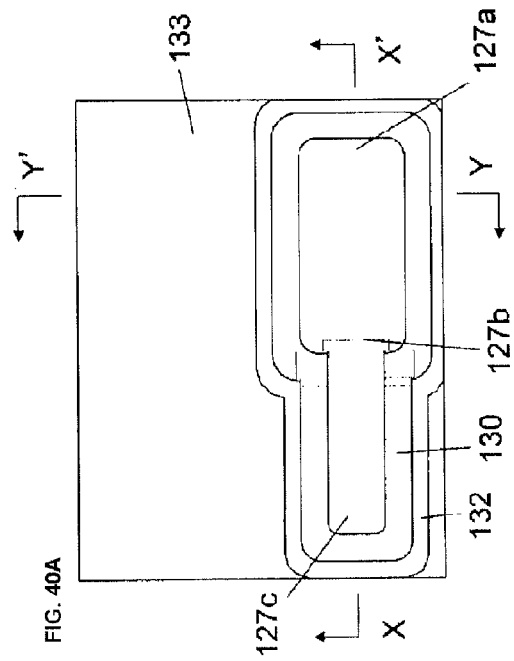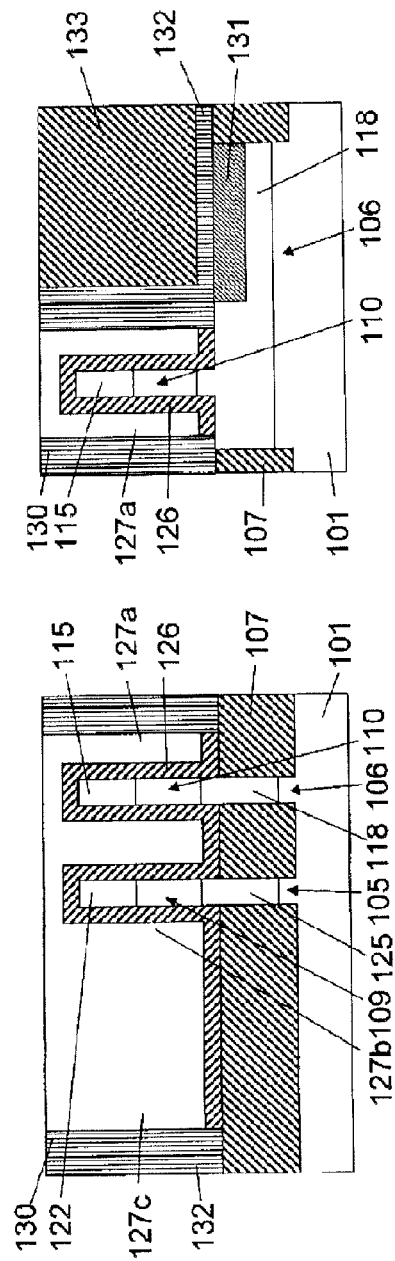

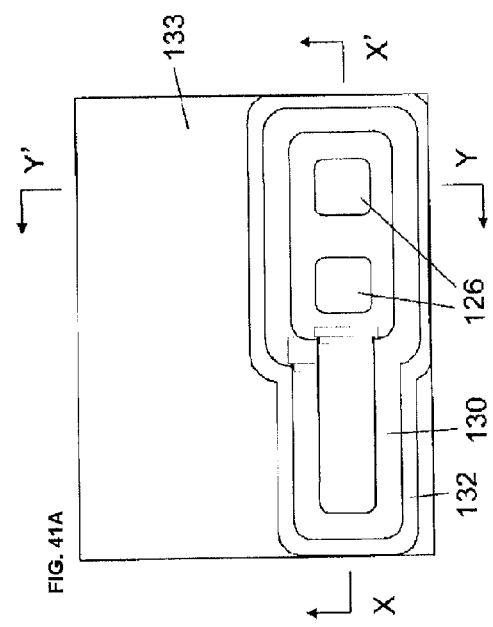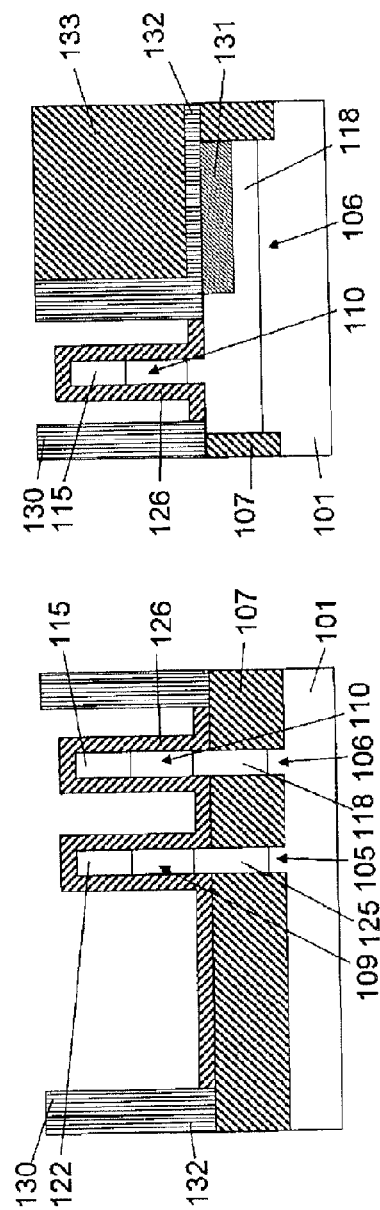

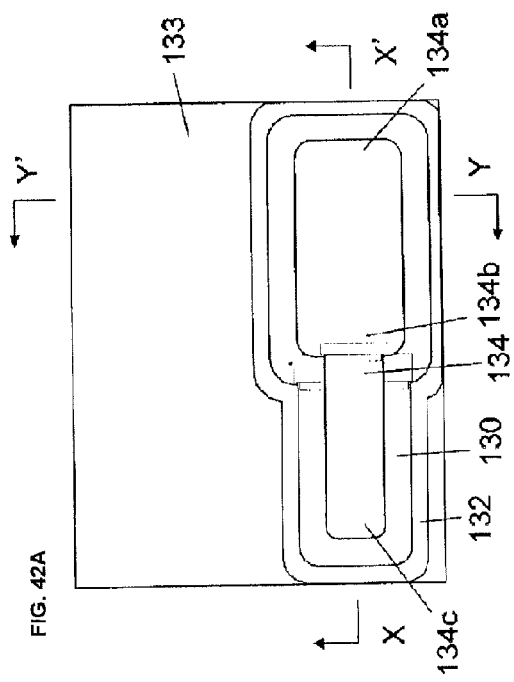
FIG. 42A
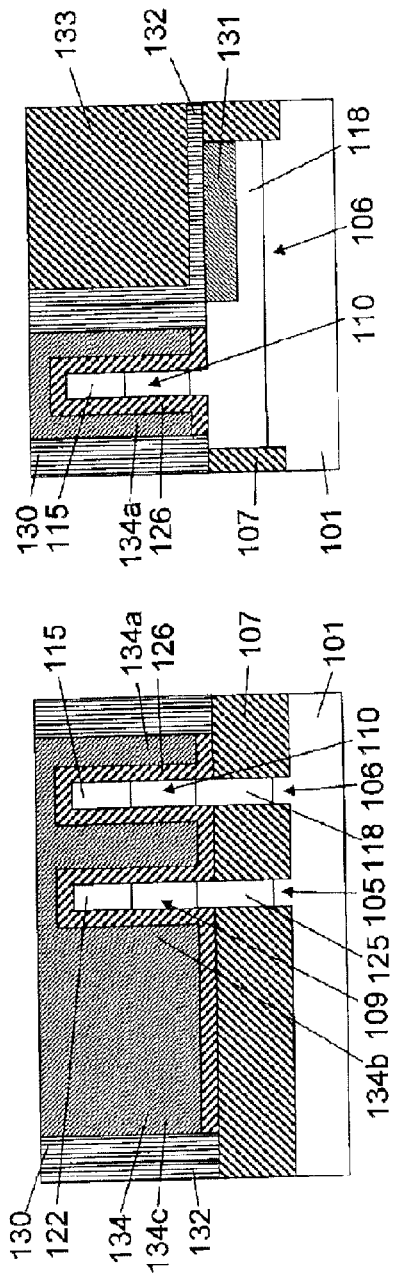
FIG. 42B
FIG. 42C

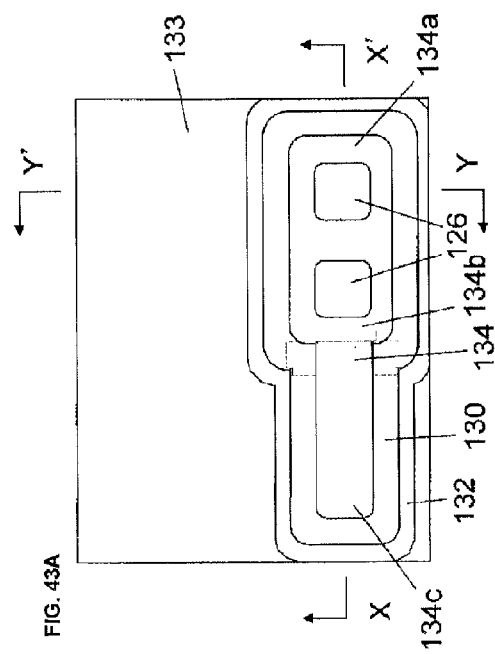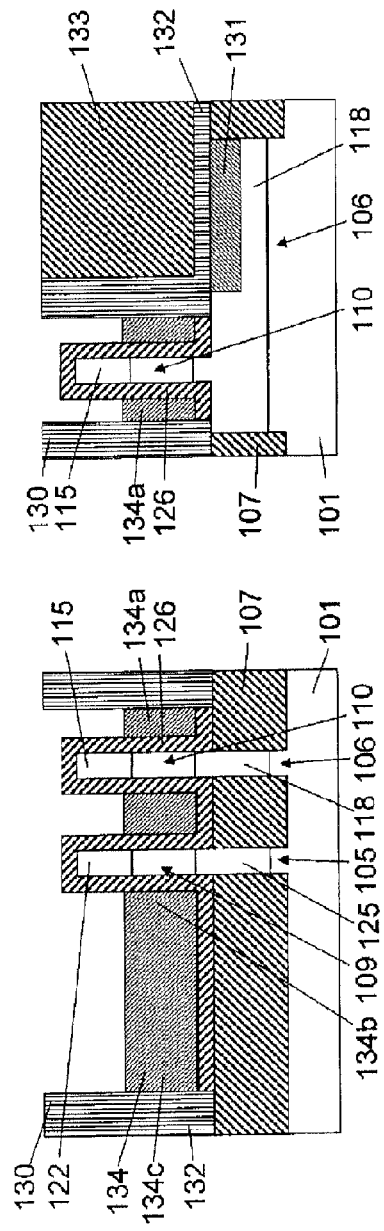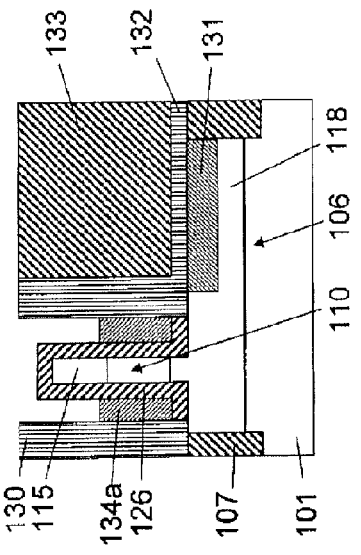

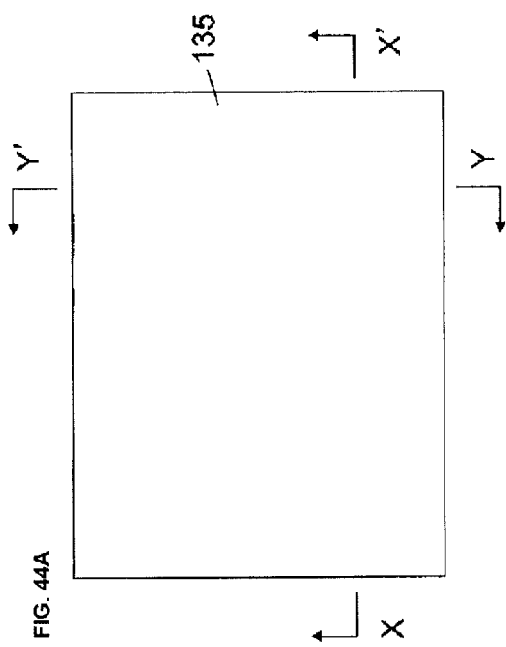
FIG. 44A
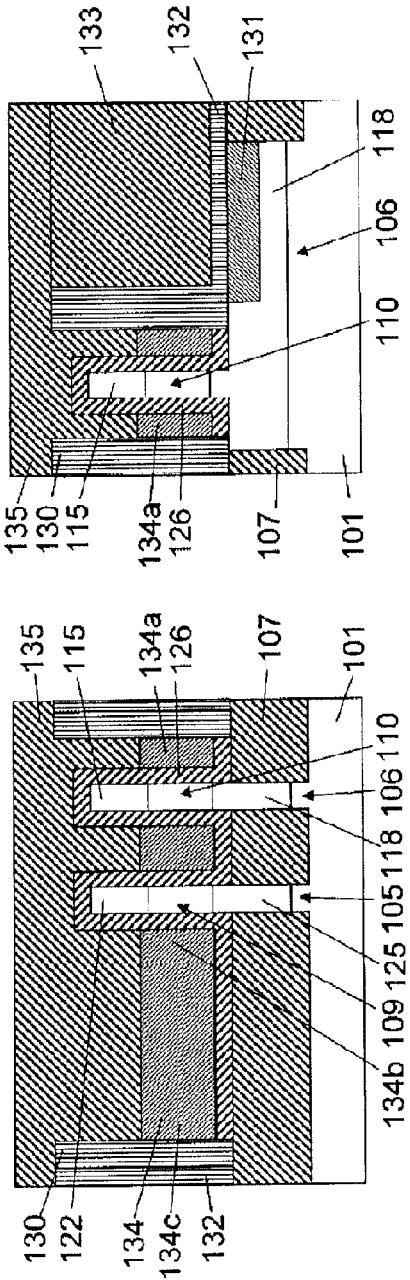
FIG. 44B
FIG. 44C

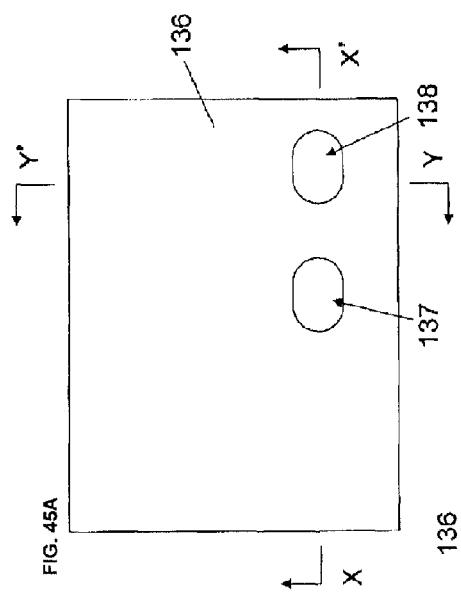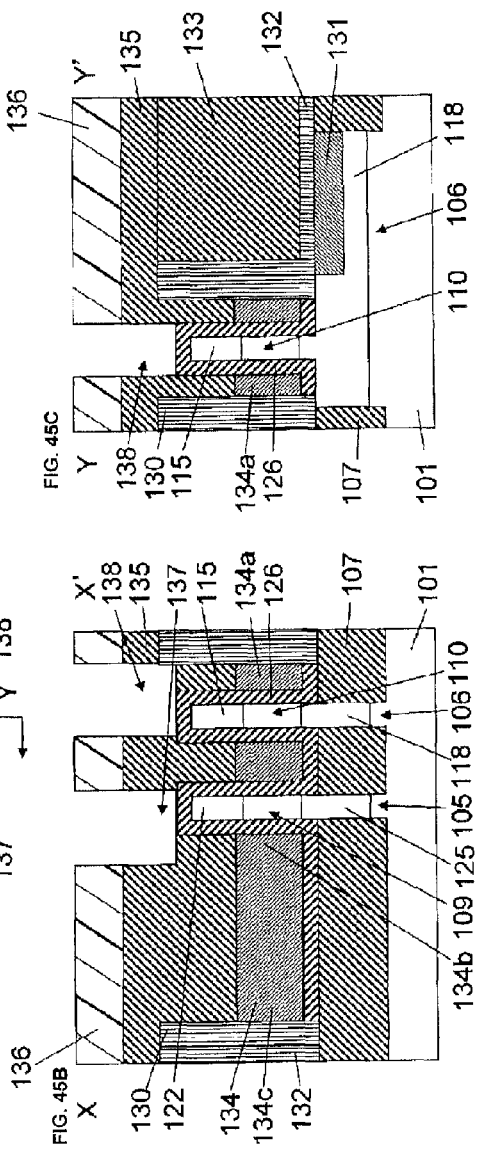

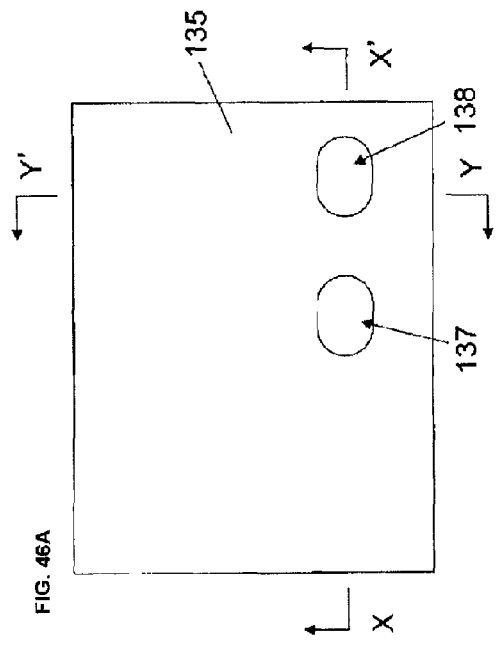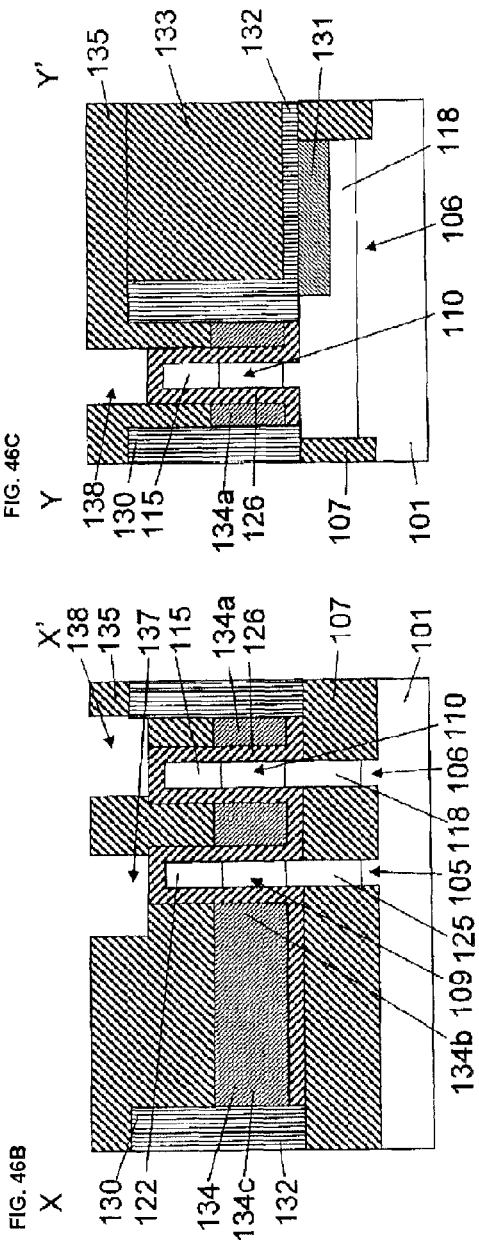

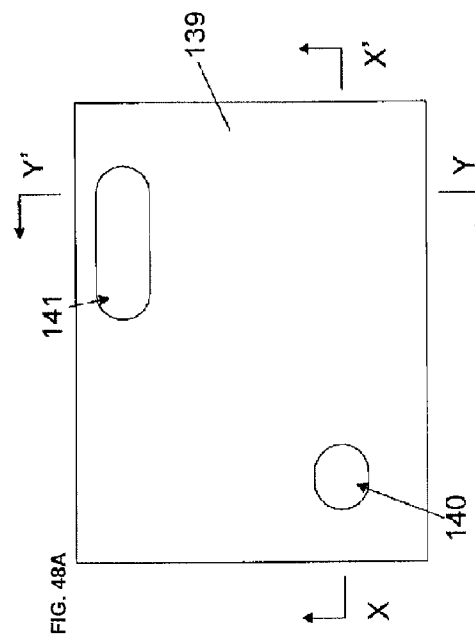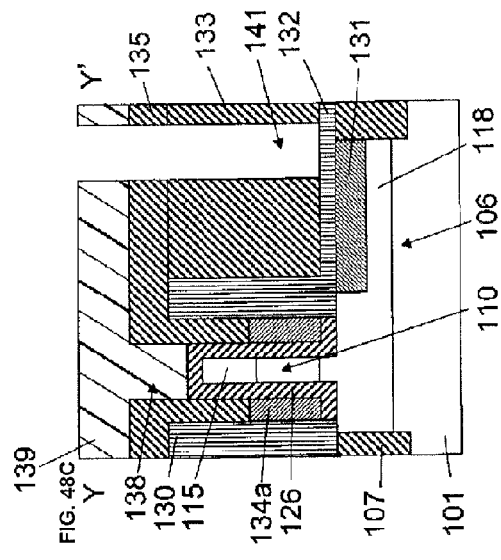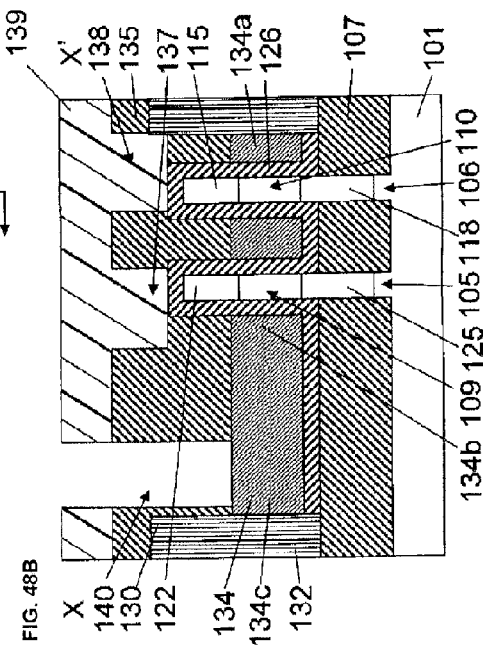

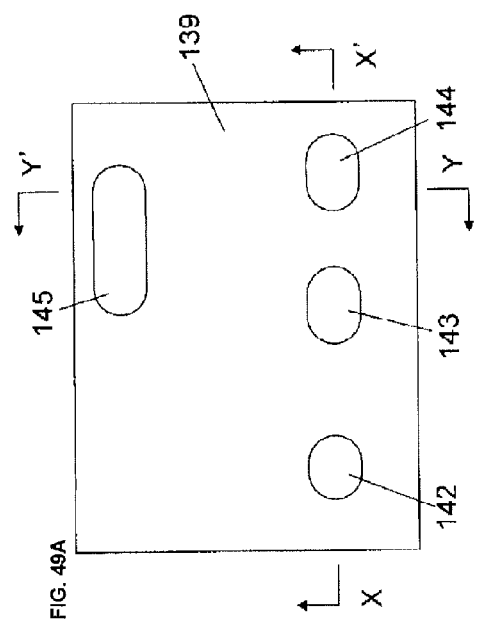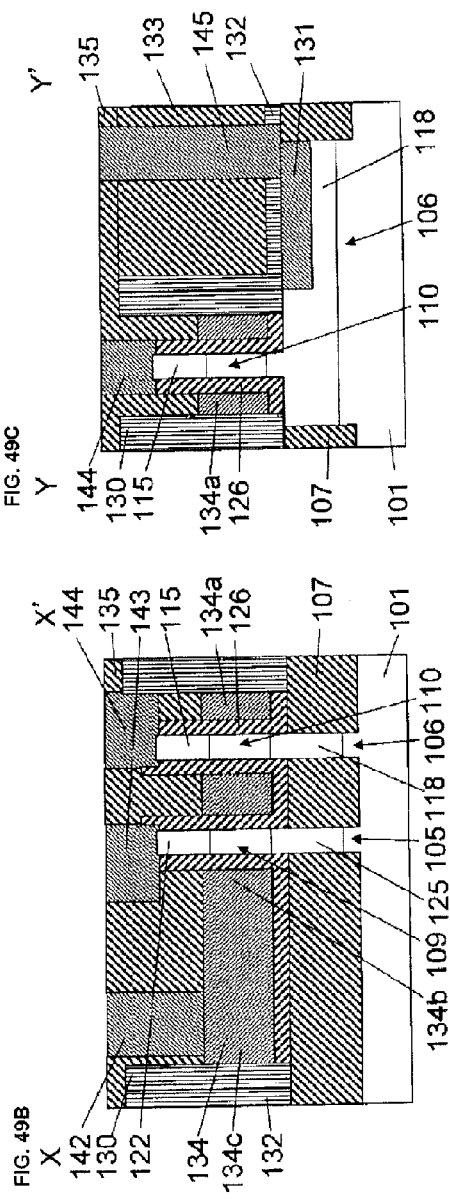

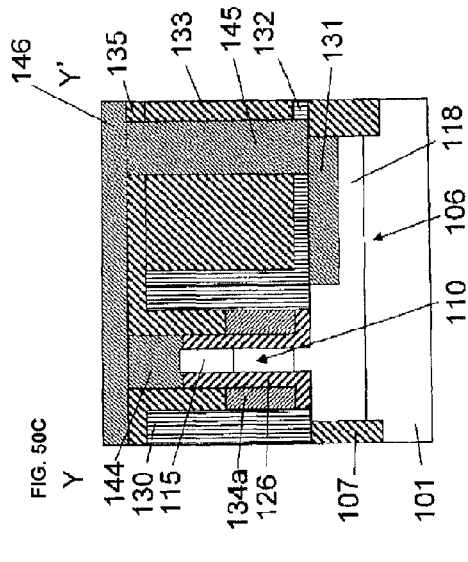
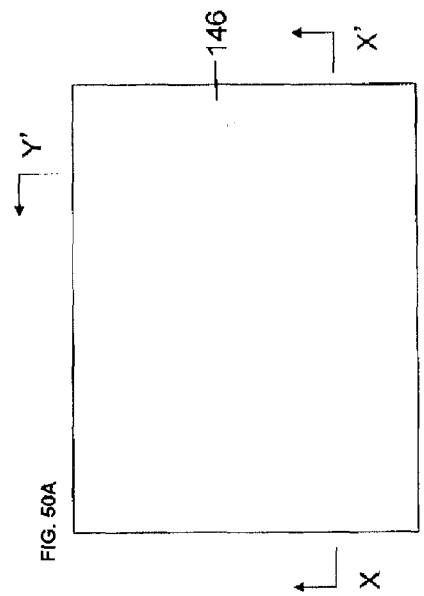
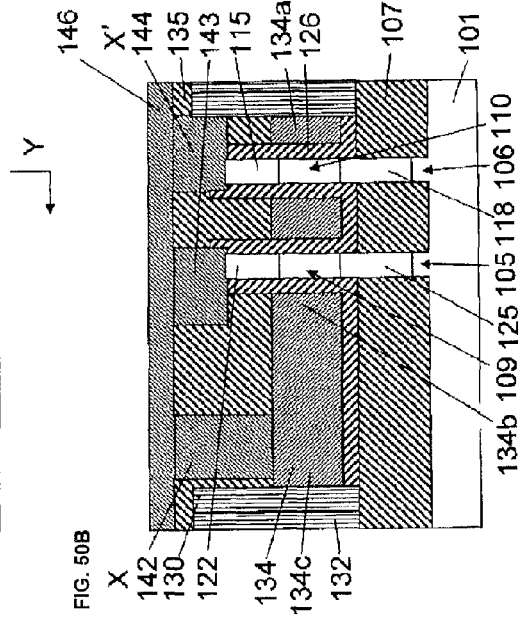

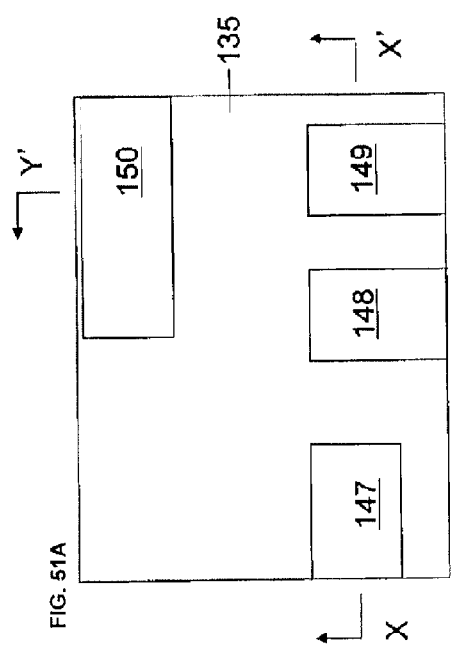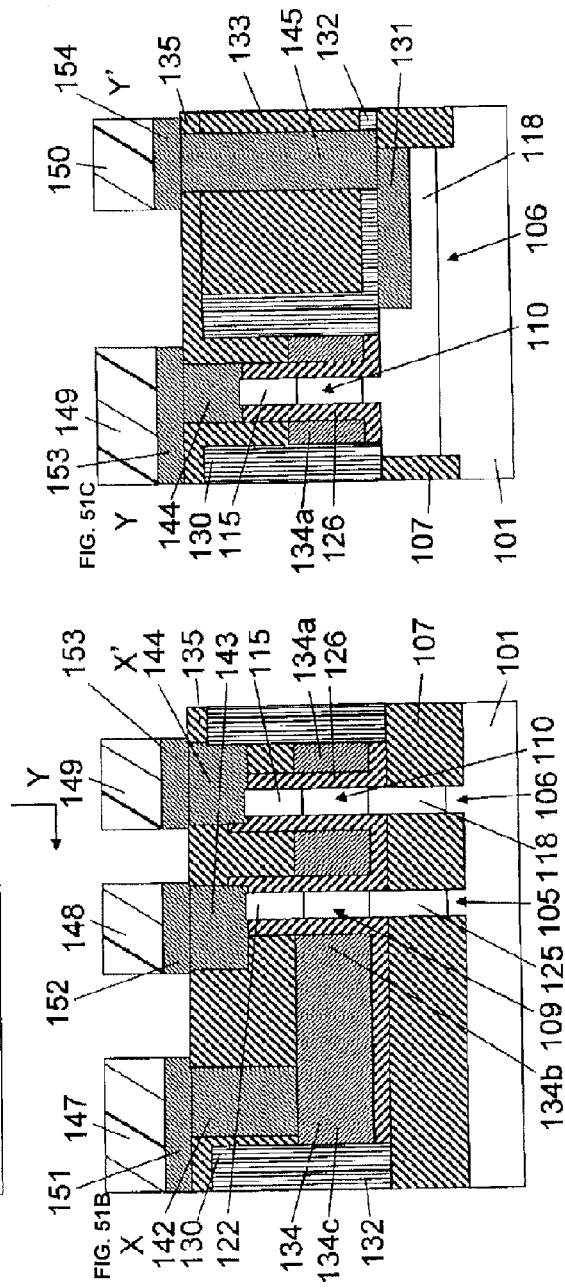

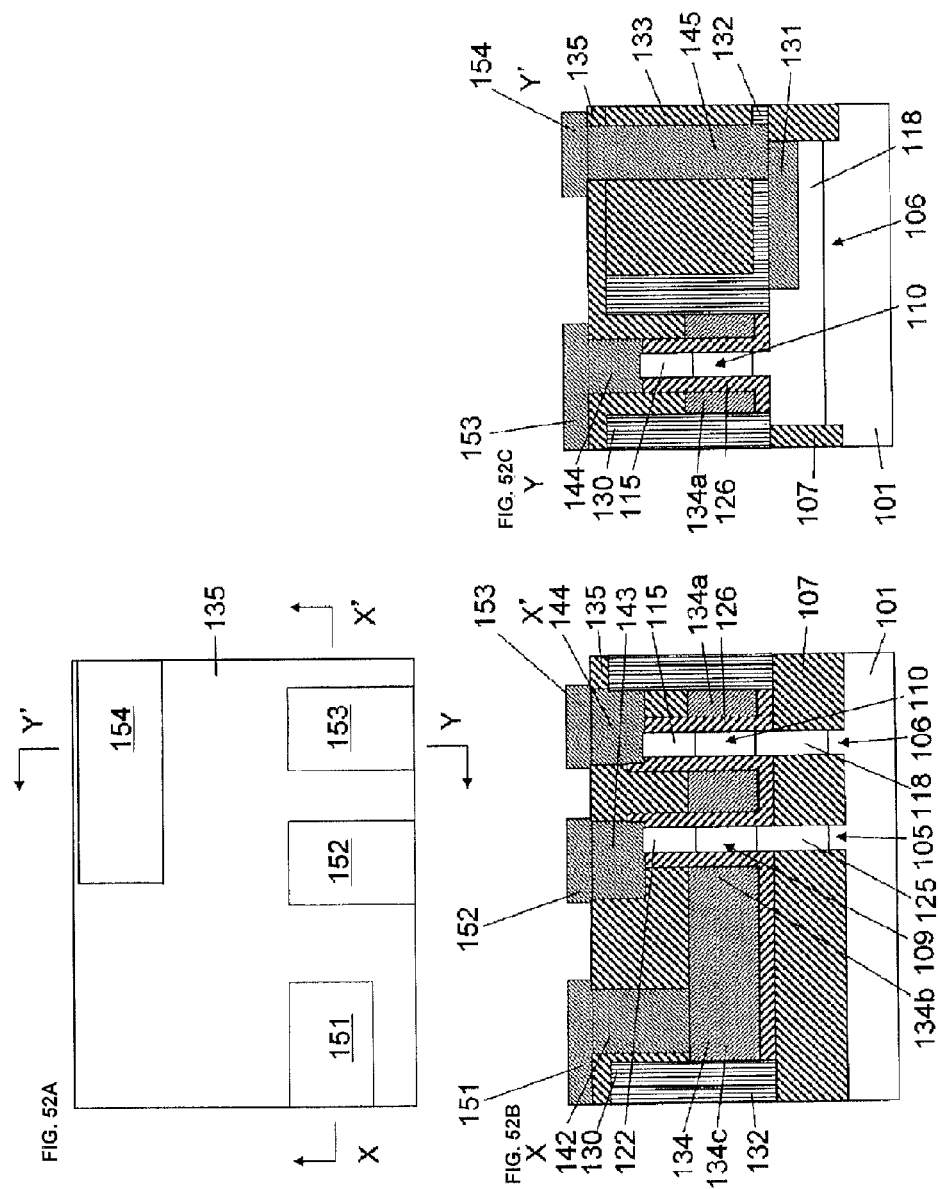

METHOD FOR MANUFACTURING SEMICONDUCTOR DEVICE AND SEMICONDUCTOR DEVICE

RELATED APPLICATIONS

This application is a continuation application of U.S. patent application Ser. No. 14/066,095, filed Oct. 29, 2013, now U.S. Pat. No. 8,916,478, which is a Continuation-In-Part (CIP) application of U.S. patent application Ser. No. 13/693,524, filed Dec. 4, 2012, now U.S. Pat. No. 8,772,175, which pursuant to 35 U.S.C. §119(e), claims the benefit of the filing date of Provisional U.S. Patent Application Ser. No. 61/577,189 filed Dec. 19, 2011. The entire content of which are hereby incorporated by reference.

BACKGROUND OF THE INVENTION

1. Technical Field

The present invention relates to a method for manufacturing a semiconductor device and to a semiconductor device.

2. Description of the Related Art

Semiconductor integrated circuits, particularly integrated circuits using MOS transistors, are increasing in integration. With increases in integration, MOS transistors used in the integrated circuits are increasingly made finer up to a nano region. Finer MOS transistors have the problem of difficulty in suppressing leak currents and difficulty in decreasing the areas occupied by circuits because of the demand for securing necessary amounts of currents. In order to resolve the problem, there have been proposed surrounding gate transistors (SGT) having a structure in which a source, a gate, and a drain are disposed in a direction vertical to a substrate, and the gate surrounds a pillar-shaped semiconductor layer (for example, Japanese Unexamined Patent Application Publication Nos. 2-71556, 2-188966, and 3-145761).

By using a metal for a gate electrode instead of using polysilicon, depletion can be suppressed, and the resistance of the gate electrode can be decreased. However, a manufacturing process after a metal gate is formed must be one in which metal contamination by the metal gate is always taken into consideration.

In addition, in order to satisfy both a metal gate process and a high-temperature process for usual MOS transistors, a metal gate last process is used for actual products, in which a metal gate is formed after a high-temperature process (IEDM 2007 K. Mistry, et. al., pp. 247-250). The gate is formed using polysilicon, and then an interlayer insulating film is deposited. Then, the polysilicon gate is exposed by chemical mechanical polishing and etched, followed by deposition of a metal. Therefore, in order to satisfy both the metal gate process and the high-temperature process, the metal gate last process must be used for SGT, in which a metal gate is formed after the high-temperature process. Since, in the SGT, the top position of the pillar-shaped silicon layer is higher than the gate, some consideration is required for using the metal gate last process.

In addition, usual MOS transistors use a first insulating film in order to decrease a parasitic capacitance between gate line and a substrate. For example, in FINFET (IEDM 2010 CC. Wu, et. al., 27.1.1-27.1.4.), a first insulating film is formed around a fin-shaped semiconductor layer and then etched back to expose the fin-shaped semiconductor layer, thereby decreasing the parasitic capacitance between the gate line and the substrate. Also, in SGT, the first insulating film must be used for decreasing the parasitic capacitance between the gate line and the substrate. The SGT includes the pillar-shaped semiconductor layer in addition to the fin-shaped semiconductor layer, and thus some consideration is required for forming the pillar-shaped semiconductor layer.

On the other hand, FIN FET has been known, in which two transistors are formed from one dummy pattern (for example, Japanese Unexamined Patent Application Publication No. 2011-71235). A sidewall is formed around the dummy pattern and used as a mask for etching a substrate to form a fin, thereby forming two transistors from one dummy pattern.

Since the two transistors are formed, one of the transistors can be used as an nMOS transistor and the other one can be used a pMOS transistor.

SUMMARY OF THE INVENTION

Accordingly, an object is to decrease a parasitic capacitance between a gate line and a substrate, provide a CMOS SGT manufacturing method for forming nMOS SGT and pMOS SGT from one dummy pattern using a gate last process, and provide a resulting SGT structure.

Solution to Problem

A method for manufacturing a semiconductor device of the present invention includes: a first step of forming a first fin-shaped silicon layer and a second fin-shaped silicon layer on a substrate so that the first fin-shaped silicon layer and the second fin-shaped silicon layer are connected to each other at the ends thereof to form a closed loop, forming a first insulating film around the first fin-shaped silicon layer and the second fin-shaped silicon layer, forming a first pillar-shaped silicon layer on the first fin-shaped silicon layer, and forming a second pillar-shaped silicon layer on the second fin-shaped silicon layer, the width of the first pillar-shaped silicon layer being equal to the width of the first fin-shaped silicon layer and the width of the second pillar-shaped silicon layer being equal to the width of the second fin-shaped silicon layer; a second step of, after the first step, forming n-type diffusion layers by implanting impurities in an upper portion of the first pillar-shaped silicon layer, an upper portion of the first fin-shaped silicon layer, and a lower portion of the first pillar-shaped silicon layer and forming p-type diffusion layers by implanting impurities in an upper portion of the second pillar-shaped silicon layer, an upper portion of the second fin-shaped silicon layer, and a lower portion of the second pillar-shaped silicon layer; a third step of, after the second step, forming a gate insulating film, a first polysilicon gate electrode, a second polysilicon gate electrode, and a polysilicon gate line so that the gate insulating film covers the peripheries and the tops of the first pillar-shaped silicon layer and the second pillar-shaped silicon layer, the first polysilicon gate electrode and the second polysilicon gate electrode cover the gate insulating film, and after the first polysilicon gate electrode, the second polysilicon gate electrode, and the polysilicon gate line are formed, the top position of polysilicon is higher than the gate insulating film on the n-type diffusion layer formed in the upper portion of the first pillar-shaped silicon layer and higher than the gate insulating film on the p-type diffusion layer formed in the upper portion of the second pillar-shaped silicon layer; a fourth step of, after the third step, forming a silicide in an upper portion of the n-type diffusion layer in the upper portion of the first fin-shaped silicon layer and in an upper portion of the p-type diffusion layer in the upper portion of the second fin-shaped silicon layer; a fifth step of, after the fourth step, depositing an interlayer insulating film, exposing the first polysilicon gate electrode, the second polysilicon gate electrode, and the polysilicon gate line, etching the first polysilicon gate electrode, the second polysilicon gate electrode, and the polysilicon gate line, and then depositing a metal to form a first metal gate electrode, a second metal gate electrode, and a metal gate line, the metal gate line being connected to the first metal gate electrode and the second metal gate electrode and extending in a direction perpendicular to the first fin-shaped silicon layer and the second fin-shaped silicon layer; and a sixth step of, after the fifth step, forming a first contact and a second contact so that the first contact is in direct contact with the n-type diffusion layer in the upper portion of the first pillar-shaped silicon layer and the second contact is in direct contact with the p-type diffusion layer in the upper portion of the second pillar-shaped silicon layer.

The manufacturing method is also characterized in that in the first step, a second oxide film is deposited for forming a dummy pattern on the substrate, a first resist is formed for forming the dummy pattern, the second oxide film is etched to form the dummy pattern, the first resist is removed, a first nitride film is deposited and then etched to be left as a sidewall and to form a first nitride film sidewall around the dummy pattern, the dummy pattern is removed, the silicon substrate is etched using the first nitride film sidewall as a mask to form the first fin-shaped silicon layer and the second fin-shaped silicon layer which are connected to each other at the ends to form a closed loop, the first insulating film is formed around the first fin-shaped silicon layer and the second fin-shaped silicon layer, the first nitride film sidewall is removed, the first insulating film is etched back to expose upper portions of the first fin-shaped silicon layer and the second fin-shaped silicon layer, a second resist is formed to be perpendicular to the first fin-shaped silicon layer and the second fin-shaped silicon layer, the first fin-shaped silicon layer and the second fin-shaped silicon layer are etched, and the second resist is removed to form the first pillar-shaped silicon layer so that a portion where the first fin-shaped silicon layer and the second resist intersect at right angles becomes the first pillar-shaped silicon layer and form the second pillar-shaped silicon layer so that a portion where the second fin-shaped silicon layer and the second resist intersect at right angles becomes the second pillar-shaped silicon layer.

The manufacturing method is further characterized in that in the second step after the first step, in the whole structure after the first step, a third oxide film is deposited, a second nitride film is formed and then etched to be left as a sidewall, a third resist is formed for forming the n-type diffusion layers, impurities are implanted to form the n-type diffusion layers in an upper portion of the first pillar-shaped silicon layer and an upper portion of the first fin-shaped silicon layer, the third resist is removed, the second nitride film and the third oxide film are removed, heat treatment is performed, a fourth oxide film is deposited, a third nitride film is formed and then etched to be left as a sidewall, a fourth resist is formed for forming the p-type diffusion layers, impurities are implanted to form the p-type diffusion layers in an upper portion of the second pillar-shaped silicon layer and an upper portion of the second fin-shaped silicon layer, the fourth resist is removed, the fourth oxide film and the third nitride film are removed, and heat treatment is performed.

The manufacturing method is further characterized in that in the third step after the second step, the gate insulating film is formed to surround the pillar-shaped silicon layers, polysilicon is deposited and then planarized so that after planarization, the top surface of the polysilicon is higher than the gate insulating film on the n-type diffusion layer formed in the upper portion of the first pillar-shaped silicon layer and higher than the gate insulating film on the p-type diffusion layer formed in the upper portion of the second pillar-shaped silicon layer, a fourth nitride film is deposited, a fifth resist is formed for forming the first polysilicon gate electrode, the second polysilicon gate electrode, and the polysilicon gate line, the fourth nitride film is etched, the polysilicon is etched to form the first polysilicon gate electrode, the second polysilicon gate electrode, and the polysilicon gate line, the gate insulating films are etched, and the fifth resist is removed.

The manufacturing method is further characterized in that in the fourth step, in the whole structure after the third step, a fifth nitride film is deposited and then etched to be left as a sidewall, and a metal is deposited to form silicides in upper portions of the n-type diffusion layer and the p-type diffusion layer in the upper portions of the first fin-shaped silicon layer and the second fin-shaped silicon layer, respectively.

The manufacturing method is further characterized in that in the fifth step, in the whole structure after the fourth step, a sixth nitride film is deposited, the interlayer insulating film is deposited and then planarized by chemical mechanical polishing, the first polysilicon gate electrode, the second polysilicon gate electrode, and the polysilicon gate line are exposed by chemical mechanical polishing, the first polysilicon gate electrode, the second polysilicon gate electrode, and the polysilicon gate line are etched, a metal is deposited to be filled in portions from which the first polysilicon gate electrode, the second polysilicon gate electrode, and the polysilicon gate line have been removed, and the metal is etched to expose the gate insulating film on the n-type diffusion layer in the upper portion of the first pillar-shaped silicon layer and expose the gate insulating film on the p-type diffusion layer in the upper portion of the second pillar-shaped silicon layer, thereby forming the first metal gate electrode, the second metal gate electrode, and the metal gate line.

A semiconductor device according to an embodiment includes a first fin-shaped semiconductor layer on a substrate and a second fin-shaped semiconductor layer on the substrate, where the first fin-shaped semiconductor layer and the second fin-shaped semiconductor layer correspond to the dimensions of a sidewall pattern around a dummy pattern. A first insulating film resides around the first fin-shaped semiconductor layer and the second fin-shaped semiconductor layer. A first pillar-shaped semiconductor layer resides on the first fin-shaped semiconductor layer and a second pillar-shaped semiconductor layer resides on the second fin-shaped semiconductor layer. An n-type diffusion layer is in an upper portion of the first fin-shaped semiconductor layer and a lower portion of the first pillar-shaped semiconductor layer. An n-type diffusion layer is in an upper portion of the first pillar-shaped semiconductor layer. A p-type diffusion layer is in an upper portion of the second fin-shaped semiconductor layer and a lower portion of the second pillar-shaped semiconductor layer. A p-type diffusion layer is in an upper portion of the second pillar-shaped semiconductor layer. A first gate insulating film resides around the first pillar-shaped semiconductor layer, a first metal gate electrode resides around the gate insulating film. A second gate insulating film resides around the second pillar-shaped semiconductor layer and a second metal gate electrode resides around the gate insulating film. A metal gate line is connected to the first metal gate electrode and the second metal gate electrode and extends in a direction perpendicular to the first fin-shaped semiconductor layer and the second fin-shaped semiconductor layer.

According to the present invention, it is possible to decrease a parasitic capacitance between a gate line and a substrate, provide a CMOS SGT manufacturing method for forming nMOS SGT and pMOS SGT from one dummy pattern using a gate last process, and provide a resulting SGT structure. The manufacturing method is based on a conventional FINFET manufacturing method in which a sidewall is formed around a dummy pattern and used as a mask for etching a substrate to form a fin, thereby forming two transistors from one dummy pattern, and thus two SGTs can be easily formed from one dummy pattern.

Since the two SGTs including one serving as nMOS SGT and the other one serving as pMOS SGT are formed, one CMOS SGT can be formed from one dummy pattern, and thus CMOS SGT with high integration can be provided.

In addition, a silicide is generally formed in an upper portion of a pillar-shaped silicon layer, but a silicide must be formed after a polysilicon gate is formed because the deposition temperature of polysilicon is higher than the silicide formation temperature. Therefore, when the silicide is formed in an upper portion of a silicon column, a hole is formed on a polysilicon gate electrode after the polysilicon gate is formed, the silicide is formed after a sidewall composed of an insulating film is formed on the sidewall of the hole, and then the hole is filled with an insulating film, thereby causing the problem of increasing the number of manufacturing steps. Therefore, the diffusion layers are formed before the polysilicon gate electrode and the polysilicon gate line are formed, the pillar-shaped silicon layer is covered with the polysilicon gate electrode, and the silicide is formed only in an upper portion of the fin-shaped silicon layer. Therefore, a usual metal gate last manufacturing method can be used, in which a gate is formed using polysilicon, the interlayer insulating film is deposited, the polysilicon gate is exposed by chemical mechanical polishing and then etched, and then a metal is deposited, thereby facilitating the formation of metal gate CMOS SGT.

BRIEF DESCRIPTION OF THE DRAWING

FIG. 1A is a plan view of a semiconductor device according to the present invention, FIG. 1B is a sectional view taken along line X-X' in FIG. 1A, and FIG. 1C is a sectional view taken along line Y-Y' in FIG. 1A.

FIG. 2A is a plan view of a method for manufacturing a semiconductor device according to the present invention, FIG. 2B is a sectional view taken along line X-X' in FIG. 2A, and FIG. 2C is a sectional view taken along line Y-Y' in FIG. 2A.

FIG. 3A is a plan view of a method for manufacturing a semiconductor device according to the present invention, FIG. 3B is a sectional view taken along line X-X' in FIG. 3A, and FIG. 3C is a sectional view taken along line Y-Y' in FIG. 3A.

FIG. 5A is a plan view of a method for manufacturing a semiconductor device according to the present invention, FIG. 5B is a sectional view taken along line X-X' in FIG. 5A, and FIG. 5C is a sectional view taken along line Y-Y' in FIG. 5A.

FIG. 6A is a plan view of a method for manufacturing a semiconductor device according to the present invention, FIG. 6B is a sectional view taken along line X-X' in FIG. 6A, and FIG. 6C is a sectional view taken along line Y-Y' in FIG. 6A.

FIG. 7A is a plan view of a method for manufacturing a semiconductor device according to the present invention, FIG. 7B is a sectional view taken along line X-X' in FIG. 7A, and FIG. 7C is a sectional view taken along line Y-Y' in FIG. 7A.

FIG. 8A is a plan view of a method for manufacturing a semiconductor device according to the present invention, FIG. 8B is a sectional view taken along line X-X' in FIG. 8A, and FIG. 8C is a sectional view taken along line Y-Y' in FIG. 8A.

FIG. 9A is a plan view of a method for manufacturing a semiconductor device according to the present invention, FIG. 9B is a sectional view taken along line X-X' in FIG. 9A, and FIG. 9C is a sectional view taken along line Y-Y' in FIG. 9A.

FIG. 10A is a plan view of a method for manufacturing a semiconductor device according to the present invention, FIG. 10B is a sectional view taken along line X-X' in FIG. 10A, and FIG. 10C is a sectional view taken along line Y-Y' in FIG. 10A.

FIG. 11A is a plan view of a method for manufacturing a semiconductor device according to the present invention, FIG. 11B is a sectional view taken along line X-X' in FIG. 11A, and FIG. 11C is a sectional view taken along line Y-Y' in FIG. 11A.

FIG. 12A is a plan view of a method for manufacturing a semiconductor device according to the present invention, FIG. 12B is a sectional view taken along line X-X' in FIG. 12A, and FIG. 12C is a sectional view taken along line Y-Y' in FIG. 12A.

FIG. 14A is a plan view of a method for manufacturing a semiconductor device according to the present invention, FIG. 14B is a sectional view taken along line X-X' in FIG. 14A, and FIG. 14C is a sectional view taken along line Y-Y' in FIG. 14A.

FIG. 17A is a plan view of a method for manufacturing a semiconductor device according to the present invention, FIG. 17B is a sectional view taken along line X-X' in FIG. 17A, and FIG. 17C is a sectional view taken along line Y-Y' in FIG. 17A.

FIG. 18A is a plan view of a method for manufacturing a semiconductor device according to the present invention, FIG. 18B is a sectional view taken along line X-X' in FIG. 18A, and FIG. 18C is a sectional view taken along line Y-Y' in FIG. 18A.

FIG. 19A is a plan view of a method for manufacturing a semiconductor device according to the present invention, FIG. 19B is a sectional view taken along line X-X' in FIG. 19A, and FIG. 19C is a sectional view taken along line Y-Y' in FIG. 19A.

FIG. 21A is a plan view of a method for manufacturing a semiconductor device according to the present invention, FIG. 21B is a sectional view taken along line X-X' in FIG. 21A, and FIG. 21C is a sectional view taken along line Y-Y' in FIG. 21A.

FIG. 22A is a plan view of a method for manufacturing a semiconductor device according to the present invention, FIG. 22B is a sectional view taken along line X-X' in FIG. 22A, and FIG. 22C is a sectional view taken along line Y-Y' in FIG. 22A.

FIG. 23A is a plan view of a method for manufacturing a semiconductor device according to the present invention, FIG. 23B is a sectional view taken along line X-X' in FIG. 23A, and FIG. 23C is a sectional view taken along line Y-Y' in FIG. 23A.

FIG. 26A is a plan view of a method for manufacturing a semiconductor device according to the present invention, FIG. 26B is a sectional view taken along line X-X' in FIG. 26A, and FIG. 26C is a sectional view taken along line Y-Y' in FIG. 26A.

FIG. 27A is a plan view of a method for manufacturing a semiconductor device according to the present invention, FIG. 27B is a sectional view taken along line X-X' in FIG. 27A, and FIG. 27C is a sectional view taken along line Y-Y' in FIG. 27A.

FIG. 28A is a plan view of a method for manufacturing a semiconductor device according to the present invention, FIG. 28B is a sectional view taken along line X-X' in FIG. 28A, and FIG. 28C is a sectional view taken along line Y-Y' in FIG. 28A.

FIG. 29A is a plan view of a method for manufacturing a semiconductor device according to the present invention, FIG. 29B is a sectional view taken along line X-X' in FIG. 29A, and FIG. 29C is a sectional view taken along line Y-Y' in FIG. 29A.

FIG. 30A is a plan view of a method for manufacturing a semiconductor device according to the present invention, FIG. 30B is a sectional view taken along line X-X' in FIG. 30A, and FIG. 30C is a sectional view taken along line Y-Y' in FIG. 30A.

FIG. 31A is a plan view of a method for manufacturing a semiconductor device according to the present invention, FIG. 31B is a sectional view taken along line X-X' in FIG. 31A, and FIG. 31C is a sectional view taken along line Y-Y' in FIG. 31A.

FIG. 32A is a plan view of a method for manufacturing a semiconductor device according to the present invention, FIG. 32B is a sectional view taken along line X-X' in FIG. 32A, and FIG. 32C is a sectional view taken along line Y-Y' in FIG. 32A.

FIG. 33A is a plan view of a method for manufacturing a semiconductor device according to the present invention, FIG. 33B is a sectional view taken along line X-X' in FIG. 33A, and FIG. 33C is a sectional view taken along line Y-Y' in FIG. 33A.

FIG. 35A is a plan view of a method for manufacturing a semiconductor device according to the present invention, FIG. 35B is a sectional view taken along line X-X' in FIG. 35A, and FIG. 35C is a sectional view taken along line Y-Y' in FIG. 35A.

FIG. 36A is a plan view of a method for manufacturing a semiconductor device according to the present invention, FIG. 36B is a sectional view taken along line X-X' in FIG. 36A, and FIG. 36C is a sectional view taken along line Y-Y' in FIG. 36A.

FIG. 37A is a plan view of a method for manufacturing a semiconductor device according to the present invention, FIG. 37B is a sectional view taken along line X-X' in FIG. 37A, and FIG. 37C is a sectional view taken along line Y-Y' in FIG. 37A.

FIG. 38A is a plan view of a method for manufacturing a semiconductor device according to the present invention, FIG. 38B is a sectional view taken along line X-X' in FIG. 38A, and FIG. 38C is a sectional view taken along line Y-Y' in FIG. 38A.

FIG. 39A is a plan view of a method for manufacturing a semiconductor device according to the present invention, FIG. 39B is a sectional view taken along line X-X' in FIG. 39A, and FIG. 39C is a sectional view taken along line Y-Y' in FIG. 39A.

FIG. 40A is a plan view of a method for manufacturing a semiconductor device according to the present invention, FIG. 40B is a sectional view taken along line X-X' in FIG. 40A, and FIG. 40C is a sectional view taken along line Y-Y' in FIG. 40A.

FIG. 41A is a plan view of a method for manufacturing a semiconductor device according to the present invention, FIG. 41B is a sectional view taken along line X-X' in FIG. 41A, and FIG. 41C is a sectional view taken along line Y-Y' in FIG. 41A.

FIG. 42A is a plan view of a method for manufacturing a semiconductor device according to the present invention, FIG. 42B is a sectional view taken along line X-X' in FIG. 42A, and FIG. 42C is a sectional view taken along line Y-Y' in FIG. 42A.

FIG. 43A is a plan view of a method for manufacturing a semiconductor device according to the present invention, FIG. 43B is a sectional view taken along line X-X' in FIG. 43A, and FIG. 43C is a sectional view taken along line Y-Y' in FIG. 43A.

FIG. 44A is a plan view of a method for manufacturing a semiconductor device according to the present invention, FIG. 44B is a sectional view taken along line X-X' in FIG. 44A, and FIG. 44C is a sectional view taken along line Y-Y' in FIG. 44A.

FIG. 45A is a plan view of a method for manufacturing a semiconductor device according to the present invention, FIG. 45B is a sectional view taken along line X-X' in FIG. 45A, and FIG. 45C is a sectional view taken along line Y-Y' in FIG. 45A.

FIG. 46A is a plan view of a method for manufacturing a semiconductor device according to the present invention, FIG. 46B is a sectional view taken along line X-X' in FIG. 46A, and FIG. 46C is a sectional view taken along line Y-Y' in FIG. 46A.

FIG. 48A is a plan view of a method for manufacturing a semiconductor device according to the present invention, FIG. 48B is a sectional view taken along line X-X' in FIG. 48A, and FIG. 48C is a sectional view taken along line Y-Y' in FIG. 48A.

FIG. 49A is a plan view of a method for manufacturing a semiconductor device according to the present invention, FIG. 49B is a sectional view taken along line X-X' in FIG. 49A, and FIG. 49C is a sectional view taken along line Y-Y' in FIG. 49A.

FIG. 50A is a plan view of a method for manufacturing a semiconductor device according to the present invention, FIG. 50B is a sectional view taken along line X-X' in FIG. 50A, and FIG. 50C is a sectional view taken along line Y-Y' in FIG. 50A.

FIG. 51A is a plan view of a method for manufacturing a semiconductor device according to the present invention, FIG. 51B is a sectional view taken along line X-X' in FIG. 51A, and FIG. 51C is a sectional view taken along line Y-Y' in FIG. 51A.

FIG. 52A is a plan view of a method for manufacturing a semiconductor device according to the present invention, FIG. 52B is a sectional view taken along line X-X' in FIG. 52A, and FIG. 52C is a sectional view taken along line Y-Y' in FIG. 52A.

DETAILED DESCRIPTION OF THE PREFERRED EMBODIMENTS

A manufacturing process for forming a SGT structure according to an embodiment of the present invention is described below with reference to FIGS. 2 to 52.

A description is given of a manufacturing method for forming a first fin-shaped silicon layer and a second fin-shaped silicon layer on a substrate, forming a first insulating film around the first fin-shaped silicon layer and the second fin-shaped silicon layer, and forming a first pillar-shaped silicon layer on the first fin-shaped silicon layer and forming a second pillar-shaped silicon layer on the second fin-shaped silicon layer.

As shown in FIGS. 2A-2C, a second oxide film 102 is formed for forming a dummy pattern on a silicon substrate 101. A nitride film or a laminated film of an oxide film and polysilicon may be used.

As shown in FIGS. 3A-3C, a first resist 103 is formed for forming the dummy pattern.

Figure 4A:
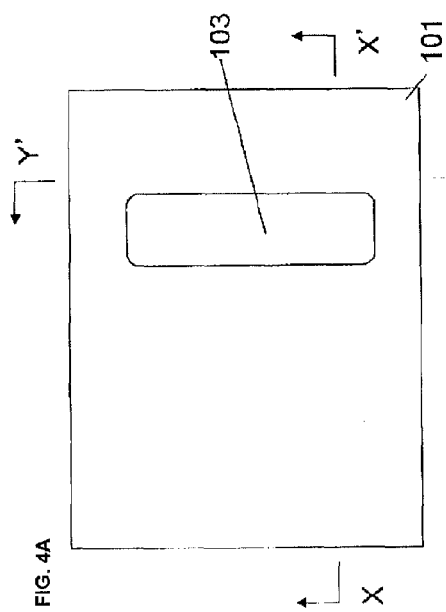
FIG. 4A is a plan view of a method for manufacturing a semiconductor device according to the present invention.
Figure 4B:
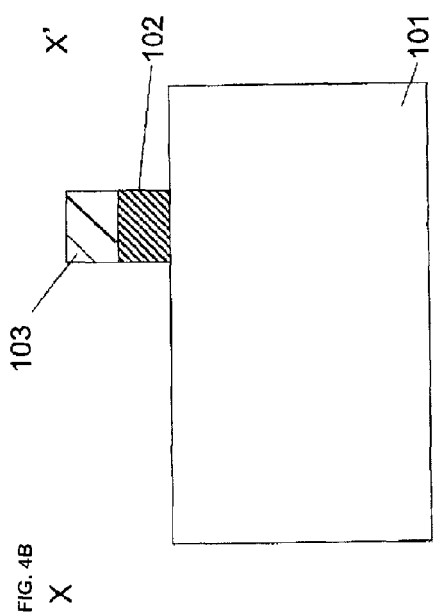
FIG. 4B is a sectional view taken along line X-X' in FIG. 4A.
Figure 4C:
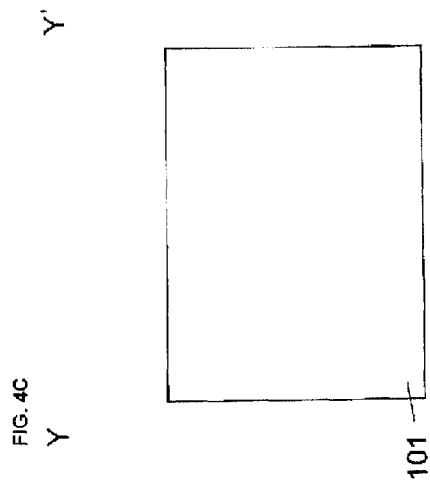
FIG. 4C is a sectional view taken along line Y-Y' in FIG. 4A.

As shown in FIGS. 4A-4C, the second oxide film 102 is etched to form the dummy pattern 102.

As shown in FIGS. 5A-5C, the first resist 103 is removed.

As shown in FIGS. 6A-6C, a first nitride film 104 is deposited.

As shown in FIGS. 7A-7C, the first nitride film 104 is etched to be left as a sidewall. Consequently, a first nitride film sidewall 104 is formed around the dummy pattern 102. The first nitride film sidewall 104 is used for etching silicon to form a first fin-shaped silicon layer 106 and a second fin-shaped silicon layer 105 which are connected to each other at the ends thereof to form a closed loop.

As shown in FIGS. 8A-8C, the dummy pattern 102 is removed.

As shown in FIGS. 9A-9C, the silicon substrate 101 is etched using the first nitride film sidewall 104 as a mask to form the first fin-shaped silicon layer 106 and the second fin-shaped silicon layer 105 which are connected to each other at the ends thereof to form a closed loop.

As shown in FIGS. 10A-10C, a first insulating film 107 is formed around the first fin-shaped silicon layer 106 and the second fin-shaped silicon layer 105. As the first insulating film, an oxide film formed by high-density plasma, or an oxide film formed by low-pressure chemical vapor deposition may be used.

As shown in FIGS. 11A-11C, the first nitride film sidewall 104 is removed. When the first nitride film sidewall 104 is removed during silicon etching or deposition of the oxide film, this step is not required.

As shown in FIGS. 12A-12C, the first insulating film 107 is etched back to expose an upper portion of the first fin-shaped silicon layer 106 and an upper portion of the second fin-shaped silicon layer 105.

Figure 13A:
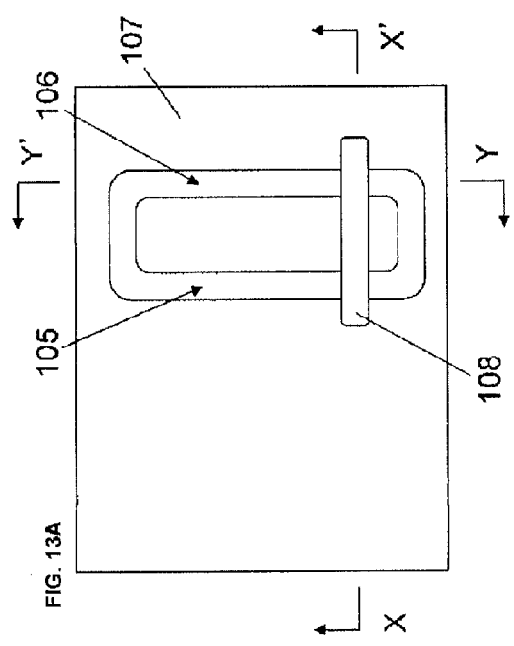
FIG. 13A is a plan view of a method for manufacturing a semiconductor device according to the present invention.
Figure 13C:
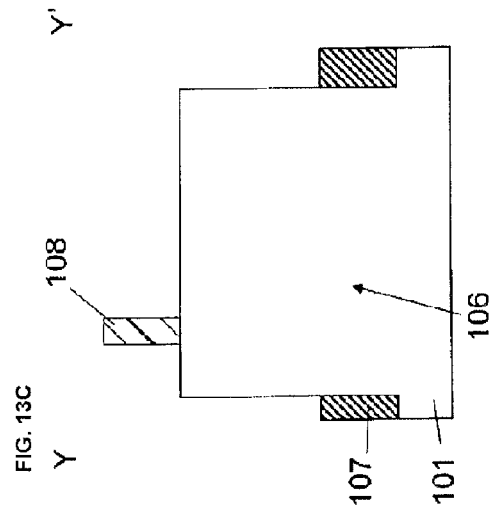
FIG. 13C is a sectional view taken along line Y-Y' in FIG. 13A.
Figure 13B:
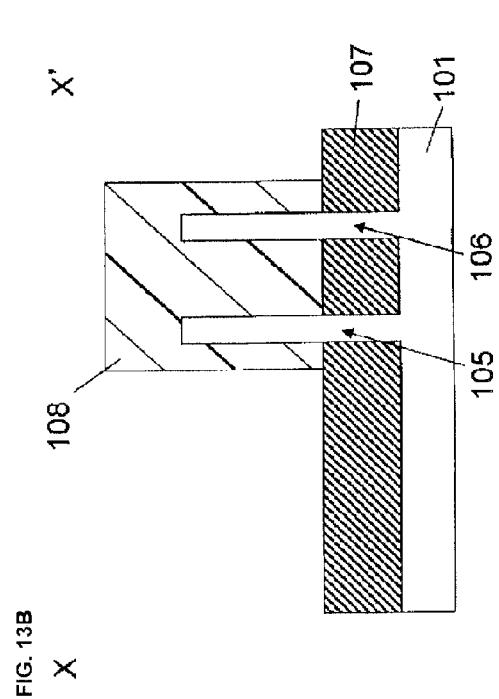
FIG. 13B is a sectional view taken along line X-X' in FIG. 13A.
Figure 15A:
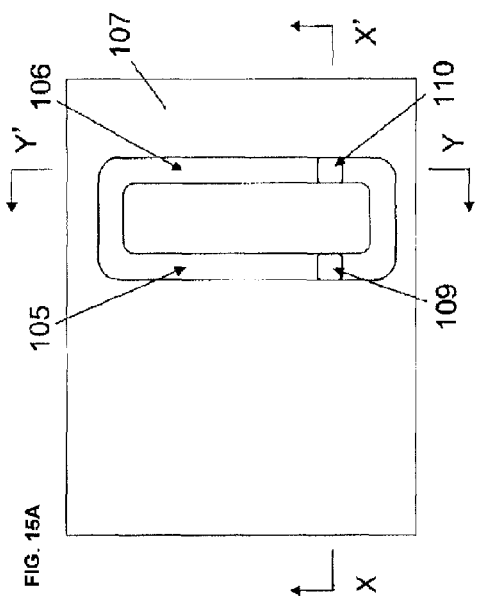
FIG. 15A is a plan view of a method for manufacturing a semiconductor device according to the present invention.
Figure 15C:
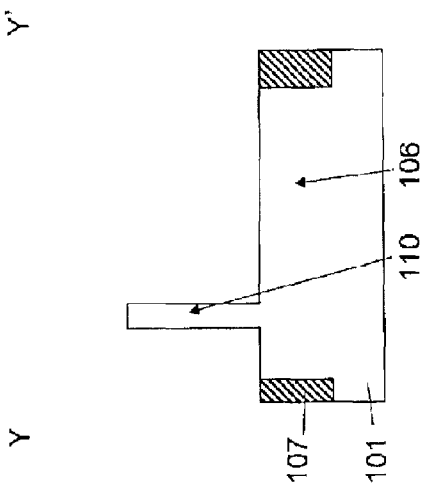
FIG. 15C is a sectional view taken along line Y-Y' in FIG. 15A.
Figure 15B:
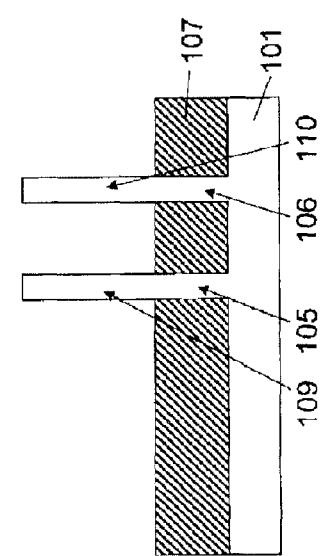
FIG. 15B is a sectional view taken along line X-X' in FIG. 15A.

As shown in FIGS. 13A-13C, a second resist 108 is formed so as to be perpendicular to the first fin-shaped silicon layer 106 and the second fin-shaped silicon layer 105. A portion where each of the first fin-shaped silicon layer 106 and the second fin-shaped silicon layer 105 intersects at right angles the second resist 108 becomes a pillar-shaped silicon layer. Since a linear resist can be used, the resist is unlikely to fall after patterning, thereby realizing a stable process.

As shown in FIGS. 14A-14C, the first fin-shaped silicon layer 106 and the second fin-shaped silicon layer are etched. A portion where the first fin-shaped silicon layer 106 and the second resist 108 intersect at right angles becomes a first pillar-shaped silicon layer 110. A portion where the second fin-shaped silicon layer 105 and the second resist 108 intersect at right angles becomes a second pillar-shaped silicon layer 109. Therefore, the width of the first pillar-shaped silicon layer 110 is equal to the width of the first fin-shaped silicon layer 106. Also, the width of the second pillar-shaped silicon layer 109 is equal to the width of the second fin-shaped silicon layer 105.

As a result, a structure is formed, in which the first pillar-shaped silicon layer 110 is formed in an upper portion of the first fin-shaped silicon layer 106, the second pillar-shaped silicon layer 109 is formed in an upper portion of the second fin-shaped silicon layer 105, and the first insulating film 107 is formed around the first fin-shaped silicon layer 106 and the second fin-shaped silicon layer 105.

As shown in FIGS. 15A-16C, the second resist 108 is removed.

Next, a description is given of a manufacturing method in which in order to use a gate-last process, n-type diffusion layers are formed by implanting impurities in an upper portion of the first pillar-shaped silicon layer 110, an upper portion of the first fin-shaped silicon layer 106, and a lower portion of the first pillar-shaped silicon layer 110, and p-type diffusion layers are formed by implanting impurities in an upper portion of the second pillar-shaped silicon layer 109, an upper portion of the second fin-shaped silicon layer 105, and a lower portion of the second pillar-shaped silicon layer 109.

Figure 16C:
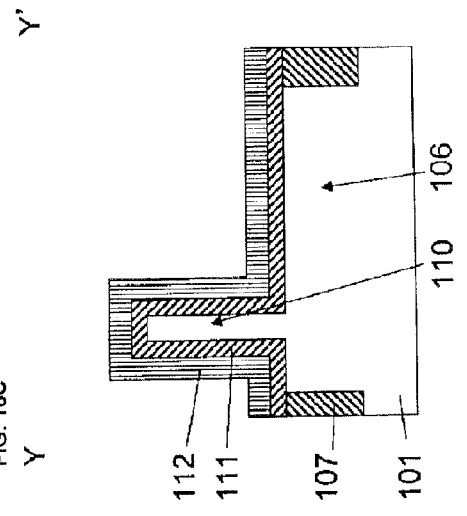
FIG. 16C is a sectional view taken along line Y-Y' in FIG. 16A.
Figure 16A:
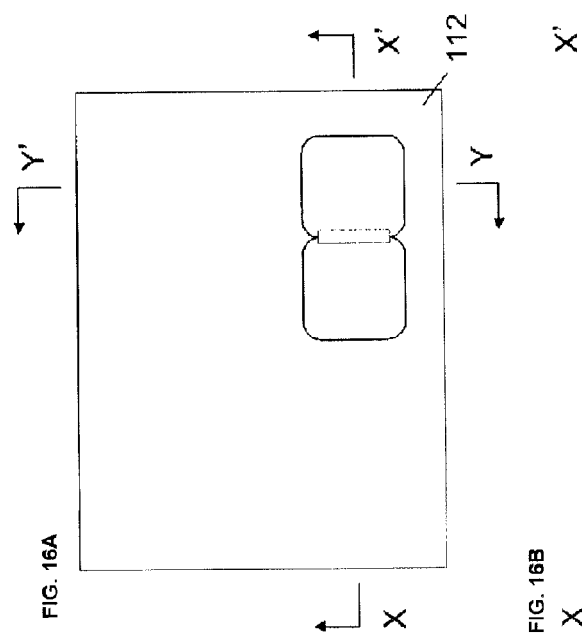
FIG. 16A is a plan view of a method for manufacturing a semiconductor device according to the present invention.
Figure 16B:
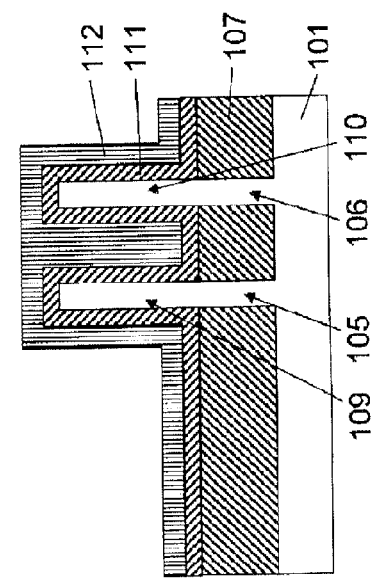
FIG. 16B is a sectional view taken along line X-X' in FIG. 16A.

As shown in FIGS. 16A-16C, a third oxide film 111 is deposited, and a second nitride film 112 is formed. Since upper portions of the pillar-shaped silicon layers are subsequently covered with a gate insulating film and polysilicon gate electrodes, diffusion layers are formed in upper portions of the pillar-shaped silicon layers before covering of the pillar-shaped silicon layers.

As shown in FIGS. 17A-17C, the second nitride film 112 is etched to be left as a sidewall.

As shown in FIGS. 18A-18C, a third resist 113 is formed for forming the n-type diffusion layers by impurity implantation in an upper portion of the first pillar-shaped silicon layer 110, an upper portion of the first fin-shaped silicon layer 106, and a lower portion of the first pillar-shaped silicon layer 110.

As shown in FIGS. 19A-19C, impurities such as arsenic or phosphorus are implanted to form a n-type diffusion layer 115 in an upper portion of the first pillar-shaped silicon layer 110, and n-type diffusion layers 116 and 117 in an upper portion of the first fin-shaped silicon layer 106.

Figure 20C:
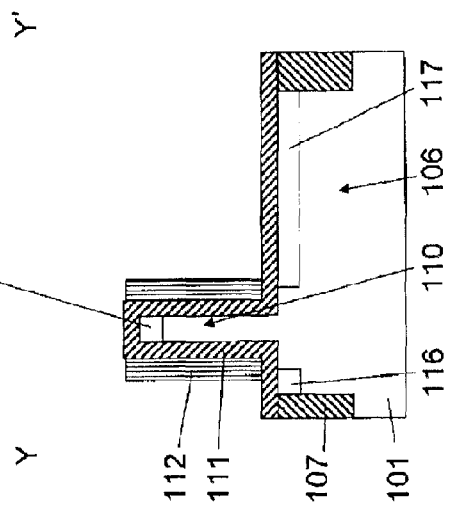
FIG. 20C is a sectional view taken along line Y-Y' in FIG. 20A.
Figure 20A:
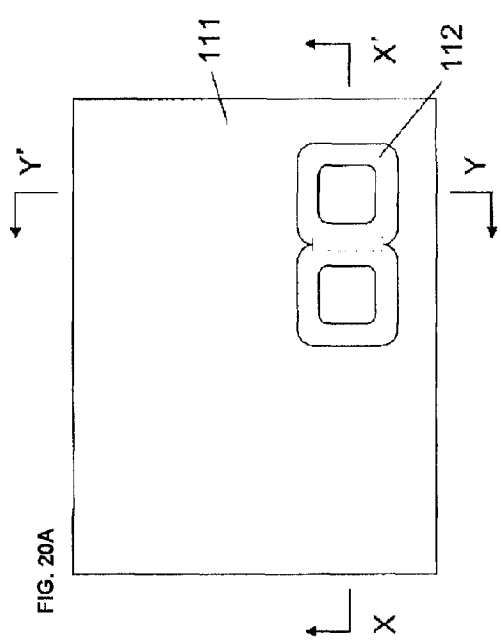
FIG. 20A is a plan view of a method for manufacturing a semiconductor device according to the present invention.
Figure 20B:
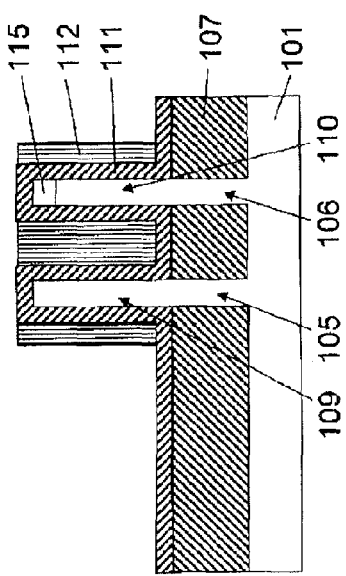
FIG. 20B is a sectional view taken along line X-X' in FIG. 20A.

As shown in FIGS. 20A-20C, the third resist 113 is removed.

As shown in FIGS. 21A-21C, the second nitride film 112 and the third oxide film 111 are removed.

As shown in FIGS. 22A-22C, heat treatment is performed. The n-type diffusion layers 116 and 117 in an upper portion of the first fin-shaped silicon layer 106 are brought into contact with each other to form a n-type diffusion layer 118.

As shown in FIGS. 23A-23C, a fourth oxide film 119 is deposited, and a third nitride film 120 is formed. Since upper portions of the pillar-shaped silicon layers are subsequently covered with a gate insulating film and polysilicon gate electrodes, diffusion layers are formed in upper portions of the pillar-shaped silicon layers before the pillar-shaped silicon layers are covered.

Figure 24C:
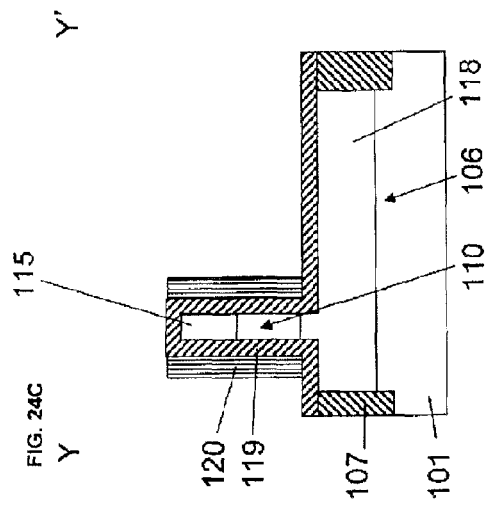
FIG. 24C is a sectional view taken along line Y-Y' in FIG. 24A.
Figure 24A:
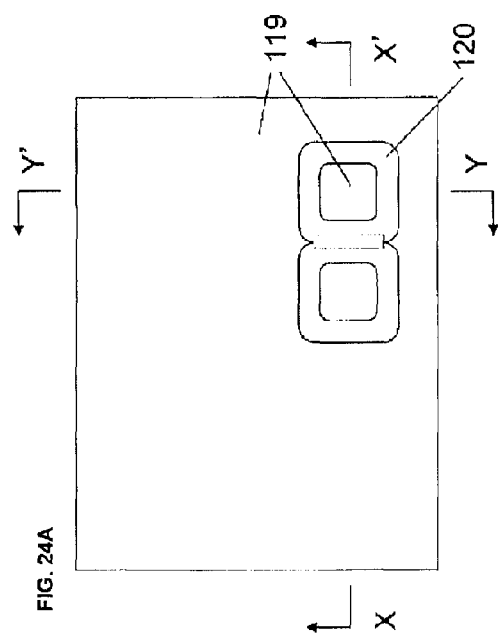
FIG. 24A is a plan view of a method for manufacturing a semiconductor device according to the present invention.
Figure 24B:
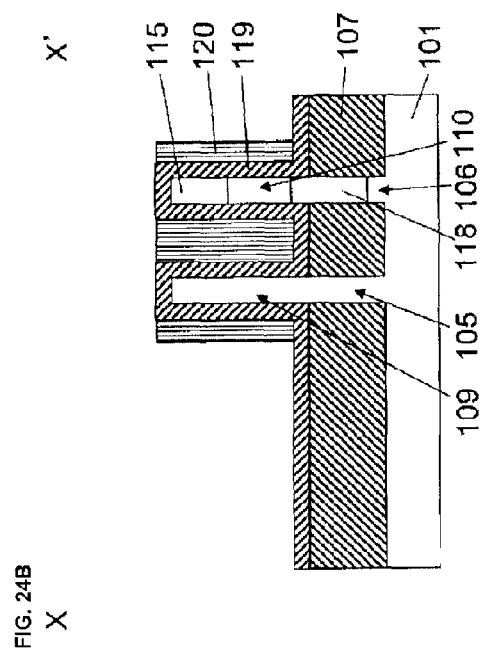
FIG. 24B is a sectional view taken along line X-X' in FIG. 24A.

As shown in FIGS. 24A-24C, the third nitride film 120 is etched to be left as a sidewall.

Figure 25A:
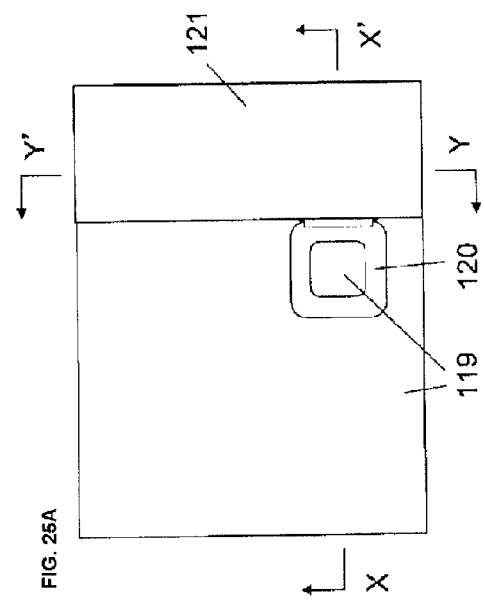
FIG. 25A is a plan view of a method for manufacturing a semiconductor device according to the present invention.
Figure 25C:
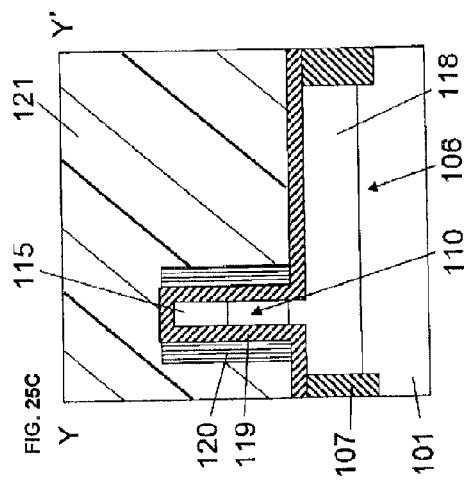
FIG. 25C is a sectional view taken along line Y-Y' in FIG. 25A.
Figure 25B:
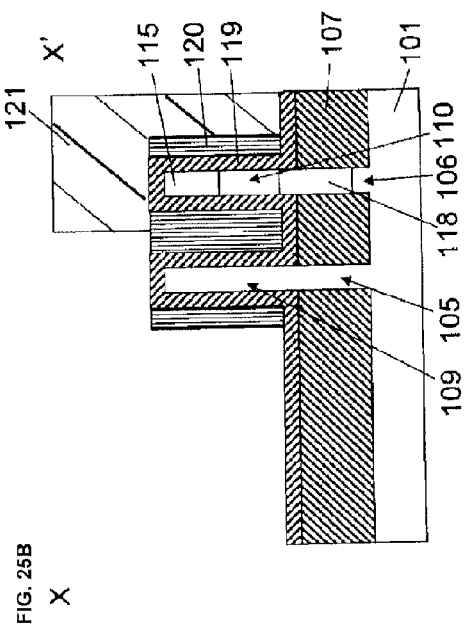
FIG. 25B is a sectional view taken along line X-X' in FIG. 25A.

As shown in FIGS. 25A-25C, a fourth resist 121 is formed for forming the p-type diffusion layers by impurity implantation in an upper portion of the second pillar-shaped silicon layer 109, an upper portion of the second fin-shaped silicon layer 105, and a lower portion of the second pillar-shaped silicon layer 109.

As shown in FIGS. 26A-26C, impurities such as boron are implanted to form a p-type diffusion layer 122 in an upper portion of the second pillar-shaped silicon layer 109, and p-type diffusion layers 123 and 124 in an upper portion of the second fin-shaped silicon layer 105.

As shown in FIGS. 27A-27C, the fourth resist 121 is removed.

As shown in FIGS. 28A-28C, the third nitride film 120 and the fourth oxide film 119 are removed.

As shown in FIGS. 29A-29C, heat treatment is performed. The p-type diffusion layers 123 and 124 in an upper portion of the second fin-shaped silicon layer 105 are brought into contact with each other to form a n-type diffusion layer 125.

As described above, in order to use the gate-last process, the n-type diffusion layers 115 and 118 are formed by impurity implantation in an upper portion of the first pillar-shaped silicon layer 110 and in an upper portion of the first fin-shaped silicon layer 106 and a lower portion of the first pillar-shaped silicon layer 110, and the p-type diffusion layers 122 and 125 are formed by impurity implantation in an upper portion of the second pillar-shaped silicon layer 109 and in an upper portion of the second fin-shaped silicon layer 105 and a lower portion of the second pillar-shaped silicon layer 109.

Since nMOS SGT and pMOS SGT can be formed as described above, a CMOS SGT can be formed from one dummy pattern.

In addition, when the line width of the dummy pattern is minimum feature size F, the distance between the first pillar-shaped silicon layer 110 and the second pillar-shaped silicon layer 109 is the minimum feature size F. Therefore, an allowance for alignment of a resist mask for impurity implantation can be made F/2, thereby making it easy to separate between pMOS and nMOS elements.

Next, a description is given of a manufacturing method for forming a first polysilicon gate electrode 127a, a second polysilicon gate electrode 127b, and a polysilicon gate line 127c using polysilicon in order to use the gate-last process. In order to use the gate-last process, an interlayer insulating film is deposited, and then the polysilicon gate electrodes and the polysilicon gate line are exposed by chemical mechanical polishing. Therefore, it is necessary to prevent upper portions of the pillar-shaped silicon layers from being exposed by chemical mechanical polishing.

As shown in FIGS. 30A-30C, a gate insulating film 126 is formed, and polysilicon 127 is deposited and then planarized. After planarization, the top position of the polysilicon 127 is higher than the gate insulating film 126 disposed on the n-type diffusion layer 115 in an upper portion of the first pillar-shaped silicon layer 110 and higher than the gate insulating film 126 disposed on the p-type diffusion layer 122 in an upper portion of the second pillar-shaped silicon layer 109. As a result, when in order to use the gate-last process, the polysilicon gate electrodes and the polysilicon gate line are exposed by chemical mechanical polishing after the interlayer insulating film is deposited, the upper portions of the pillar-shaped silicon layers are not exposed by chemical mechanical polishing.

In addition, a fourth nitride film 128 is deposited. The fourth nitride film 128 is a film which inhibits the formation of silicide in upper portions of the first polysilicon gate electrode 127a, the second polysilicon gate electrode 127b, and the polysilicon gate line 127c when the silicide is formed in upper portions of the first fin-shaped silicon layer 106 and the second fin-shaped silicon layer 105.

As shown in FIGS. 31A-31C, a fifth resist 129 is formed for forming the first polysilicon gate electrode 127a, the second polysilicon gate electrode 127b, and the polysilicon gate line 127c. A portion corresponding to the gate line is preferably perpendicular to the first fin-shaped silicon layer 106 and the second fin-shaped silicon layer 105. This is because a parasitic capacitance between the gate line and the substrate is decreased.

As shown in FIGS. 32A-32C, the fourth nitride film 128 is etched, and the polysilicon 127 is etched to form the first polysilicon gate electrode 127a, the second polysilicon gate electrode 127b, and the polysilicon gate line 127c.

As shown in FIGS. 33A-33C, the gate insulating film 126 is etched.

Figure 34A:
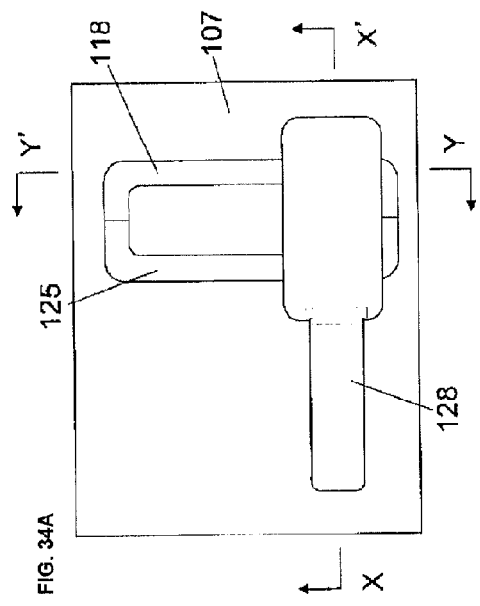
FIG. 34A is a plan view of a method for manufacturing a semiconductor device according to the present invention.
Figure 34C:
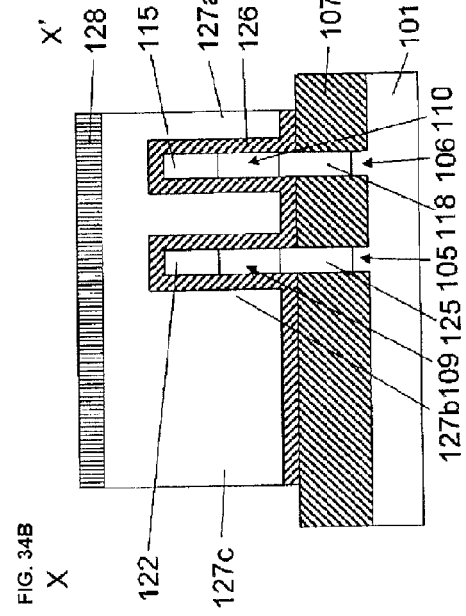
FIG. 34C is a sectional view taken along line Y-Y' in FIG. 34A.
Figure 34B:
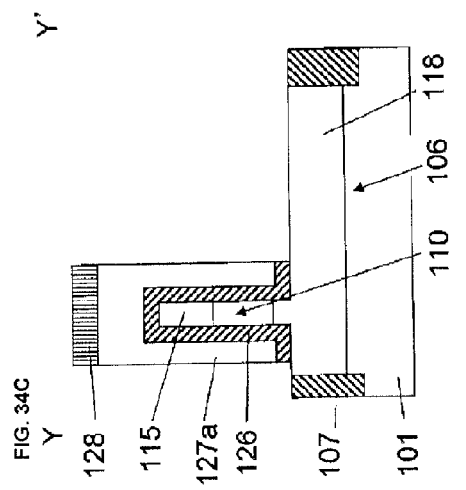
FIG. 34B is a sectional view taken along line X-X' in FIG. 34A.

As shown in FIGS. 34A-34C, the fifth resist 129 is removed.

The manufacturing method for forming, using polysilicon, the first polysilicon gate electrode 127a, the second polysilicon gate electrode 127b, and the polysilicon gate line 127c in order to use the gate-last process is described above. After the first polysilicon gate electrode 127a, the second polysilicon gate electrode 127b, and the polysilicon gate line 127c are formed, the top position of polysilicon is higher than the gate insulating film 126 on the n-type diffusion layer 115 in an upper portion of the first pillar-shaped silicon layer 110 and higher than the gate insulating film 126 on the p-type diffusion layer 122 in an upper portion of the second pillar-shaped silicon layer 109.

Next, a manufacturing method for forming silicides in an upper portion of the n-type diffusion layer 118 formed in an upper portion of the first fin-shaped silicon layer 106 and in an upper portion of the p-type diffusion layer 125 formed in an upper portion of the second fin-shaped silicon layer 105 is described.

A silicide is not formed in upper portions of the first polysilicon gate electrode 127a, the second polysilicon gate electrode 127b, and the polysilicon gate line 127c, in the n-type diffusion layer 115 in an upper portion of the first pillar-shaped silicon layer 110, and in the p-type diffusion layer 122 in an upper portion of the second pillar-shaped silicon layer 109. When the silicide is formed in the n-type diffusion layer 115 in an upper portion of the first pillar-shaped silicon layer 110, and in the p-type diffusion layer 122 in an upper portion of the second pillar-shaped silicon layer 109, the manufacturing process is enlarged.

As shown in FIGS. 35A-35C, a fifth nitride film 130 is deposited.

As shown in FIGS. 36A-36C, the fifth nitride film 130 is etched to be left as a sidewall.

As shown in FIGS. 37A-37C, a metal such as nickel or cobalt is deposited to form silicide 131 in upper portions of the n-type diffusion layer 118 and the p-type diffusion layer 125 formed in upper portions of the first fin-shaped silicon layer 106 and the second fin-shaped silicon layer 105, respectively. At this time, the first polysilicon gate electrode 127a, the second polysilicon gate electrode 127b, and the polysilicon gate line 127c are covered with the fifth nitride film 130 and the fourth nitride film 128, and the n-type diffusion layer 115 in an upper portion of the first pillar-shaped silicon layer 110 and the p-type diffusion layer 122 in an upper portion of the second pillar-shaped silicon layer 109 are covered with the gate insulating film 126, the first polysilicon gate electrode 127a, the second polysilicon gate electrode 127b, and the polysilicon gate line 127c, and thus a silicide is not formed in these portions.

The manufacturing method for forming a silicide in an upper portion of the n-type diffusion layer 118 in an upper portion of the first fin-shaped silicon layer 106 and in an upper portion of the p-type diffusion layer 125 in an upper portion of the second fin-shaped silicon layer 105 is described above.

Next, a gate-last manufacturing method is described, in which after an interlayer insulting film 133 is deposited, the first polysilicon gate electrode 127a, the second polysilicon gate electrode 127b, and the polysilicon gate line 127c are exposed, the first polysilicon gate electrode 127a, the second polysilicon gate electrode 127b, and the polysilicon gate line 127c are etched, and then a metal is deposited to form a first metal gate electrode 134a, a second metal gate electrode 134b, and a metal gate line 134c.

As shown in FIGS. 38A-38C, a sixth nitride film 132 is deposited for protecting the silicide 131.

As shown in FIGS. 39A-39C, an interlayer insulating film 133 is deposited and then planarized by chemical mechanical polishing.

As shown in FIGS. 40A-40C, the first polysilicon gate electrode 127a, the second polysilicon gate electrode 127b, and the polysilicon gate line 127c are exposed by chemical mechanical polishing.

As shown in FIGS. 41A-41C, the first polysilicon gate electrode 127a, the second polysilicon gate electrode 127b, and the polysilicon gate line 127c are etched. Wet etching is preferred.

As shown in FIGS. 42A-42C, a metal 134 is deposited and then planarized to fill, with the metal 134, portions from which the first polysilicon gate electrode 127a, the second polysilicon gate electrode 127b, and the polysilicon gate line 127c have been removed. Atomic layer deposition is preferably used.

As shown in FIGS. 43A-43C, the metal 134 is etched to expose the gate insulating film 126 formed on the n-type diffusion layer 115 in an upper portion of the first pillar-shaped silicon layer 110 and expose the gate insulating film 126 formed on the p-type diffusion layer 122 in an upper portion of the second pillar-shaped silicon layer 109. Consequently, the first metal gate electrode 134a, the second metal gate electrode 134b, and the metal gate line 134c are formed.

The gate-last manufacturing method is described above, in which after the interlayer insulating film 133 is deposited, the first polysilicon gate electrode 127a, the second polysilicon gate electrode 127b, and the polysilicon gate line 127c are exposed, the first polysilicon gate electrode 127a, the second polysilicon gate electrode 127b, and the polysilicon gate line 127c are etched, and then the metal 134 is deposited to form the first metal gate electrode 134a, the second metal gate electrode 134b, and the metal gate line 134c.

Next, a manufacturing method for forming a contact is described. Since a silicide is not formed in the n-type diffusion layer 115 in an upper portion of the first pillar-shaped silicon layer 110 and in the p-type diffusion layer 122 in an upper portion of the second pillar-shaped silicon layer 109, a first contact is brought into direct contact with the n-type diffusion layer 115 in an upper portion of the first pillar-shaped silicon layer 110 and a second contact is brought into direct contact with the p-type diffusion layer 122 in an upper portion of the second pillar-shaped silicon layer 109.

As shown in FIGS. 44A-44C, an interlayer insulating film 135 is deposited and then planarized.

As shown in FIGS. 45A-45C, a sixth resist 136 is formed for forming a first contact hole 138 on the first pillar-shaped silicon layer 110 and a second contact hole 137 on the second pillar-shaped silicon layer 109. Then, the interlayer insulating film 135 is etched to form the first contact hole 138 and the second contact hole 137.

As shown in FIGS. 46A-46C, the sixth resist 136 is removed.

Figure 47A:
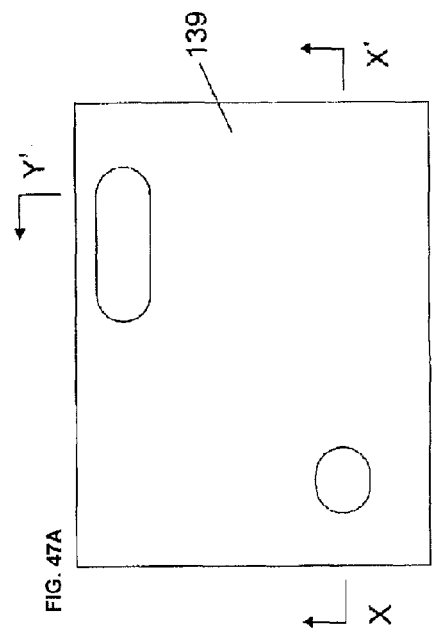
FIG. 47A is a plan view of a method for manufacturing a semiconductor device according to the present invention.
Figure 47C:
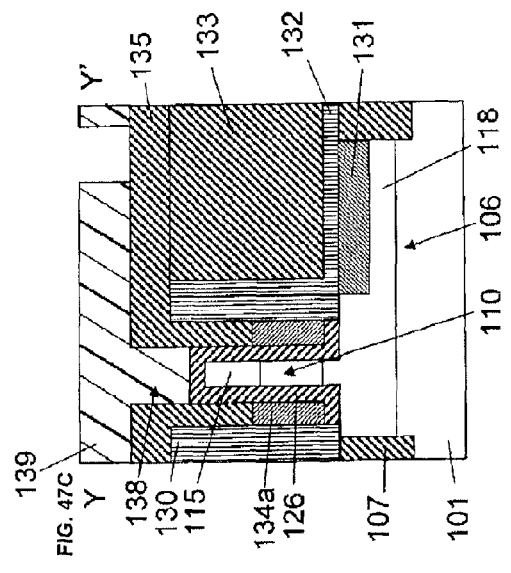
FIG. 47C is a sectional view taken along line Y-Y' in FIG. 47A.
Figure 47B:
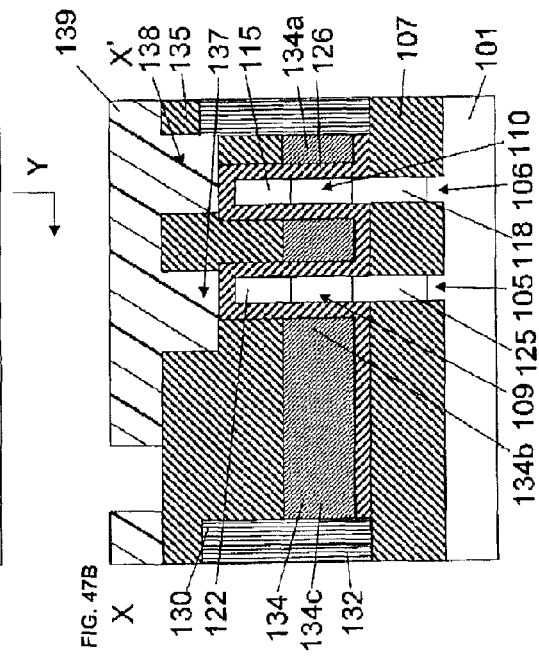
FIG. 47B is a sectional view taken along line X-X' in FIG. 47A.

As shown in FIGS. 47A-47C, a seventh resist 139 is formed for forming a third contact hole 140 and a fourth contact hole 141 on the metal gate line 134c and on the first fin-shaped silicon layer 106 and the second fin-shaped silicon layer 105.

As shown in FIGS. 48A-48C, the interlayer insulating films 135 and 133 are etched to form the third contact hole 140 and the fourth contact hole 141.

As shown in FIGS. 49A-49C, the seventh resist 139 is removed, and the sixth nitride film 132 and the gate insulating film 126 are etched to expose the silicide 131, the n-type diffusion layer 115, and the p-type diffusion layer 122. Then, a metal is deposited to form a first contact 144, a second contact 143, a third contact 142, and a fourth contact 145.

The manufacturing method for forming contacts is described above.

Since a silicide is not formed in the n-type diffusion layer 115 in an upper portion of the first pillar-shaped silicon layer 110 and in the p-type diffusion layer 122 in an upper portion of the second pillar-shaped silicon layer 109, the first contact is brought into direct contact with the n-type diffusion layer 115 in an upper portion of the first pillar-shaped silicon layer 110, and the second contact is brought into direct contact with the p-type diffusion layer 122 in an upper portion of the second pillar-shaped silicon layer 109.

Next, a manufacturing method for forming a metal wiring layer is described.

As shown in FIGS. 50A-50C, a metal 146 is deposited.

As shown in FIGS. 51A-51C, eighth resists 147, 148, 149, and 150 are formed for forming the metal wiring, and the metal 146 is etched to form metal wirings 151, 152, 153, and 154.

As shown in FIGS. 52A-52C, the eighth resists 147, 148, 149, and 150 are removed.

The manufacturing method for forming metal wiring layers is described above.

The result of the above-described manufacturing method is shown in FIGS. 1A-1C.

The resulting structure includes: the first fin-shaped silicon layer 106 formed on the substrate 101 and the second silicon layer 105 formed on the substrate 101, the first fin-shaped silicon layer 106 and the second fin-shaped silicon layer 105 being connected to each other at the ends thereof to form a closed loop; the first insulating film 107 formed around the first fin-shaped silicon layer 106 and the second fin-shaped silicon layer 105; the first pillar-shaped silicon layer 110 formed on the first fin-shaped silicon layer 106; the second pillar-shaped silicon layer 109 formed on the second fin-shaped silicon layer 105, the width of the first pillar-shaped silicon layer 110 being equal to the width of the first fin-shaped silicon layer 106 and the width of the second pillar-shaped silicon layer 109 being equal to the width of the second fin-shaped silicon layer 105; the n-type diffusion layer 118 formed in an upper portion of the first fin-shaped silicon layer 106 and a lower portion of the first pillar-shaped silicon layer 110; the n-type diffusion layer 115 formed in an upper portion of the first pillar-shaped silicon layer 110; the p-type diffusion layer 125 formed in an upper portion of the second fin-shaped silicon layer 105 and a lower portion of the second pillar-shaped silicon layer 109; the p-type diffusion layer 122 formed in an upper portion of the second pillar-shaped silicon layer 109; the silicide 131 formed in upper portions of the n-type diffusion layer 118 and the p-type diffusion layer 125 in an upper portion of the first fin-shaped silicon layer 106 and in an upper portion of the second fin-shaped silicon layer 105; the gate insulating film 126 formed around the first pillar-shaped silicon layer 110 and the first metal gate electrode 134a formed around the gate insulating film 126; the gate insulating film 126 formed around the second pillar-shaped silicon layer 109 and the second metal gate electrode 134b formed around the gate insulating film 126; the metal gate line 134c connected to the first metal gate electrode 134a and the second metal gate electrode 134b and extending in a direction perpendicular to the first fin-shaped silicon layer 106 and the second fin-shaped silicon layer 105; and the first contact 144 formed on the n-type diffusion layer 115 formed in an upper portion of the first pillar-shaped silicon layer 110 and the second contact 143 formed on the p-type diffusion layer 122 formed in an upper portion of the second pillar-shaped silicon layer 109, the first contact 144 being in direct contact with the n-type diffusion layer 115 formed in an upper portion of the first pillar-shaped silicon layer 110 and the second contact 143 being in direct contact with the p-type diffusion layer 122 formed in an upper portion of the second pillar-shaped silicon layer 109.

As described above, it is possible to decrease a parasitic capacitance between a gate line and a substrate and provide a CMOS SGT manufacturing method for forming a nMOS SGT and a pMOS SGT from one dummy pattern using a gate-last process and provide a resulting SGT structure.

In the present invention, various embodiments and modifications can be made without deviating from the broad spirit and scope of the present invention. The above-described embodiment is illustrative of an example of the present invention, and does not limit the scope of the present invention.

In addition, it is apparent to persons skilled in the art that the technical scope of the present invention includes an embodiment where the conductivity types of p-type (including p+ type) and n-type (including n+ type) are reversed to those in the above description.

The invention claimed is:

1. A semiconductor device comprising:
a first fin-shaped semiconductor layer on a substrate;
a second fin-shaped semiconductor layer on the substrate, where the first fin-shaped semiconductor layer and the second fin-shaped semiconductor layer correspond to the dimensions of a sidewall pattern around a dummy pattern;
a first insulating film around the first fin-shaped semiconductor layer and the second fin-shaped semiconductor layer;
a first pillar-shaped semiconductor layer on the first fin-shaped semiconductor layer;
a second pillar-shaped semiconductor layer on the second fin-shaped semiconductor layer;
an n-type diffusion layer in an upper portion of the first fin-shaped semiconductor layer and a lower portion of the first pillar-shaped semiconductor layer;
an n-type diffusion layer in an upper portion of the first pillar-shaped semiconductor layer;
a p-type diffusion layer in an upper portion of the second fin-shaped semiconductor layer and a lower portion of the second pillar-shaped semiconductor layer;
a p-type diffusion layer in an upper portion of the second pillar-shaped semiconductor layer;
a first gate insulating film around the first pillar-shaped semiconductor layer;
a first metal gate electrode around the first gate insulating film;
a second gate insulating film around the second pillar-shaped semiconductor layer;
a second metal gate electrode around the second gate insulating film;
a metal gate line connected to the first metal gate electrode and the second metal gate electrode and extending in a direction perpendicular to the first fin-shaped semiconductor layer and the second fin-shaped semiconductor layer.

* * * * *